United States Patent [19]

Ajima et al.

[11] Patent Number: 5,390,199
[45] Date of Patent: Feb. 14, 1995

[54] ADVANCED CODE ERROR DETECTION APPARATUS AND SYSTEM USING MAXIMAL-LENGTH PSEUDORANDOM BINARY SEQUENCE

[75] Inventors: Hiroyuki Ajima, Kawasaki; Nobuki Ishiyama, Atsugi; Tsukasa Hattori, Zama, all of Japan

[73] Assignee: Anritsu Corporation, Tokyo, Japan

[21] Appl. No.: 908,475

[22] Filed: Jul. 6, 1992

[30] Foreign Application Priority Data

Jul. 19, 1991 [JP] Japan .................................. 3-179863
Jul. 19, 1991 [JP] Japan .................................. 3-179879
Sep. 30, 1991 [JP] Japan .................................. 3-251693

[51] Int. Cl.6 .......................................... G01R 31/28
[52] U.S. Cl. ............................... 371/67.1; 371/20.4; 371/68.2
[58] Field of Search ...................... 371/67.1, 68.2, 5.4, 371/20.1, 20.4; 370/94.1, 94.2

[56] References Cited

U.S. PATENT DOCUMENTS

| | | |
|---|---|---|
| 4,733,395 | 3/1988 | Gelbrich et al. |
| 4,797,678 | 1/1989 | Tsuji et al. |
| 5,274,641 | 12/1993 | Shobatake et al. .............. 370/94.1 |
| 5,282,202 | 1/1994 | Bernstein et al. ............... 370/94.1 |

FOREIGN PATENT DOCUMENTS

0164758  6/1985  European Pat. Off.
3513551  10/1986  Germany.

OTHER PUBLICATIONS

"Test Equipment for Digital Channel Analysis and Its Application in Digital Mobile Radio"; 37th IEEE Vehicular Technology Conference, Jun. 1987, by C. Gutzeit, pp. 552-559.

Hewlett-Packard Journal, Mar. 1976, pp. 18-24.
Study Group IV-Contribution 81 "Draft Recommendation 0.150" (CCITT), pp. 1-6. Inter. Telegraph & Telephone Corp. Sep. 1991.
Study Group IV-Contribution 84 "Draft Revised Recommendation 0.153", (CCITT) pp. 1-7. Inter. Telegraph & Telephone Corp.; Sep. 1991.
RCR STD-27A "Digital Cellular Telecommunication System"; pp. 577-578; Apr. 3, 1991.

*Primary Examiner*—Vincent P. Canney
*Attorney, Agent, or Firm*—Frishauf, Holtz, Goodman & Woodward

[57] ABSTRACT

A switching circuit switches operation states between a state in which m consecutive bit data of an M-sequence reception code having a period ($2^m - 1$), which is input to a measurement terminal, are set in a feedback shift register (FSR), and a state in which the FSR is set in a closed-loop state to be set in a self-running state. A synchronization detection comparator sequentially compares each bit data output from the FSR in a self-running state with corresponding bit data of the reception code. On the basis of the comparison result from the synchronization detection comparator, a control section determines that the bit data output from the FSR are a reference code, or outputs a command to the FSR through the switching circuit to fetch the m bit data again. A storage circuit stores consecutive bit data of the reception code which are input before the control section determines that the bit data are the reference code, and outputs the stored bit data upon delaying them by a predetermined period of time. A bit error detection comparator sequentially compares the bit data of the delayed reception code output from the storage circuit with the bit data output from the FSR and determined as the reference code.

20 Claims, 41 Drawing Sheets

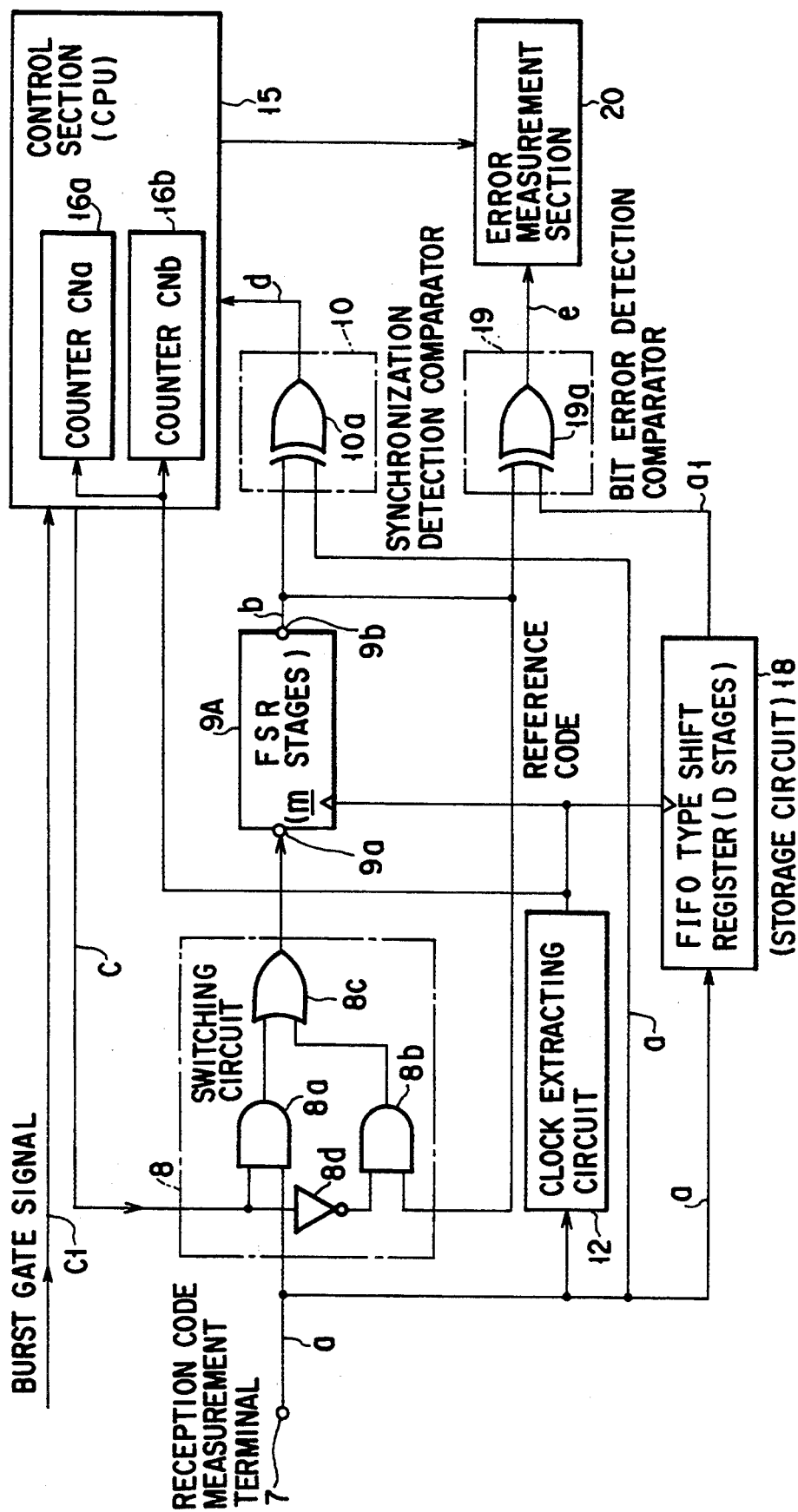
F I G. 1B

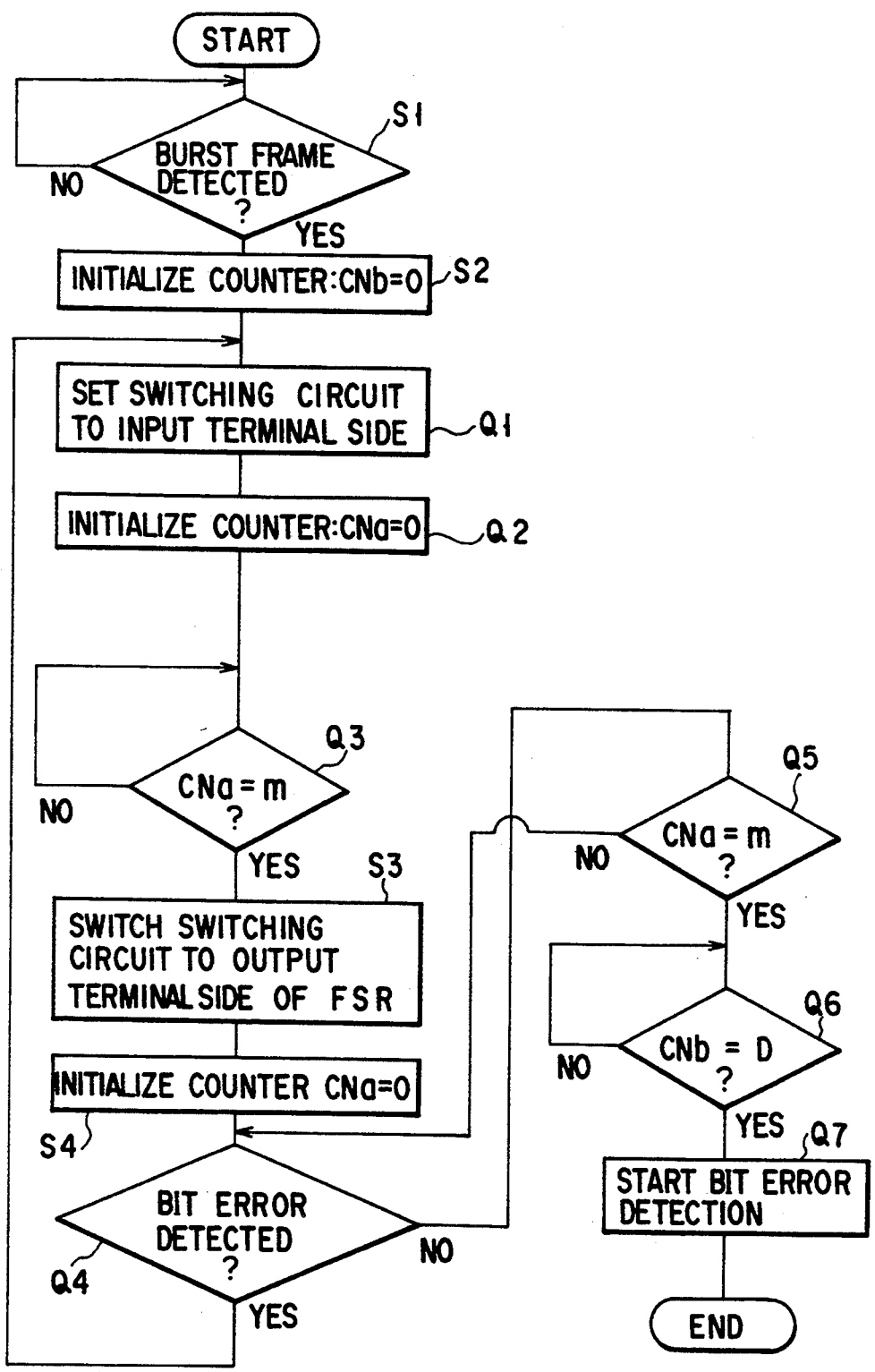
F I G. 2

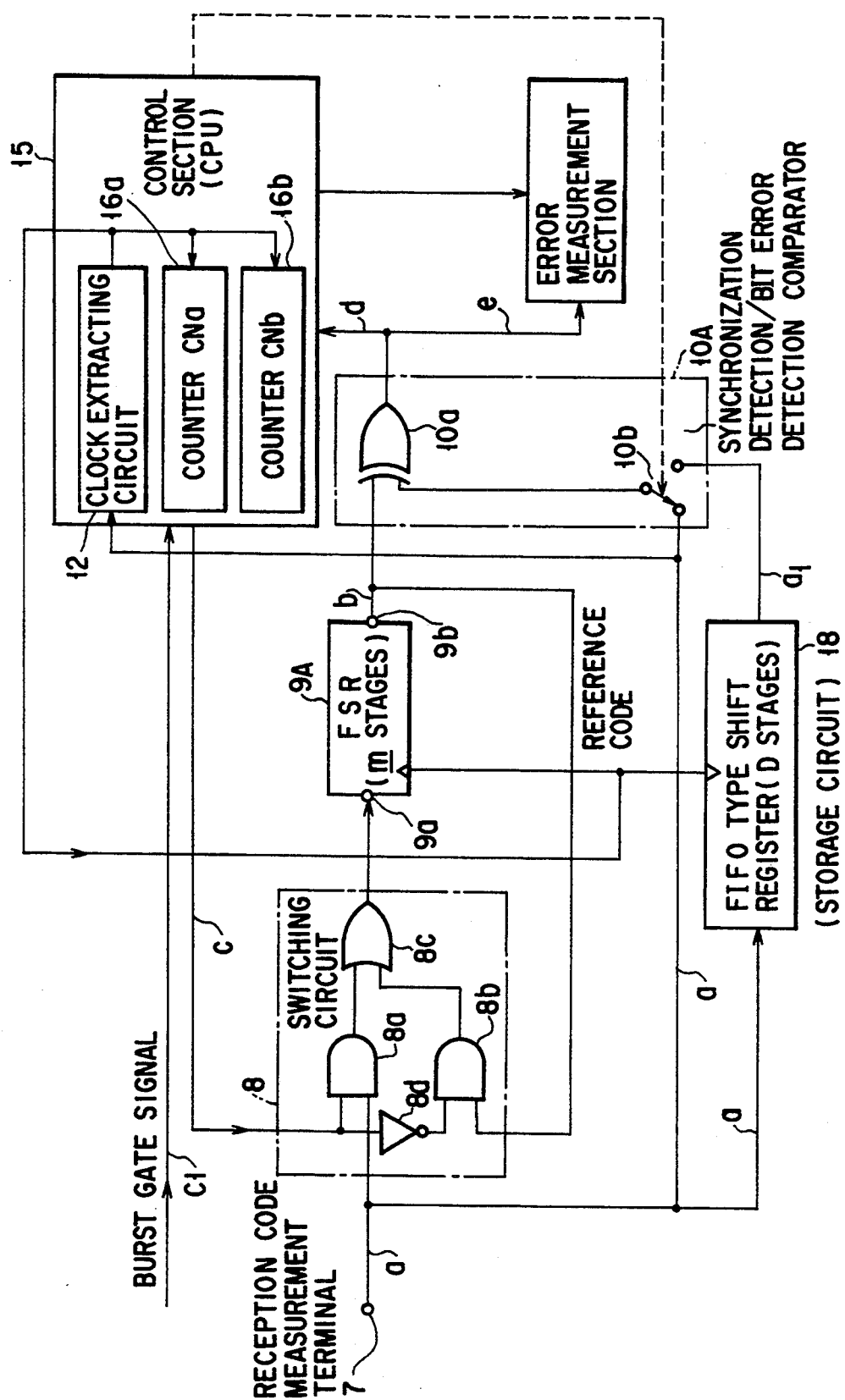
F I G. 4

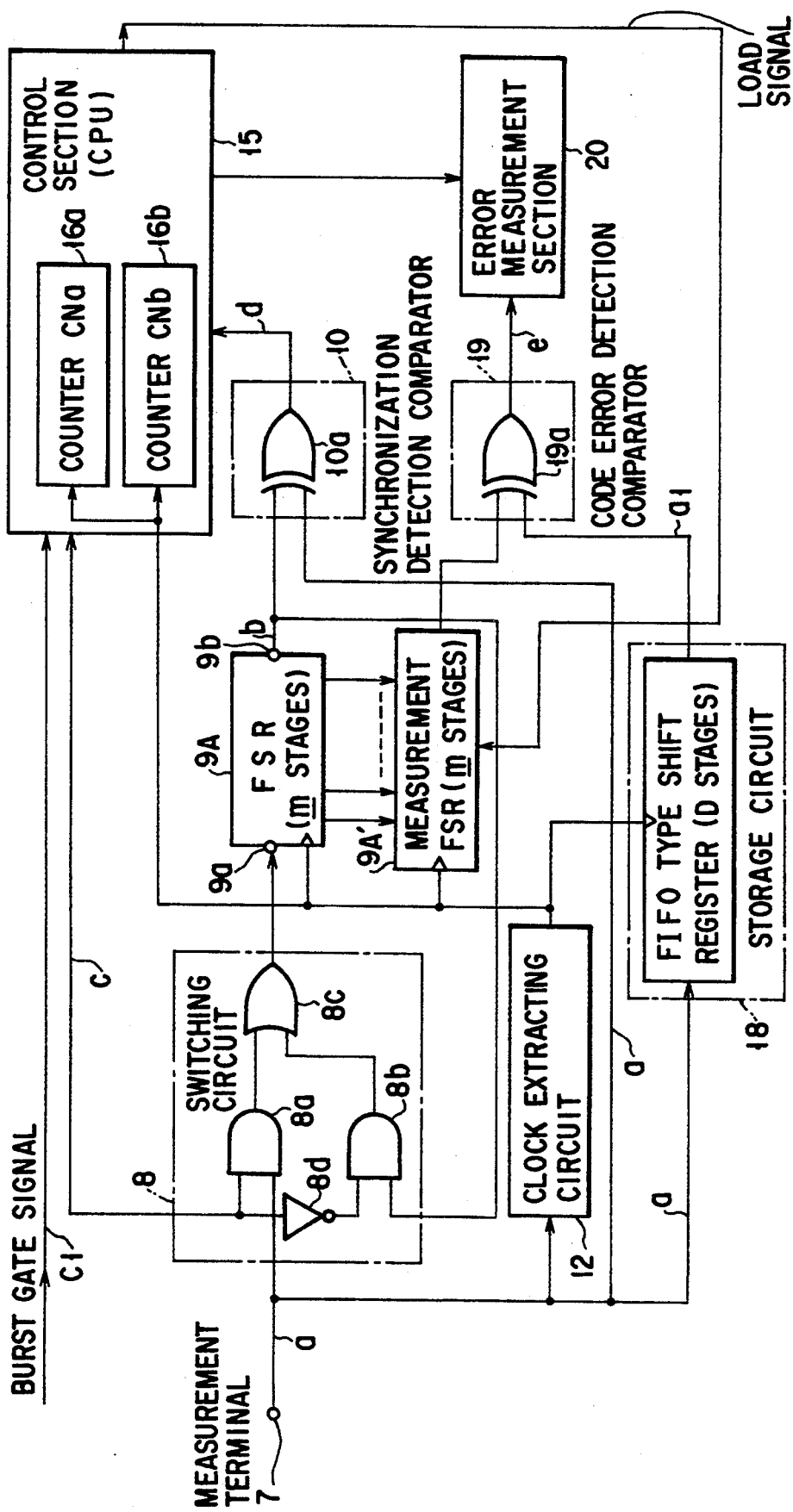
F I G. 5

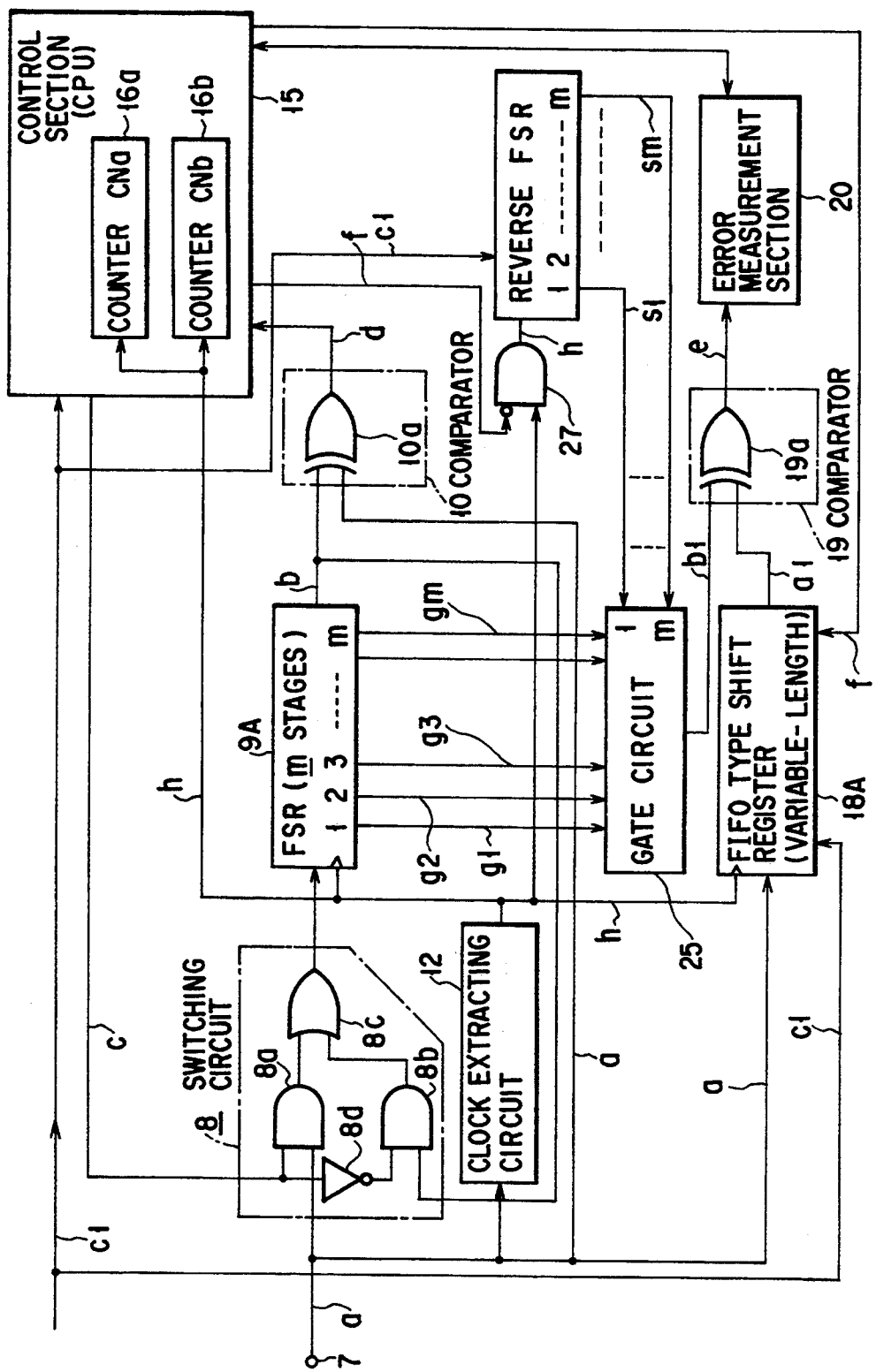
F I G. 7

FORWARD FSR OUTPUT

| NO | C1 | C2 | C3 | C4 | C5 |
|----|----|----|----|----|----|
| 0  | 1  | 1  | 1  | 1  | 1  |
| 1  | 0  | 1  | 1  | 1  | 1  |
| 2  | 0  | 0  | 1  | 1  | 1  |
| 3  | 0  | 0  | 0  | 1  | 1  |
| 4  | 1  | 0  | 0  | 0  | 1  |
| 5  | 1  | 1  | 0  | 0  | 0  |
| 6  | 0  | 1  | 1  | 0  | 0  |
| 7  | 1  | 0  | 1  | 1  | 0  |
| 8  | 1  | 1  | 0  | 1  | 1  |
| 9  | 1  | 1  | 1  | 0  | 1  |
| 10 | 0  | 1  | 1  | 1  | 0  |
| 11 | 1  | 0  | 1  | 1  | 1  |
| 12 | 0  | 1  | 0  | 1  | 1  |
| 13 | 1  | 0  | 1  | 0  | 1  |
| 14 | 0  | 1  | 0  | 1  | 0  |
| 15 | 0  | 0  | 1  | 0  | 1  |
| 16 | 0  | 0  | 0  | 1  | 0  |
| 17 | 0  | 0  | 0  | 0  | 1  |
| 18 | 1  | 0  | 0  | 0  | 0  |
| 19 | 0  | 1  | 0  | 0  | 0  |
| 20 | 0  | 0  | 1  | 0  | 0  |
| 21 | 1  | 0  | 0  | 1  | 0  |
| 22 | 0  | 1  | 0  | 0  | 1  |
| 23 | 1  | 0  | 1  | 0  | 0  |
| 24 | 1  | 1  | 0  | 1  | 0  |
| 25 | 0  | 1  | 1  | 0  | 1  |
| 26 | 0  | 0  | 1  | 1  | 0  |
| 27 | 1  | 0  | 0  | 1  | 1  |
| 28 | 1  | 1  | 0  | 0  | 1  |
| 29 | 1  | 1  | 1  | 0  | 0  |
| 30 | 1  | 1  | 1  | 1  | 0  |

PRECEDE 7 BITS

TIME ↓

REVERSE FSR OUTPUT

| NO | S1 | S2 | S3 | S4 | S5 |
|----|----|----|----|----|----|
| 0  | 1  | 0  | 0  | 0  | 0  |
| 1  | 0  | 1  | 0  | 0  | 0  |
| 2  | 0  | 0  | 1  | 0  | 0  |
| 3  | 0  | 0  | 0  | 1  | 0  |
| 4  | 0  | 0  | 0  | 0  | 1  |
| 5  | 1  | 0  | 0  | 1  | 0  |
| 6  | 0  | 1  | 0  | 0  | 1  |
| 7  | 1  | 0  | 1  | 1  | 0  |
| 8  | 0  | 1  | 0  | 1  | 1  |
| 9  | 1  | 0  | 1  | 1  | 1  |
| 10 | 1  | 1  | 0  | 0  | 1  |
| 11 | 1  | 1  | 1  | 1  | 0  |
| 12 | 0  | 1  | 1  | 1  | 1  |
| 13 | 1  | 0  | 1  | 0  | 1  |
| 14 | 1  | 1  | 0  | 0  | 0  |
| 15 | 0  | 1  | 1  | 0  | 0  |
| 16 | 0  | 0  | 1  | 1  | 0  |
| 17 | 0  | 0  | 0  | 1  | 1  |
| 18 | 1  | 0  | 0  | 1  | 1  |
| 19 | 1  | 1  | 0  | 1  | 1  |
| 20 | 1  | 1  | 1  | 1  | 1  |
| 21 | 1  | 1  | 1  | 0  | 1  |
| 22 | 1  | 1  | 1  | 0  | 0  |
| 23 | 0  | 1  | 1  | 1  | 0  |
| 24 | 0  | 0  | 1  | 1  | 1  |
| 25 | 1  | 0  | 0  | 0  | 1  |
| 26 | 1  | 1  | 0  | 1  | 0  |
| 27 | 0  | 1  | 1  | 0  | 1  |
| 28 | 1  | 0  | 1  | 0  | 0  |
| 29 | 0  | 1  | 0  | 1  | 0  |
| 30 | 0  | 0  | 1  | 0  | 1  |

7 BITS

TIME ↓

INITIAL VALUE $C1 \oplus C3 \oplus C4$

FIG. 15

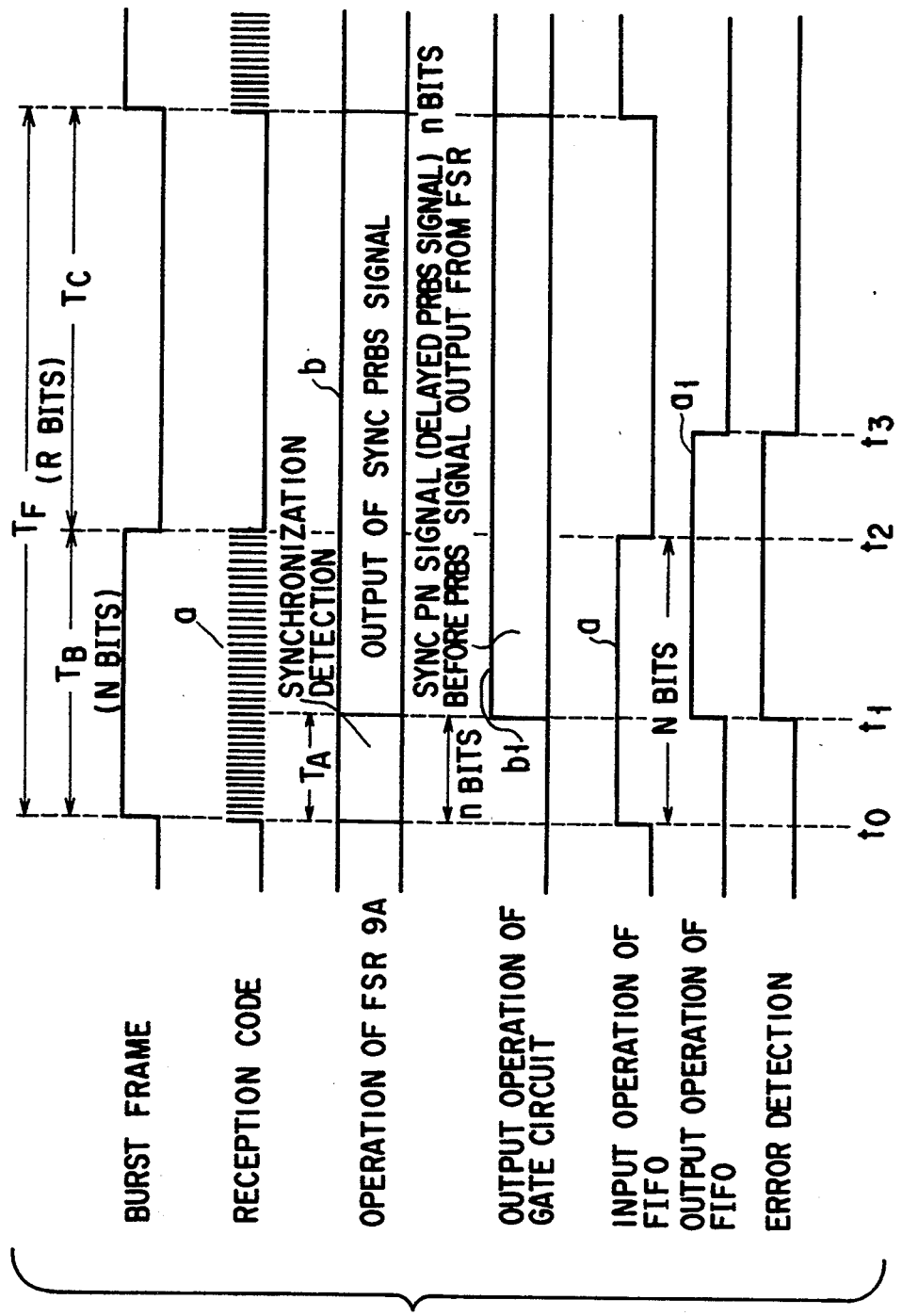
F I G. 17

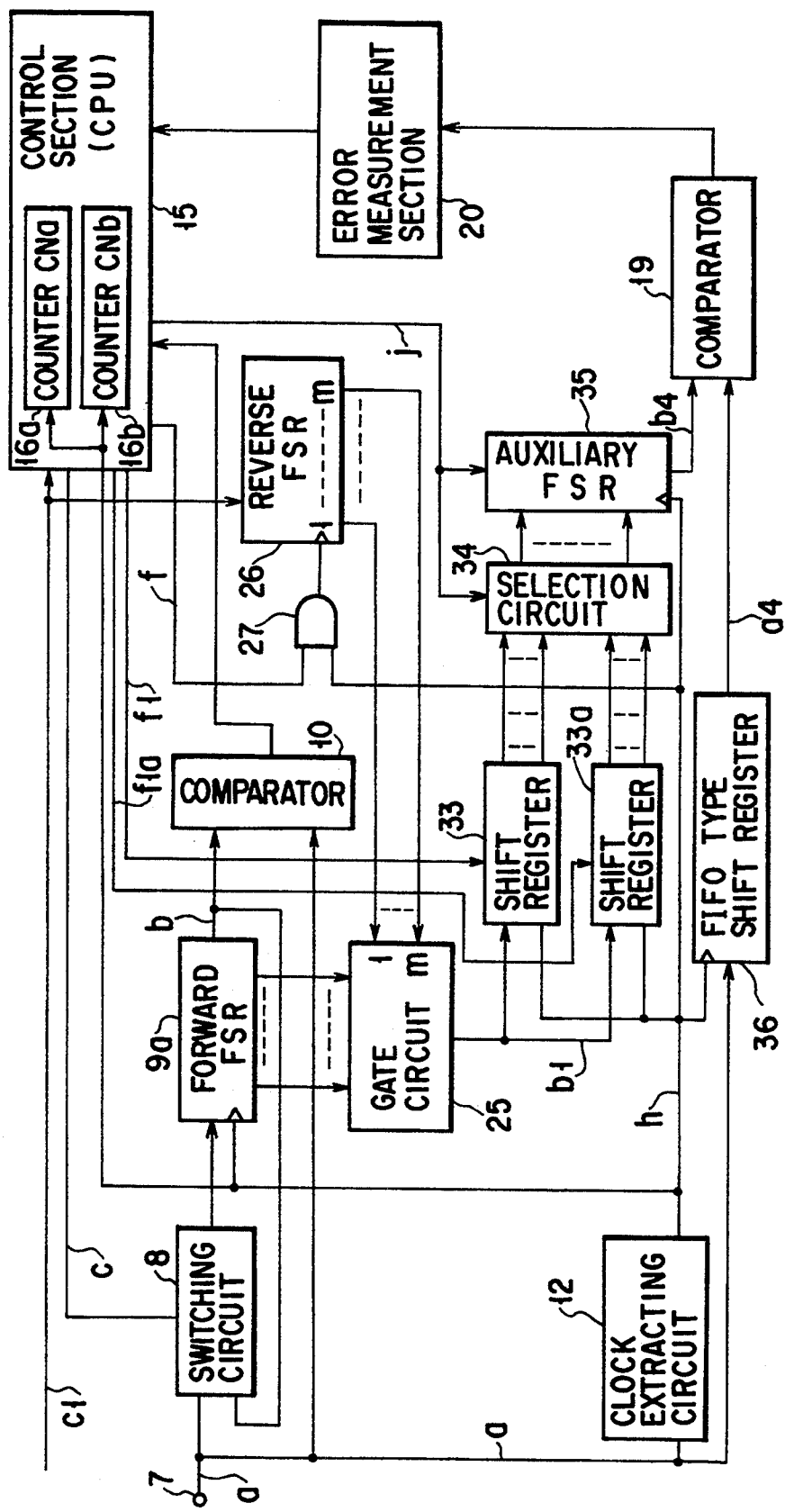
F I G. 20

FIG. 23A MOBILE STATION A
FIG. 23B MOBILE STATION B
FIG. 23C MOBILE STATION C
FIG. 23D BASE STATION

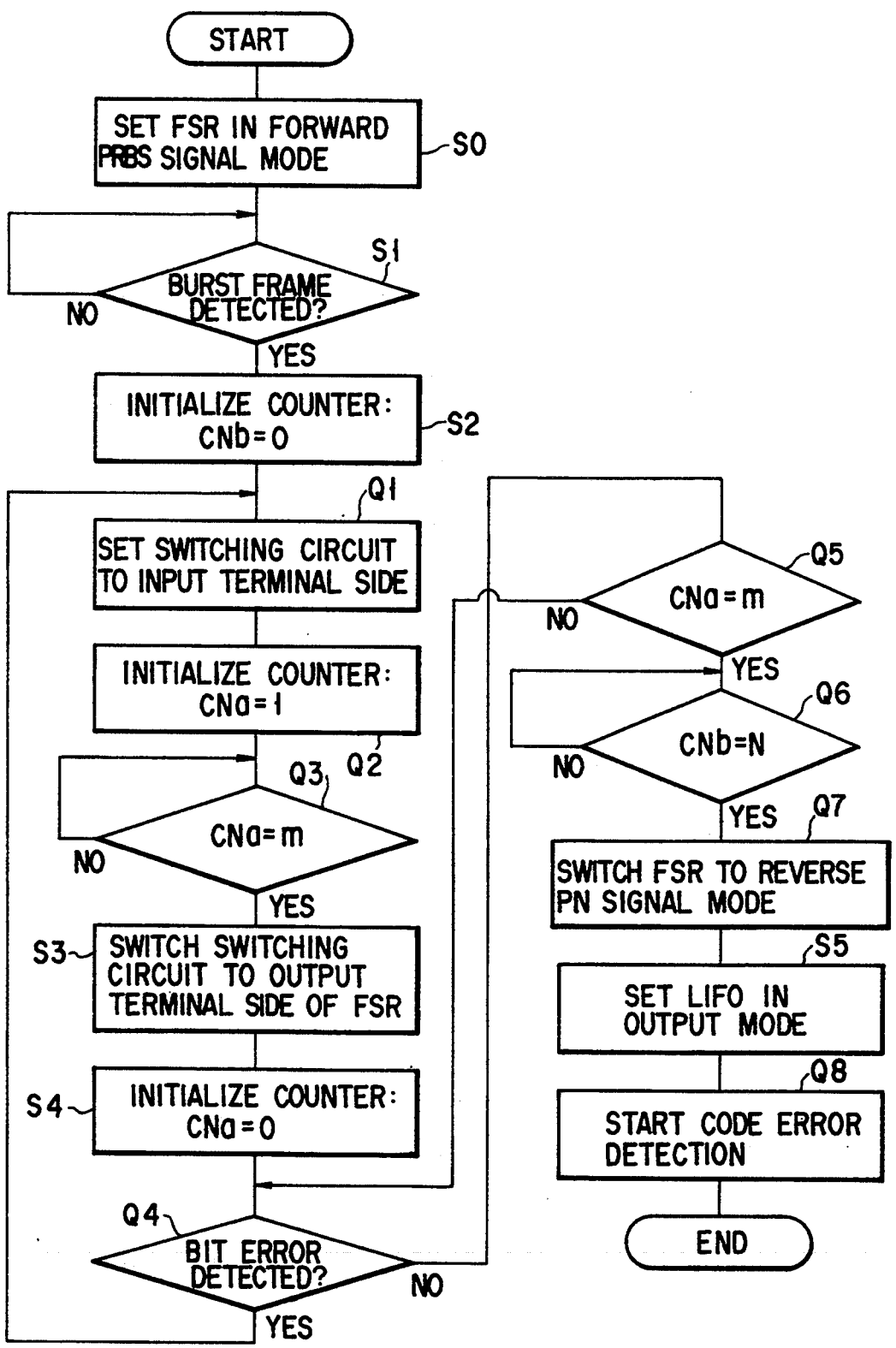
F I G. 27

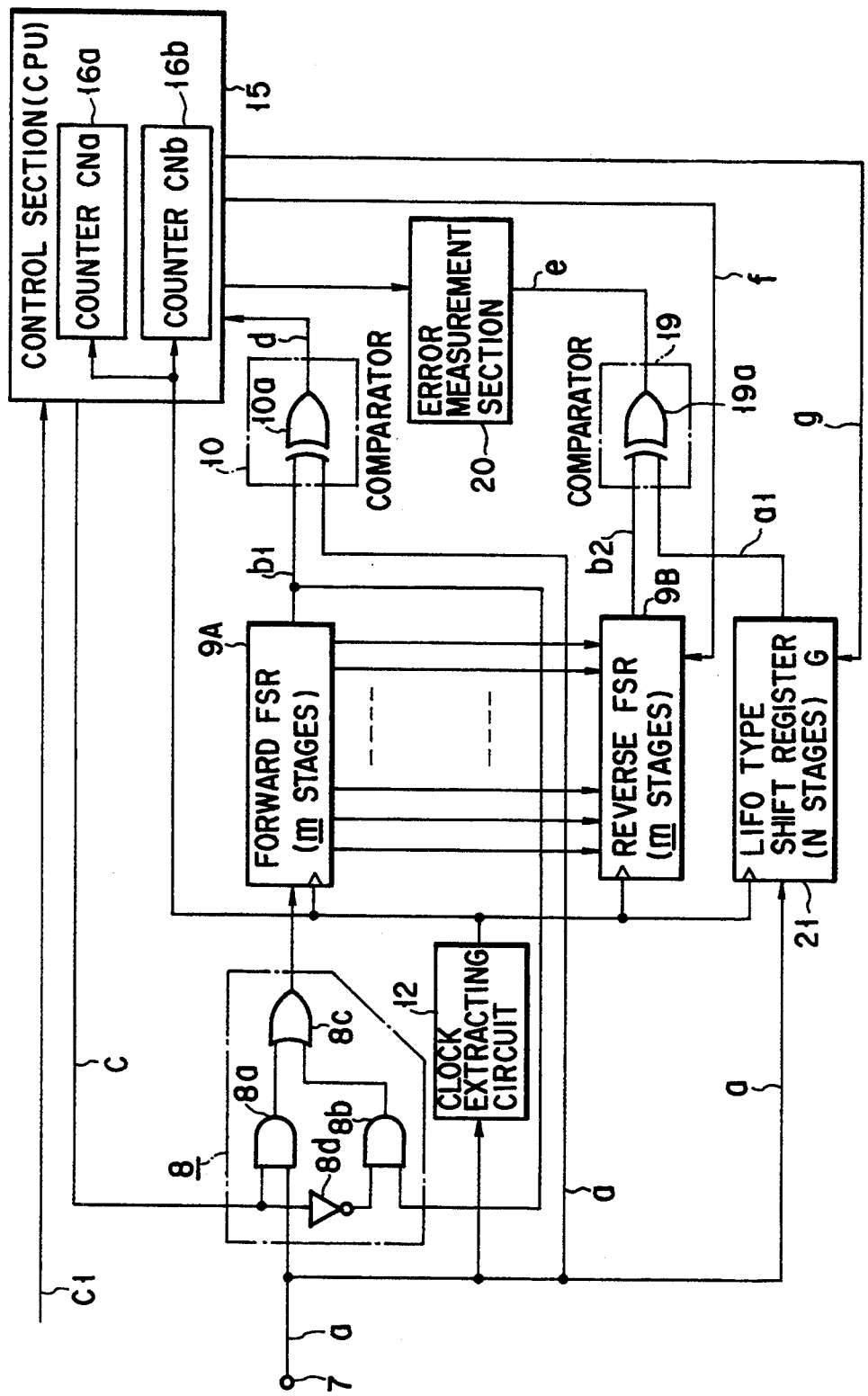
F I G. 32

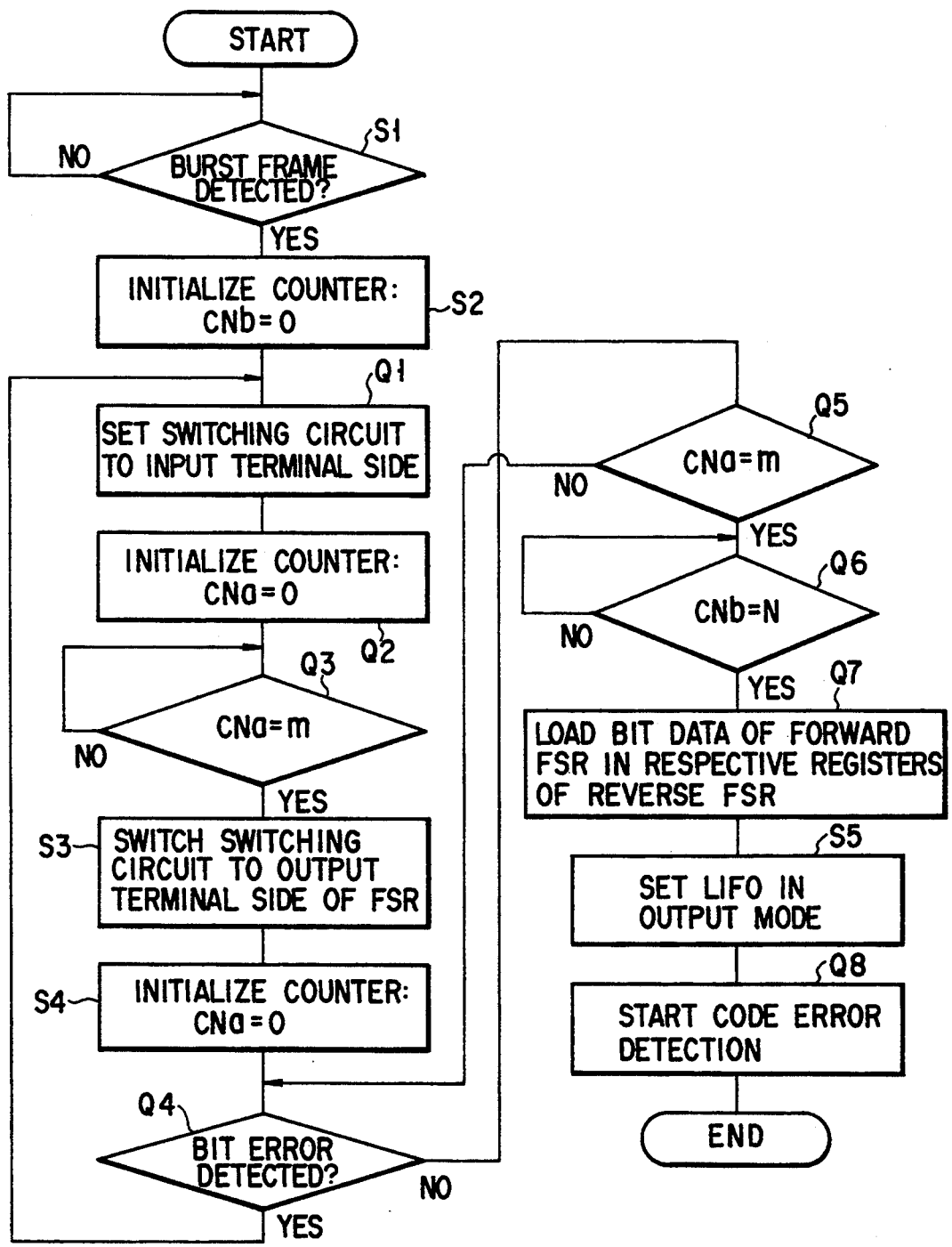
F I G. 34

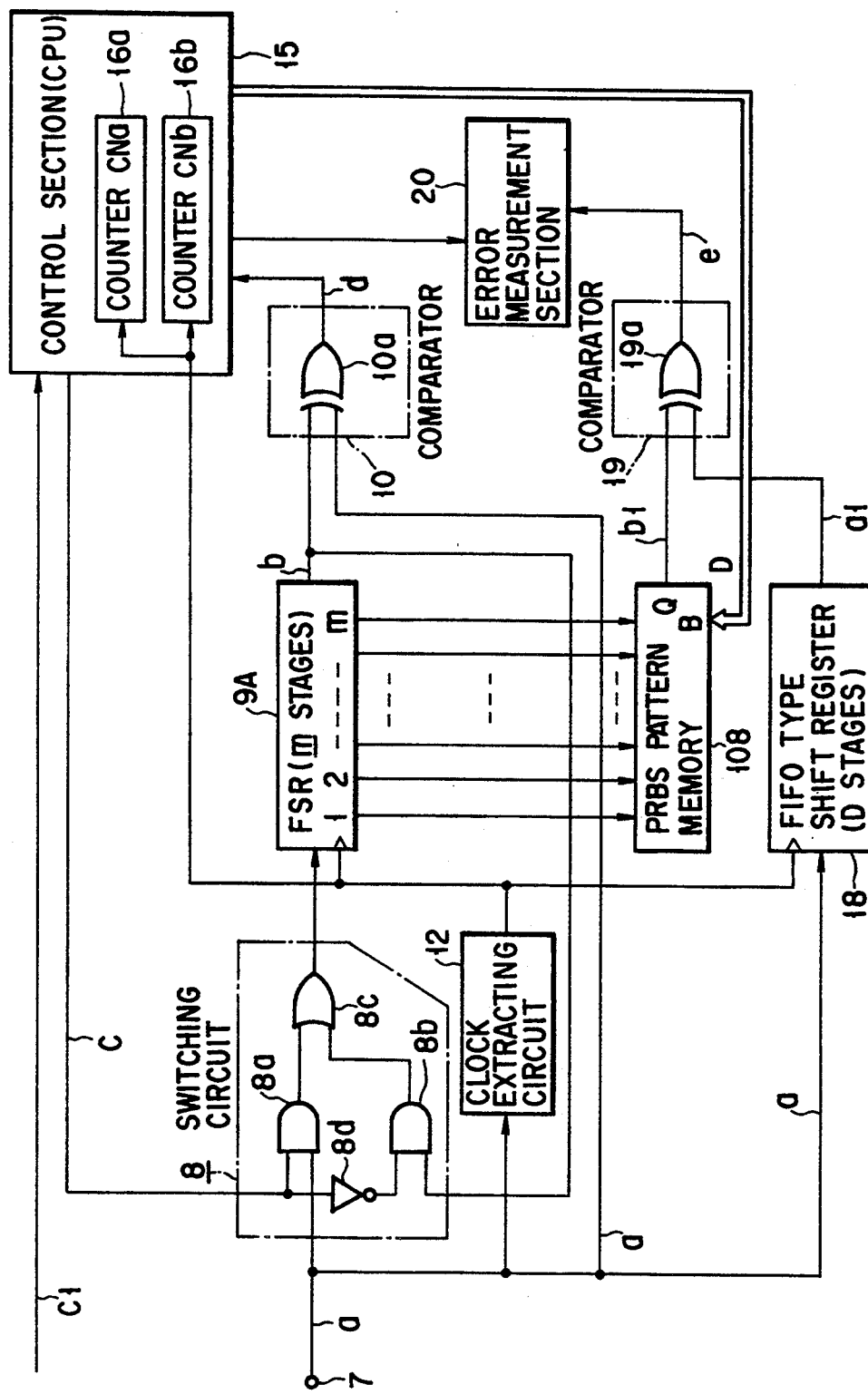
F I G. 36

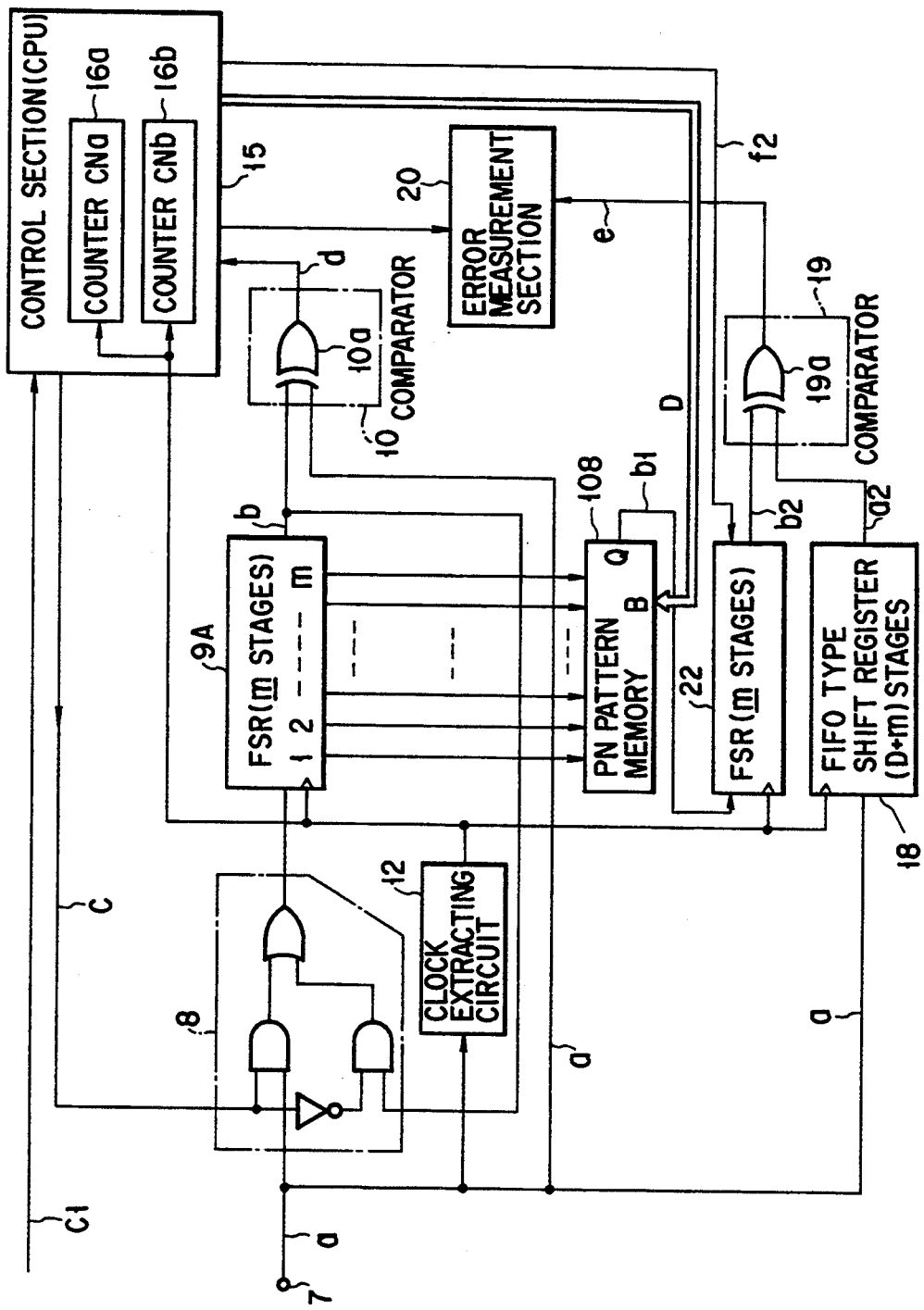
F I G. 38

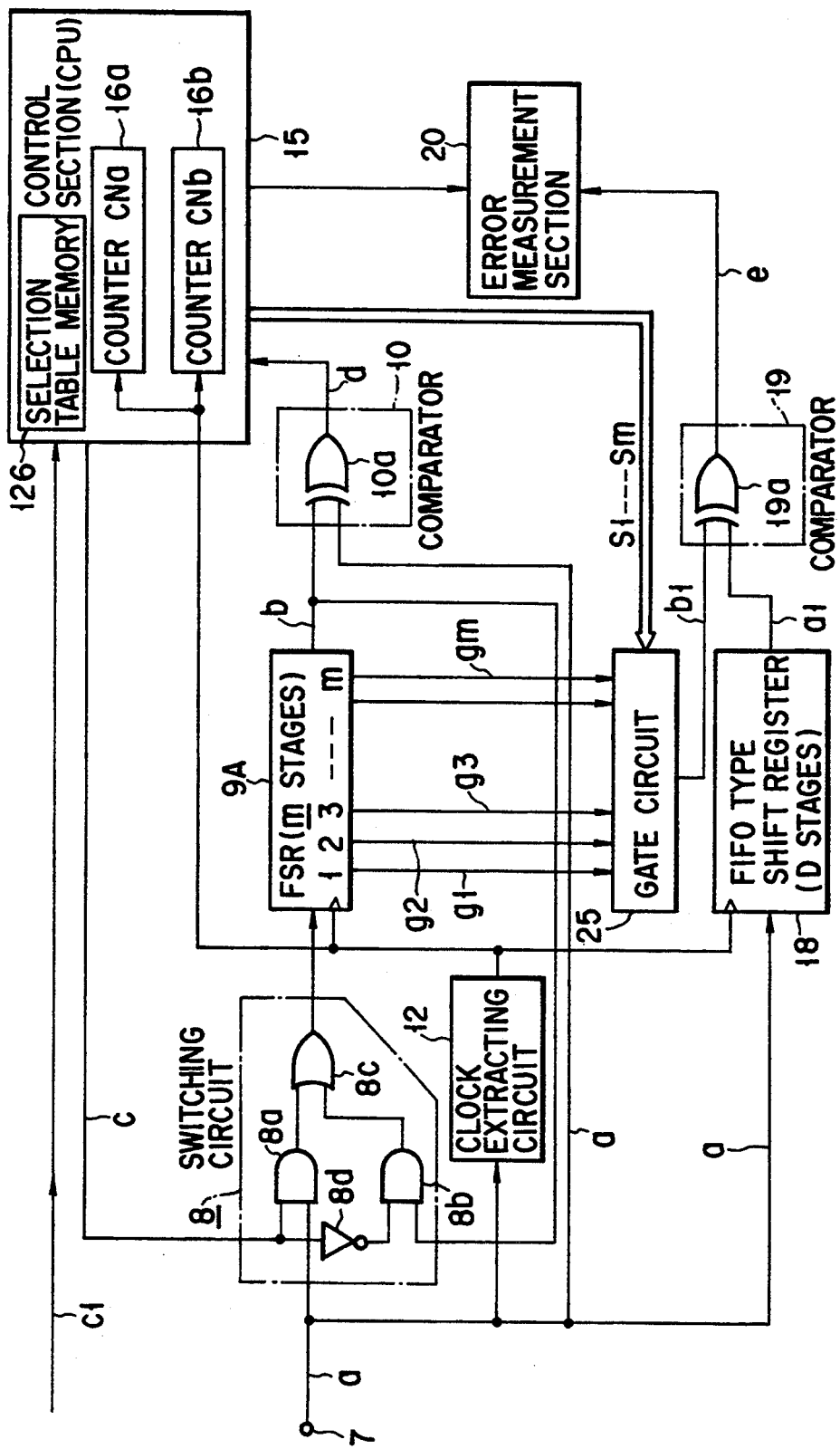
F I G. 40

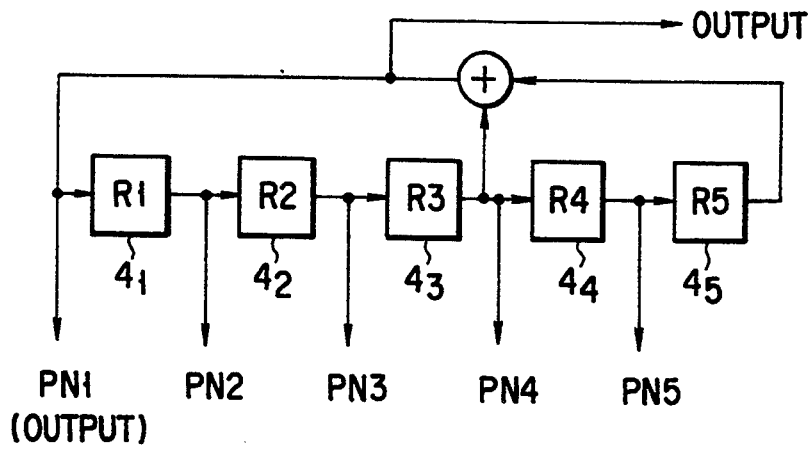
F I G. 41
| BIT COUNT | COMPOSITE PN NUMBER (EXCLUSIVE OR) |
|---|---|
| 0 | PN1 |
| 1 | PN2 |
| 2 | PN3 |
| 3 | PN4 |
| 4 | PN5 |
| 5 | PN1 ⊕ PN4 |
| ⋮ | ⋮ |
| 17 | PN4 ⊕ PN5 |
| 18 | PN1 ⊕ PN4 ⊕ PN5 |
| ⋮ | ⋮ |
| 29 | PN2 ⊕ PN4 |
| 30 | PN3 ⊕ PN5 |
←126
F I G. 42

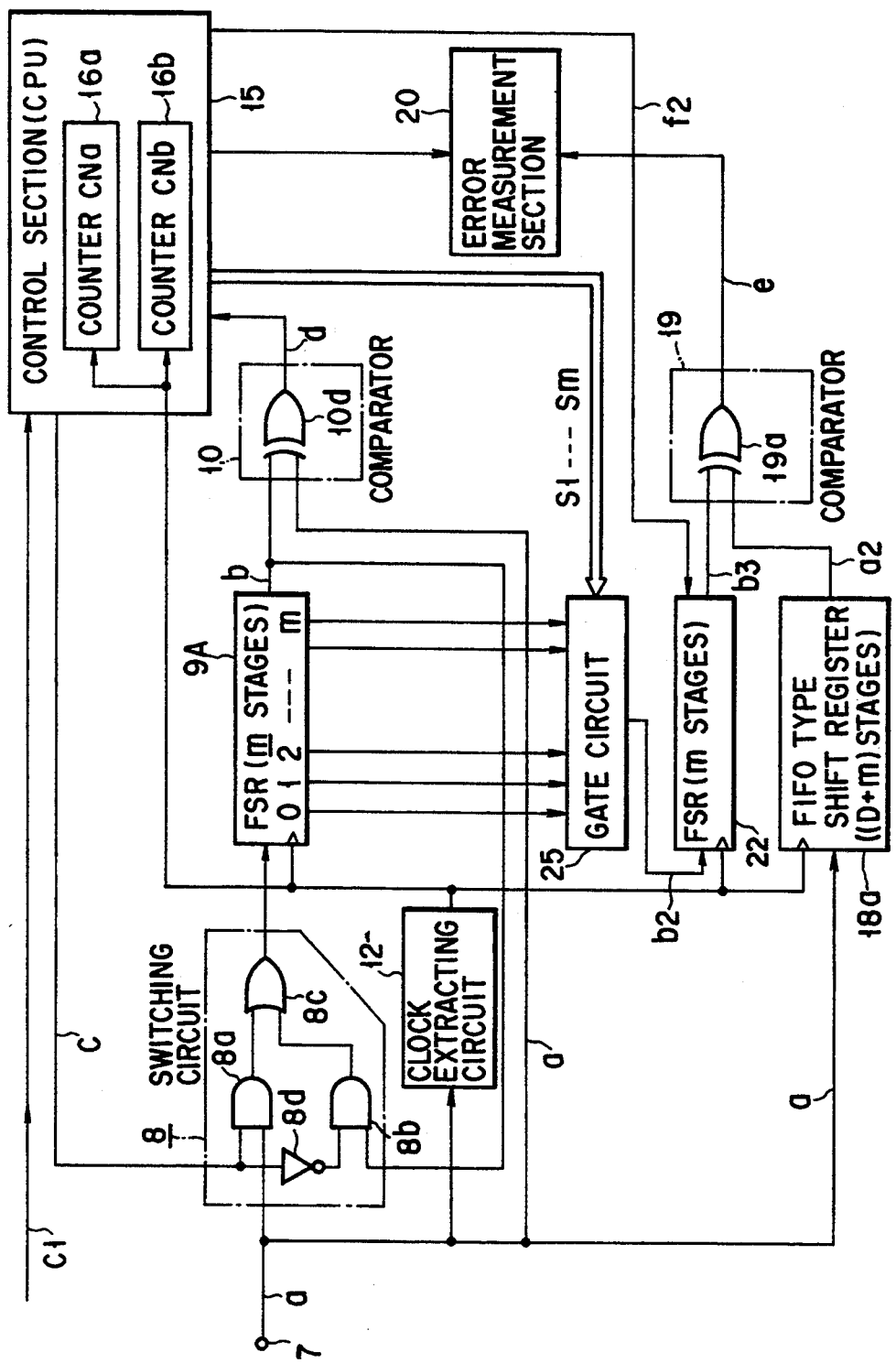
F I G. 44

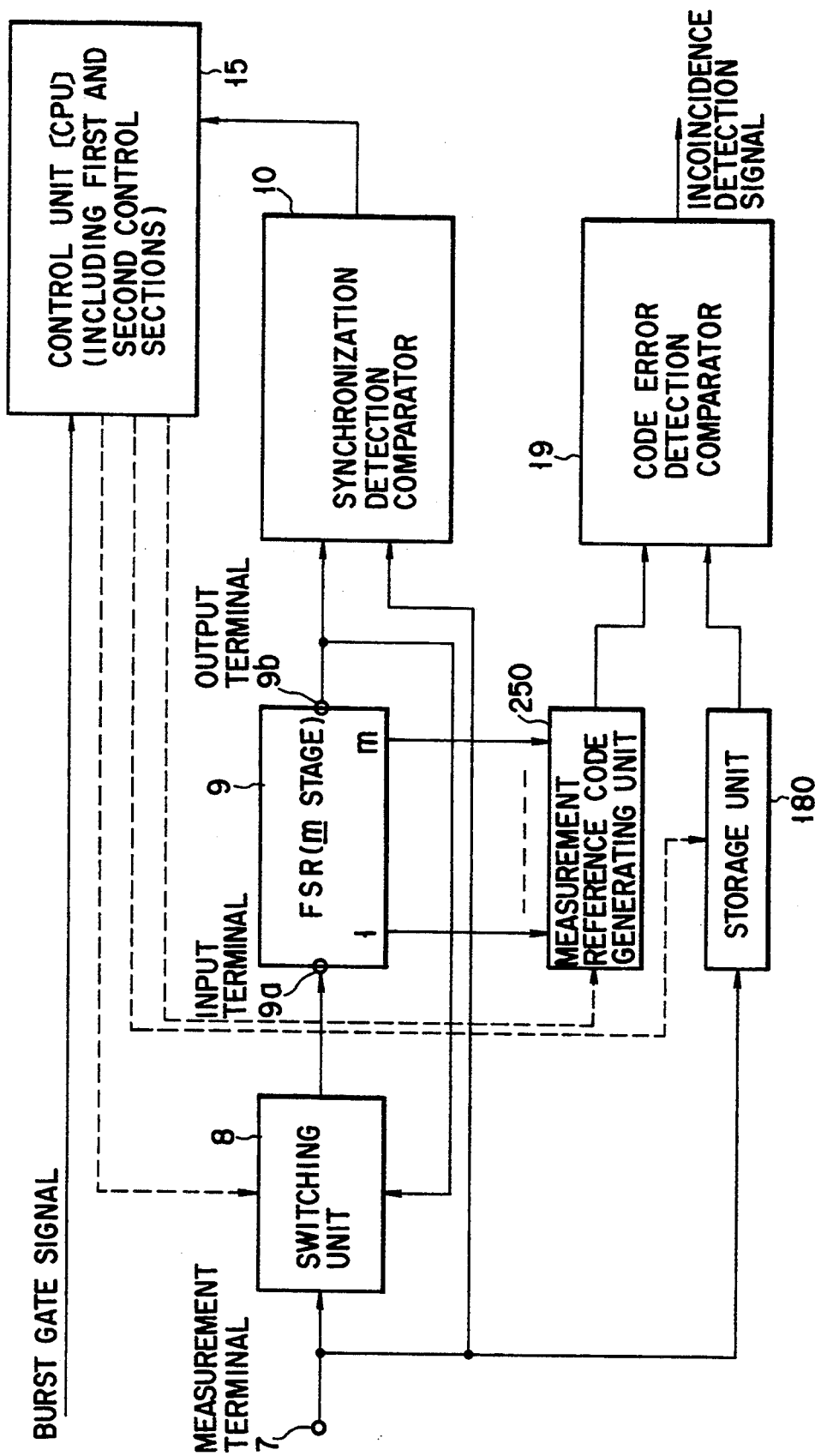
F I G. 46

ADVANCED CODE ERROR DETECTION APPARATUS AND SYSTEM USING MAXIMAL-LENGTH PSEUDORANDOM BINARY SEQUENCE

BACKGROUND OF THE INVENTION

1. Field of the Invention

The present invention generally relates to a code error detection system and, more particularly, to a code error detection apparatus for detecting bit errors in transmission codes in various types of digital transmission systems and apparatuses by using codes based on M-sequence (Maximal-length sequence) PRBS (Pseudorandom Bit Sequence) signals.

In addition, the present invention relates to a code error detection apparatus for detecting bit errors in transmission codes in various types of digital transmission systems and apparatuses by using codes based on M-sequence (Maximal-length sequence) PRBS (Pseudorandom Bit Sequence) signals and, more particularly, to an error detection apparatus for detecting bit errors in reception codes incorporated in burst frames.

2. Description of the Related Art

As is known, an ISDN (Integration Service Digital Network) is considered to be promising as a network which is capable of providing communication services associated with information of all kinds of media by means of a digital network.

The latest trend in information communication systems is to cope with a variety of high-speed multimedia. In order to meet such a need, a shift from a conventional narrow-band ISDN (N-ISDN) to a broad-band ISDN (B-ISDN) must be made.

The CCITT (International Telegraph and Telephone Consultative Committee) officially recommended (recommendation number I. 121) in November of 1990 to employ the ATM (Asynchronous Transfer Mode), which had been considered as a promising technique, so as to realize the above-mentioned B-ISDN. The ATM is a technique of performing high-speed multiplex conversion of information in units of fixed-length short cells by dividing the information into components and adding headers to the respective cells.

In mobile communication service systems, especially automobile telephone systems, a shift from a conventional analog scheme to a new digital scheme has been promoted to provide better services.

In digital information communication (i.e., code communication) systems including the above-described ATM transmission schemes and mobile communication schemes, the measurement evaluation of the overall system becomes increasingly important as the network is complicated owing to the diversification of services. In the case of the above-described code communication system, the signal transmission scheme is being shifted from consecutive code transmission to burst code transmission in which idle time intervals alternate with code transmission time intervals. Therefore, a measurement device for performing measurement evaluation of the system is required to cope with the shift.

It is known that detection of bit errors in codes transmitted from a transmitting section (test pattern generator) to a receiving section (error detector) forms the basis of measurement evaluation of such a code communication system (e.g., Hewlett-Packard Journal, March 1976, pp. 18 to 24 (see FIG. 8, especially)).

In addition, it is described in CCITT Recommendation 0.150–0.153 and the like that several types of maximal-length sequence (so called M-sequence) pseudorandom (PRBS) signals are used as test patterns used for such an error detector.

In RCR STD-27A for digital cellular telecommunication systems defined by the Research & Development Center for Radio Systems in Japan, it is also described that M-sequence PRBS signals (code length: 511 bits) conforming to CCITT V. 52 are used as test patterns.

In consideration of the above-described technical background, conventional code error detectors and their problems will be described below.

For example, when bit errors are to be detected in a code generated by a digital transmission system, a test signal generator 2 is connected to the signal input terminal of a target system 1 (to be tested), as shown in FIG. 49. A code based on an M-sequence PRBS signal as a test signal is transmitted from the test signal generator 2 to the target system 1, and bit errors in the transmission code are detected by a code error detection apparatus 3 connected to the signal output terminal of the target system 1.

As shown in FIG. 50, the test signal generator 2 incorporates an FSR (Feedback Shift Register) 6 comprising a shift register 4 consisting of series-connected m shift registers 4a and one or a plurality of EXOR gates (Exclusive OR circuits) 4b for calculating the exclusive OR of outputs from the registers 4a comprising the shift register 4. In addition, a switching circuit 8 connected to the input terminal of the first register 4a is connected to the EXOR gate 4b side so that a code based on a PRBS signal having a period of $(2^m-1)$ bits is generated by the FSR 6. For example, an FSR comprising by five registers has the arrangement shown in FIG. 51.

The code error detection apparatus 3 incorporates an FSR having the same arrangement as that of the FSR 6 of the test signal generator 2, and a comparator (not shown). This FSR generates a code (reference code) based on a PRBS signal of the same sequence as that of the test signal. Thereafter, the reception code from the target system 1 is compared with the code based on the PRBS signal as a reference to detect bit errors in the reception code which occur while passing through the target system 1.

Note that a state in which the FSR in the code error detection apparatus 3 is generating a reference code based on a PRBS signal of the same sequence as that of a test signal is regarded as a state in which the FSR is synchronous with a test signal. In an asynchronous state, if the reference code based on the PRBS signal generated by the FSR is compared with the reception code during an interval corresponding to at least m consecutive bits, non-coincidence is always detected in one of the bits. In other words, if the reference code based on the PRBS signal generated by the FSR is compared with the reception code during an interval corresponding to m consecutive bits, and no incoincidence is detected in any bit, it is determined that synchronization is established.

For example, the above-described code error detection apparatus has the arrangement shown in FIG. 52.

A reception code a based on an M-sequence PRBS signal and input through an input terminal 7 is supplied to the data terminal of a first register 4a in an FSR 9 identical to, e.g., the FSR shown in FIG. 50 which comprises by the series-connected m shift registers and the exclusive OR circuits, through one input terminal of a switching circuit 8 comprising two AND gates 8a and 8b, an OR gate 8c, and an inverter 8d. The reference code based on a PRBS signal b and output from the output terminal of the FSR 9 is input to one input terminal of an EXOR gate 10a comprising a comparator 10. At the same time, the reference code b based on the PRBS signal output from the FSR 9 is input to the other input terminal of the switching circuit 8. The switching circuit 8 is controlled by a switching signal c from a control section 11 comprising a central processing unit (CPU) and the like.

The reception code a input to the input terminal 7 is input to the switching circuit 8, and is simultaneously input to the other input terminal of the EXOR gate 10a. A clock signal corresponding to the bit rate of the reception code a, which is reproduced from the reception code a by a clock extracting circuit 12, is supplied to the clock terminal of the FSR 9. In addition, this reproduced clock signal is supplied to a counter 14 in the control section 11.

The comparator 10 compares each bit data of the reference code b based on the PRBS signal with corresponding bit data of the reception code a. Upon detection of incoincidence, the comparator 10 outputs an incoincidence detection signal d. The non-coincidence detection signal d output from the comparator 10 is input to the control section 11 and an error measurement section 13. For example, the error measurement section 13 counts input incoincidence signals to calculate an error rate.

An operation of the control section 11 in the code error detection apparatus 3 having such an arrangement will be described below with reference to the flow chart shown in FIG. 53.

The control section 11 sets the switching circuit 8 to the input terminal 7 side first by outputting the switching signal c of high (H) level (step P1). The control section 11 then sets a count value CN of the counter 14 to "0", and waits until the count value CN becomes m (step P2a). When the count value CN becomes m, the control section 11 determines that the m-bit data of the reception code a is set in the series-connected m shift registers comprising the FSR 9 (step p2b). When it is determined that the m-bit data is set in the FSR 9, the control section 11 changes the switching signal c to low (L) level to switch the switching circuit 8 to the output terminal side of the FSR 9 (step P3). As a result, the FSR 9 is set in a closed-loop state to be set in a self-running state so as to generate the reference code b based on the reference PRBS signal. At the same time, the control section 11 sets the count value CN of the counter 14 to "0" (step P4).

If it is determined in step P5 that the incoincidence detection signal d, i.e., an error detection signal, is input from the comparator 10, the flow returns to step P1. In step P1, the control section 11 switches the switching circuit 8 to the input terminal 7 side again to set the m-bit data of the reception code a in the FSR 9.

If no error detection signal is input in step P5, the control section 11 checks in step P6 whether the count value CN of the counter 14 has reached m. If NO in step P6, the flow returns to step P5 to check the presence/absence of an error detection signal again.

If it is determined in step P6 that the count value CN has reached m, it means that no incoincidence is detected after the reference code b based on the PRBS signal output from the FSR 9 is compared with the reception code a throughout m consecutive bits. At this time, therefore, the control section 11 determines that the synchronization of the reference code based on the PRBS signal output from the FSR 9 with respect to the reception code a is established.

When the synchronization is established, the control section 11 issues a command in step P7 to start bit error detection with respect to the reception code a. More specifically, in accordance with the error measurement command from the control section 11, the error measurement section 13 subsequently counts incoincidence detection signals d, i.e., error detection signals, output from the comparator 10 for a predetermined period of time, thus calculating a bit error rate.

A burst frame transmission scheme may be employed depending on the specifications and type of the target system 1 shown in FIG. 49. In this scheme, for example, signal transmission only in a predetermined time interval $T_B$, and cessation of transmission in a succeeding predetermined time interval $T_C$ are repeated, as shown in FIG. 54. In this case, therefore, in the idle time interval $T_C$, reception of the reception code a is stopped in the code error detection apparatus 3. For this reason, when bit errors in a transmitted code in this burst frame transmission scheme are to be measured by using M-sequence PRBS signals, pattern synchronization must be reestablished for each burst frame.

As a time interval $T_A$ required to establish the synchronization between the reception code a and the reference code b based on the PRBS signal from the start of a burst frame, at least a 2m-bit time interval is required with respect to the above-described FSR 9 consisting of m registers, and the length of the time interval varies depending on the state of occurrence of error bits in a code.

In a conventional code error detection apparatus, assuming that the synchronization between a reception code and a reference code based on a PRBS signal is established by the time the last bit of a burst frame is received, bit errors contained in the reception code a in the interval $T_A$ between the start of the burst frame and the establishment of synchronization cannot be properly detected. Therefore, an actual error measurement time interval $T_M$ is shortened by this time interval $T_A$. The interval $T_A$ required for establishing synchronization is not a negligible value as compared with the burst frame time interval $T_B$ (280 bits). For example, the bit error rate of a whole burst frame cannot be correctly measured, because bit errors occurring in the time interval $T_A$ after which synchronization is established cannot be detected.

In addition, even in a transmission/reception system designed to perform normal consecutive data transmission/reception without using any burst frame, the conventional code error detection apparatus cannot start bit error detection from bit data at the start of bit error measurement.

SUMMARY OF THE INVENTION

It is, therefore, an object of the present invention to provide a new and improved code error detection apparatus which can start bit error detection from a desired time point, i.e., can reliably detect bit errors in bit data including the bit data of a reception code input before the establishment of synchronization regardless of the use of burst frames.

It is another object of the present invention to reliably perform bit error detection even with respect to a reception code input before the establishment of synchronization by using a storage unit such as a first-in first-out (FIFO) type shift register for delaying a reception code by an integer multiple of the period of the reception code.

It is still another object of the present invention to provide a code error detection apparatus which can reliably perform bit error detection even with respect to each bit data of a reception code input before the establishment of synchronization by using not only a conventional forward FSR for outputting the same bit pattern as that of a reception code, but also a reverse FSR for outputting a reverse bit pattern and, for example, a last-in first-out (LIFO) type shift register, and can improve the bit error detection precision with respect to a reception code incorporated in a burst frame even if the burst frame time interval is short.

It is still another object of the present invention to provide a code error detection apparatus which can reliably perform bit error detection even with respect to each bit data of a reception code input before the establishment of synchronization by using a forward/reverse FSR capable of switching its operation mode between forward and reverse PRBS signal modes, and an LIFO type shift register, and can improve the bit error detection precision with respect to a reception code incorporated in a burst frame even if the burst frame time interval is short.

It is still another object of the present invention to provide a code error detection apparatus which can reliably perform bit error detection even with respect to each bit data of a reception code input before the establishment of synchronization by using a PRBS pattern memory for storing a PRBS signal a predetermined number of bits before a PRBS signal generated by an FSR upon establishment of synchronization, and an FIFO type shift register, and can improve the bit error detection precision with respect to a reception code even if the duration of the reception code is short.

It is still another object of the present invention to provide a code error detection apparatus which can reliably perform bit error detection even with respect to each bit data of a reception code input before the establishment of synchronization by using a signal selection circuit and an exclusive OR circuit, both designed to generate a delayed PRBS signal a predetermined number of bits before a PRBS signal generated by an FSR at the time of establishment of synchronization on the basis of a unit PRBS signal output from each register of the FSR, and an FIFO type shift register for delaying the bit data of a reception code which is input before the synchronization between internal and external PRBS signals is established, and can improve the bit error detection precision with respect to a reception code even if the duration of the reception code is short.

It is still another object of the present invention to provide a code error detection apparatus which can reliably perform bit error detection even with respect to each bit data of a reception code input before the establishment of synchronization by using an OR circuit and a reverse FSR, both designed to generate a reference code based on a delayed PRBS signal obtained by retroacting a reference code, based on a PRBS signal output from an FSR at the time of establishment of synchronization, from the time of input of a reception code on the basis of a unit PRBS signal output from each register of the FSR, and an FIFO type shift register for delaying the reception code which is input before the synchronization between the reference code based on the PRBS signal and the reception code is established, and can improve the bit error detection precision with respect to a reception code even if the duration of the reception code is short.

It is still another object of the present invention to provide a code error measurement system for performing code error measurement of a transmission system by using a code error detection apparatus which can start bit error detection from a desired time point, i.e., can reliably detect bit errors in bit data including the bit data of a reception code input before the establishment of synchronization regardless of the use of burst frames.

According to a first aspect of the present invention, there is provided a code error detection apparatus comprising:

a measurement terminal for receiving a reception code of an M-sequence having a period $(2^m-1)$ (where m is an arbitrary natural number);

a feedback shift register (FSR) having input and output terminals, m stages of shift registers cascade-connected between the input and output terminals, and a predetermined number of exclusive OR circuits respectively connected between outputs of a predetermined stage of shift registers of the m stage of shift registers;

switching means, arranged between the target measurement terminal and the FSR, for switching connection states between a first state in which the input terminal of the FSR is connected to the measurement terminal and a second state in which the output terminal of the FSR is connected to the input terminal of the FSR;

first control means for outputting a first control signal for setting the first state to the switching means at a first timing, and outputting a second control signal for setting the second state to the switching means at a second timing at which m consecutive bit data of the reception code input to the FSR from the measurement terminal in the first state are fetched, thereby setting the FSR in a self-running state;

synchronization detection comparing means for sequentially comparing bit data output from the output terminal of the FSR set in the self-running state in the second state with bit data of the reception code input to the measurement terminal;

second control means for, when the m consecutive bit data output from the FSR are determined to coincide with those output from the measurement terminal on the basis of a comparison result output from the synchronization detection comparing means, determining that the bit data output from the output terminal of the FSR set in the self-running state are a reference code, and causing the switching means to maintain the second state, and for, when the m consecutive bit data output from the FSR are determined not to coincide with those output from the measurement terminal, outputting a third control signal for setting the first state to the switching means so as to set a state in which the FSR fetches m consecutive bit data of the reception code input from the measurement terminal again;

storage means for storing consecutive bit data of the reception code input to the measurement terminal in a time interval from the instant at which the FSR starts to fetch the m consecutive bit data of the reception code in the first state to at least the instant at which it is determined by the second control means that the bit data are the reference code, and outputting stored bit data after delaying the bit data by a predetermined period of time; and bit error detection comparing means for sequentially comparing the bit data of a delayed reception code output from the storage means with the bit data determined to be the reference code and output from the output terminal of the FSR.

According to a second aspect of the present invention, there is provided a code error detection apparatus comprising:

a measurement terminal for receiving a reception code of an M-sequence having a period $(2^m-1)$ (where m is an arbitrary natural number);

a feedback shift register (FSR) having input and output terminals, m stage of shift registers cascade-connected between the input and output terminals, and a predetermined number of exclusive OR circuits respectively connected between outputs of a predetermined stage of shift registers of m stage of the shift registers;

switching means, arranged between the measurement terminal and the FSR, for switching connection states between a first state in which the input terminal of the FSR is connected to the measurement terminal and a second state in which the output terminal of the FSR is connected to the input terminal of the FSR;

first control means for outputting a first control signal for setting the first state to the switching means at a first timing, and outputting a second control signal for setting the second state to the switching means at a second timing at which m consecutive bit data of the reception code input to the FSR from the target terminal in the first state are fetched, thereby setting the FSR in a self-running state;

synchronization detection comparing means for sequentially comparing bit data output from the output terminal of the FSR set in the self-running state in the second state with bit data of the reception code input to the measurement terminal;

second control means for, when the m consecutive bit data output from the FSR are determined to coincide with those output from the measurement terminal on the basis of a comparison result output from the synchronization detection comparing means, determining that the bit data output from the output terminal of the FSR set in the self-running state are a reference code, and causing the switching means to maintain the second state, and for, when the m consecutive bit data output from the FSR are determined not to coincide with those output from the measurement terminal, outputting a third control signal for setting the first state to the switching means so as to set a state in which the FSR fetches m consecutive bit data of the reception code input from the measurement terminal again;

storage means for storing consecutive bit data of the reception code input to the measurement terminal in a time interval from the instant at which the FSR starts to fetch the m consecutive bit data of the reception code in the first state to at least the instant at which it is determined by the second control means that the bit data are the reference code, and outputting stored bit data after delaying the bit data by a predetermined period of time;

measurement reference code generating means for, when the bit data determined to be the reference code are output from the output terminal of the FSR, receiving the bit data output from each stage of the m stage of shift registers of said FSR or the bit data determined to be the reference code, and generating a measurement reference code having a predetermined phase relationship with the bit data determined to be the reference code; and bit error detection comparing means for comparing a delayed reception code output from the storage means with the measurement reference code output from the measurement reference code generating means.

According to a third aspect of the present invention, there is provided a code error measurement system connected to a digital transmission system using burst frames and designed to perform code error measurement, comprising:

a transmission signal generating unit for transmitting error measurement M-sequence bit data having a period $(2^m-1)$ to a transmission system upon incorporating the bit data in the burst frames;

a reference code generating unit for sequentially receiving the bit data incorporated in the burst frames through the digital transmission system as reception codes, and generating reference codes synchronized with the bit data in units of burst frames on the basis of the reception codes;

a storage unit for storing bit data of the reception codes in a time interval from the instant at which the burst frame starts to at least the instant at which the reference code is generated, and outputting the bit data upon delaying the bit data by a predetermined period of time; and a bit error detection comparing unit for comparing the delayed reception codes output from the storage unit with the reference codes from the reference code generating unit in units of burst frames.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1B is a block diagram showing a schematic arrangement of the first embodiment;

FIG. 2 is a flow chart showing an operation of the apparatus of the first embodiment;

FIGS. 4 and 5 are block diagrams respectively showing the schematic arrangements of modifications of the code error detection apparatus of the first embodiment in FIG. 1;

FIG. 7 is a block diagram showing the schematic arrangement of a code error detection apparatus according to the second embodiment of the present invention;

FIG. 15 is a view showing bit data values at the respective clock numbers in the reverse FSR in FIG. 13B;

FIG. 17 is a timing chart showing an operation of the apparatus of the second embodiment;

FIG. 20 is a block diagram showing the schematic arrangement of another modification of the code error detection apparatus according to the second embodiment of the present invention;

FIGS. 23A to 23D are timing charts showing an operation of the system in FIG. 22;

FIG. 27 is a flow chart showing an operation of the apparatus of the third embodiment;

FIG. 32 is a block diagram showing the schematic arrangement of a code error detection apparatus according to the fourth embodiment of the present invention;

FIG. 34 is a flow chart showing an operation of the apparatus of the fourth embodiment;

FIG. 36 is a block diagram showing the schematic arrangement of a code error detection apparatus according to the fifth embodiment of the present invention;

FIG. 38 is a block diagram showing the schematic arrangement of a modification of the code error detection apparatus according to the fifth embodiment of the present invention;

FIG. 40 is a block diagram showing the schematic arrangement of a code error detection apparatus according to the sixth embodiment of the present invention;

FIG. 41 is a block diagram showing the schematic arrangement of an FSR to explain the operation principle of the present invention;

FIG. 42 is a view showing a selection table indicating the relationship between delayed bit counts and combinations of the respective unit PRBS signals in the FSR in FIG. 42.

FIG. 44 is a block diagram showing the schematic arrangement of a modification of the code error detection apparatus according to the sixth embodiment of the present invention;

FIG. 46 is a block diagram showing a main part common to the second to sixth embodiments of the present invention;

DETAILED DESCRIPTION OF THE PREFERRED EMBODIMENTS

Figure 1A:
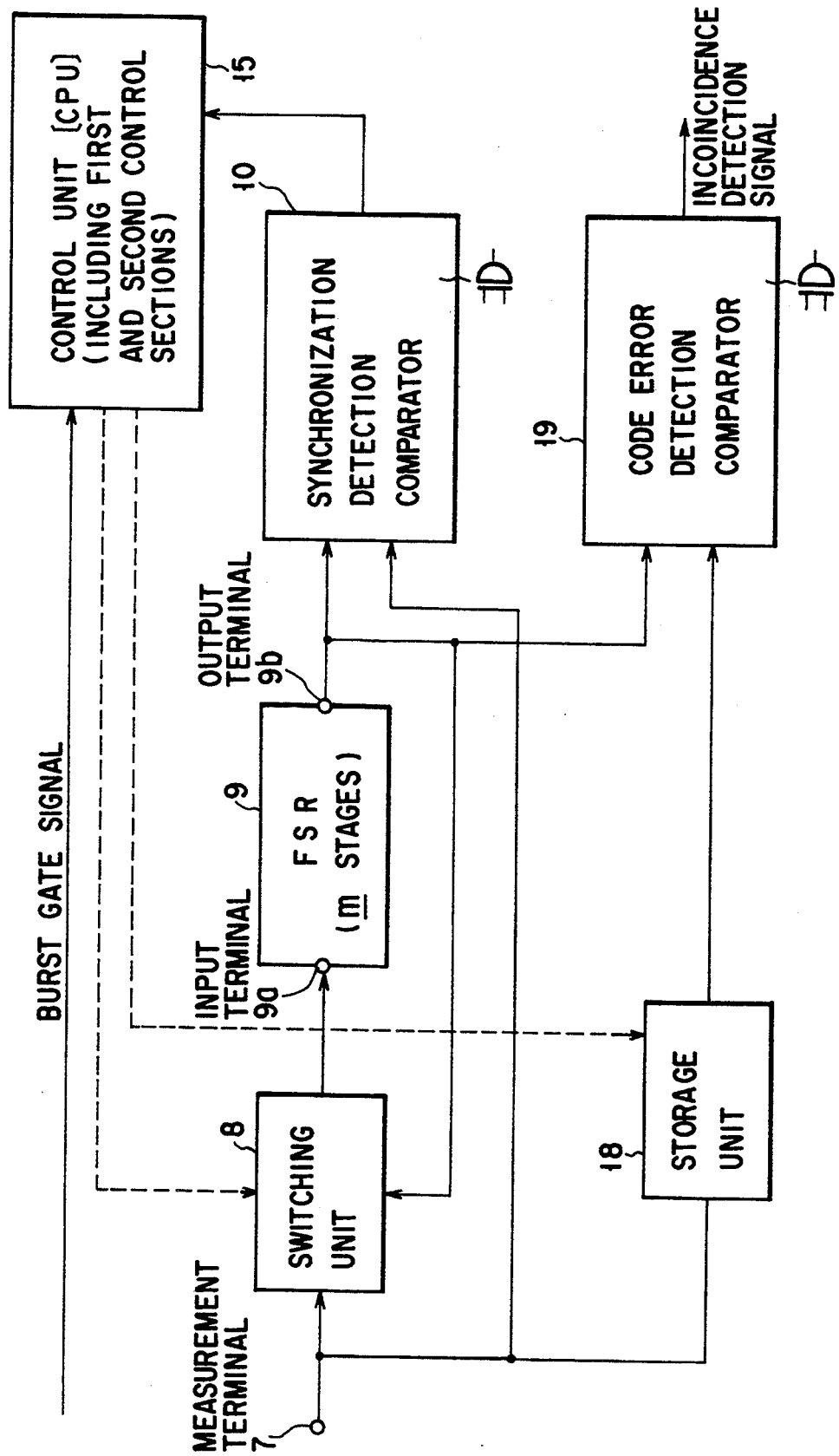
FIG. 1A is a block diagram showing a main part of a code error detection apparatus according to the first embodiment of the present invention.

Reference will now be made in detail to the presently preferred embodiments of the invention as illustrated in the accompanying drawings, in which like reference characters designate like or corresponding parts throughout the several drawings.

An outline of a code error detection apparatus according to the first embodiment of the present invention will be described first.

It is a subject of the code error detection apparatus of this embodiment to reliably perform bit error detection even with respect to a start portion of a reception code input before a reference code based on a PRBS signal output from an FSR incorporated in the apparatus is synchronized with the reception code, when bit error detection is to be performed by using an M-sequence PRBS signal as a test signal so as to evaluate a target digital system to be measured. For this object, the code error detection apparatus includes an FIFO type shift register for delaying the reception code, input before the reference code based on the PRBS signal output from the incorporated FSR is synchronized with the reception code, by an integer multiple of $(2^m-1)$ bits, thereby performing bit error detection with respect to each bit of the delayed reception code upon establishment of the synchronization.

In order to achieve the above subject, according to the first embodiment of the present invention, the code error detection apparatus is designed as follows. After m consecutive bit data of an M-sequence reception code having a period $(2^m-1)$, input through a measurement terminal, are respectively set in the m stage of shift registers of an FSR through a switching circuit, the switching circuit is operated to connect the input and output terminals of the FSR to each other so as to set the FSR in a self-running state. The bit data of the reference code based on the PRBS signal output from the FSR are sequentially compared with the bit data of the reception code. If m consecutive bits of the reference code coincide with those of the reception code, it is determined that the synchronization of the PRBS signal with respect to the reception code is established. Thereafter, bit errors in the reception code are detected by comparing the respective bit data of the reception code with those of the reference code based on the PRBS signal. In addition, the code error detection apparatus includes an FIFO type shift register for delaying the reception code input through the measurement terminal by an integer multiple of the period of the reception code, and a comparator for outputting an incoincidence detection signal when each bit data of the reception code delayed by the FIFO type shift register is compared with each bit data of the reference code based on the PRBS signal upon establishment of the synchronization, and an incoincidence occurs.

According to the code error detection apparatus having such an arrangement, the bit data of a reception code input through the measurement terminal are sequentially stored in the m stage of shift registers of the FSR through the switching circuit, and are sequentially stored in the registers of the FIFO (first-in first-out) type shift register. Thereafter, the synchronization between the reception code input to the input terminal and the reference code based on the PRBS signal output from the FSR is established.

In addition, since the FIFO type shift register accurately delays the reception code by an integer multiple of the period, the reference code based on the PRBS signal output from the FSR is synchronized not only with the reception code input to the input terminal but also with the reception code output from the FIFO type shift register.

If, therefore, the bit data of the delayed reception code are compared, in units of bits, with the bit data of the reference code based on the PRBS signal obtained in the time interval between the instant at which the start bit data of the reception code is output from the FIFO type shift register and the instant at which each bit data of the reference code based on the PRBS signal is synchronized with corresponding bit data of the delayed reception code, bit error detection and measurement with respect to the reception code input before the establishment of synchronization can be performed.

The first embodiment of the present invention based on the above outline will be described below with reference to the accompanying drawings.

Figure 52:
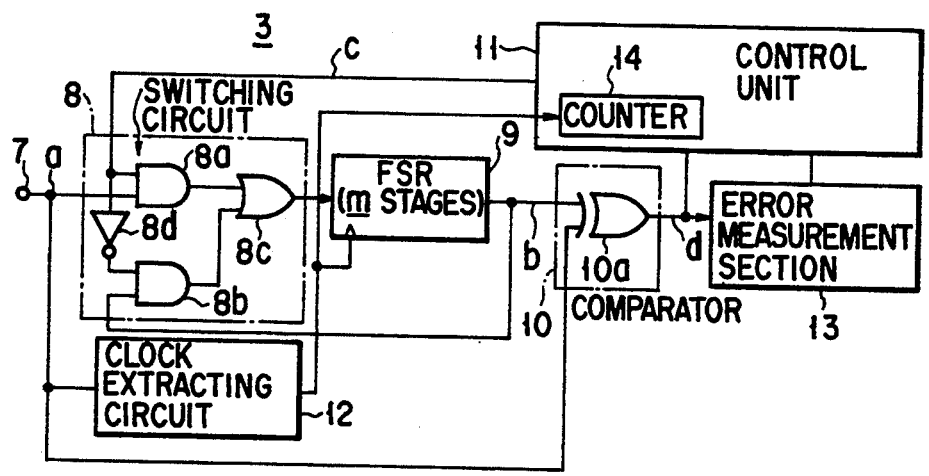
FIG. 52 is a block diagram showing the schematic arrangement of a conventional code error detection apparatus.
Figure 53:
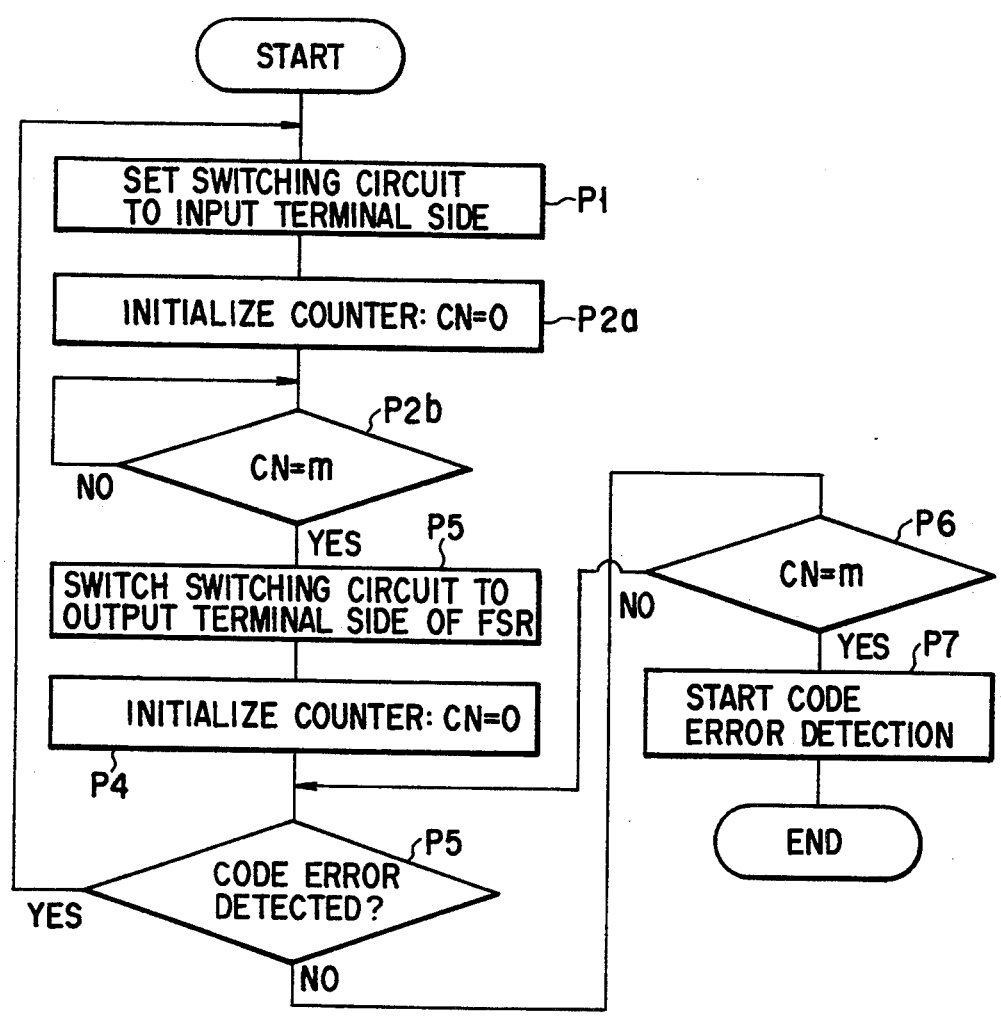
FIG. 53 is a flow chart showing an operation of the conventional apparatus.
Figure 54:
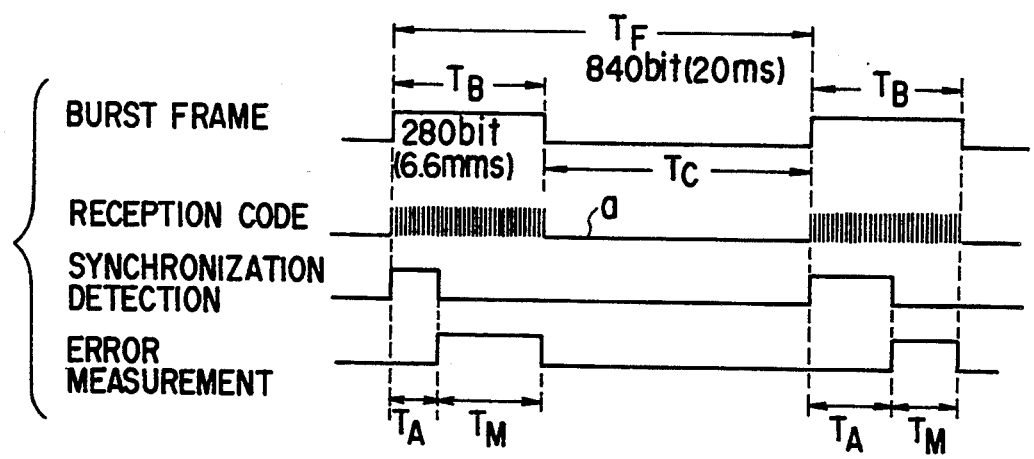
FIG. 54 is a timing chart showing an operation of the conventional apparatus.

FIG. 1B is a block diagram showing a schematic arrangement of the code error detection apparatus according to the first embodiment. The same reference numerals in FIG. 1B denote the same parts as those of the conventional code error detection apparatus as shown in FIG. 52.

Figure 3:
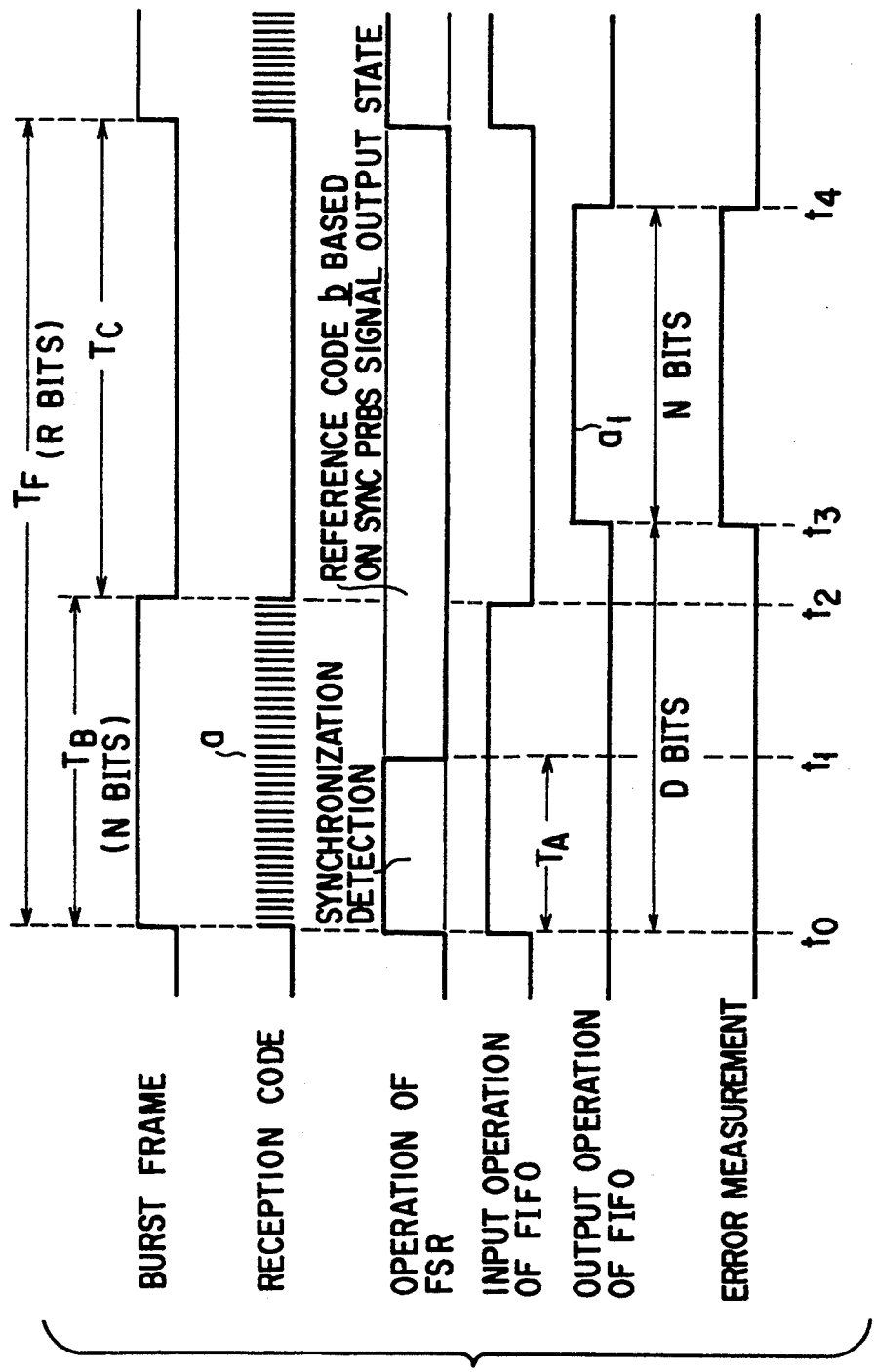
FIG. 3 is a timing chart showing an operation of the apparatus of the first embodiment.

Referring to FIG. 1B, a reception code a output from a target system 1 (see FIG. 49) and input to a measurement terminal 7 is incorporated in a burst frame having a time interval $T_B$ in a burst frame transmission scheme with an N-bit burst time interval $T_B$ and an idle time interval $T_C$, as shown in, e.g., FIG. 3. The reception code a is an M-sequence PRBS signal having a bit period $(2^m-1)$.

Figure 50:
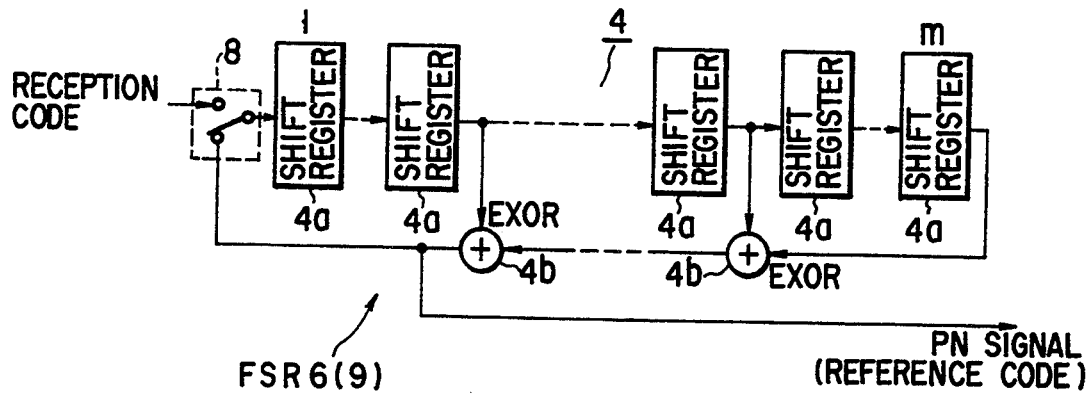
FIG. 50 is a block diagram showing the schematic arrangement of a general FSR.

The reception code a input through the measurement terminal 7 is supplied to a data terminal (input terminal) 9a of the first shift register in an FSR 9A consisting of series-connected m stage of shift registers and exclusive OR circuits (EXORs) shown in, e.g., FIG. 50, through one input terminal of a switching circuit 8 consisting of two AND gates 8a and 8b, an OR gate 8c, and an inverter 8d. A reference code b based on the PRBS signal output from an output terminal 9b of the FSR 9A is input to one input terminal of an EXOR gate 10a comprising a synchronization detection comparator 10. At the same time, the reference code b based on the PRBS signal output from FSR 9A is input to the other input terminal of the switching circuit 8. The switching circuit 8 is controlled by a switching signal c from a control section 15 constituted by a central processing unit (CPU) and the like.

Meanwhile, the reception code a input to the measurement terminal 7 is input to the switching circuit 8 and the other input terminal of the EXOR gate 10a of the comparator 10. A clock signal corresponding to the bit rate of the reception code i, reproduced from the reception code a by a clock extracting circuit 12, is supplied to the clock terminal of the FSR 9A. Furthermore, the reproduced clock signal is supplied to counters 16a and 16b in the control section 15. The respective counters 16a and 16b count the bits of the reception code a.

The comparator 10 compares each bit data of the reference code b based on the PRBS signal output from the FSR 9A with corresponding bit data of the reception code a. If they dot not coincide with each other, the comparator 10 outputs an incoincidence detection signal d to the control section 15. In addition, a burst gate signal $c_1$ indicating the start and end positions of the reception code a incorporated in a burst frame and input through the measurement terminal 7 is externally input to the control section 15.

The reception code a input through the measurement terminal 7 is also input to an FIFO (First-In First-Out) type shift register 18 consisting of series-connected D registers. The clock signal from the clock extracting circuit 12 is supplied to the clock terminal of the FIFO type shift register 18. Consequently, each bit of the reception code a input to the FIFO type shift register 18 is delayed by D bits.

Note that the number D specifying this delay amount is given by $$D = (2^m - 1)k$$

where k is a natural number satisfying $$(2^m - 1)(k - 1) < N \leq (2^m - 1)k$$

where N is the number of bits included in the burst time interval $T_B$, and $(2^m - 1)$ is the code length, i.e., the number of bits, of the M-sequence PRBS signal. That is, the delayed bit count D is set to be an integer multiple of the number of bits of the M-sequence PRBS signal.

A reception code $a_1$ obtained by delaying the reception code a by D bits using the FIFO type shift register 18 is input to one input terminal of an EXOR gate 19a of a bit error detection comparator 19. The reference code b based on the PRBS signal output from the FSR 9A is input to the other input terminal of the EXOR gate 19a. The comparator 19 compares each bit data of the reference code b based on the PRBS signal output from the FSR 9A with corresponding bit data of the delayed reception code $a_1$ output from the FIFO type shift register 18. If they do not coincide with each other, the comparator 19 outputs an incoincidence detection signal e to an error measurement section 20. The error measurement section 20 calculates a code error rate by counting the incoincidence detection signals e.

An operation of the control section 15 in the code error detection apparatus having such an arrangement will be described below with reference to the flow chart shown in FIG. 2.

The control section 15 waits until the burst gate signal $c_1$ is input (step S1). When the burst gate signal $c_1$ is input, the control section 15 determines that a burst frame is started, and resets a count value CNb of the counter 16b to "0" (step S2). The control section 15 then sets the switching signal c at high (H) level to switch the switching circuit 8 to the input terminal 7 side (step Q1). Upon initializing a count value CNa of the counter 16a to "0" (step Q2), the control section 15 waits until the count value CNa is incremented to a value m by clock signals (step Q3).

When the count value CNa becomes the value m, the control section 15 determines that consecutive m bit data of the reception code a are respectively set in the series-connected m shift registers constituting the FSR 9A through the switching circuit 8. Thereafter, the control section 15 changes the switching signal c to low (L) level to switch the switching circuit 8 to the output terminal side of the FSR 9A (step S3). At the same time, the control section 15 initializes the count value CNa of the counter 16a to "0" (step S4). The reference code b based on the PRBS signal output from the FSR 9A is input to the input terminal of the FSR 9A. The FSR 9A is set in a self-running state in which the reference code b based on the PRBS signal is kept output.

If the incoincidence detection signal d is input from the comparator 10 in step 94, the flow returns to step Q1 to switch the switching circuit 8 to the input terminal side so as to set m bit data of the reception code a in the FSR 9A.

If the incoincidence detection signal d is not input in step Q4, the control section 15 determines in step Q5 that the count value CNa of the counter 16a has not reached the value m. The flow than returns to step Q4 to check again whether the incoincidence detection signal d is input.

If it is determined in step Q5 that the count value CNa has reached the value m, it means that no incoincidence detection signal d is input throughout m consecutive bits. At this time, the control section 15 determines that the synchronization of the reference code b based on the PRBS signal output from the FSR 9A with respect to the reception code is established.

When the synchronization is established, the control section 15 waits in step Q6 until the count value CNb of the counter 16b reaches the value D while keeping the FSR 9A in the self-running state. If the count value CNb reaches the value d (CNb=D) in step Q6, the control section 15 determines that the start bit of the reception code a is output from the output terminal of the FIFO type shift register 18. In step Q7, the control section 15 outputs an error measurement command to the error measurement section 20 to perform bit error detection with respect to the reception code a. The error measurement section 20 calculates a code error rate by counting incoincidence detection signals subsequently output from the comparator 19 for a predetermined period of time.

An overall operation of the code error detection apparatus will be described next with reference to the timing chart shown in FIG. 3. When a burst frame starts at time $t_0$, the bits of the reception code a are sequentially input to the FSR 9A and the FIFO type shift register 18. When the synchronization between the reference code a based on the PRBS signal and the reception code a is established at time $t_1$, the FSR 9A is set in a self-running state while the synchronization is established.

At time $t_2$, the N-bit burst frame ends. When the FIFO type shift register 18 starts to output the delayed reception code $a_1$ at time $t_3$, the reception code $a_1$ is synchronized with the reference code b based on the PRBS signal output from the FSR 9A. The bits of the two codes $a_1$ and b are sequentially compared with each other by the comparator 19.

If incoincident bits are present, the incoincidence detection signals e are input to the error measurement section 20. The error measurement section 20 starts to count the incoincidence detection signals. When bit error count measurement with respect to N-bit data included in the reception code $a_1$ is completed at time $t_4$, the incoincidence detection signals are totaled to calculate a code error rate.

According to the code error detection apparatus having the above-described arrangement, the comparator 19 compares the reference code h based on the PRBS signal output from the FSR 9A upon establishment of synchronization with the reception code $a_1$ obtained by delaying the reception code a by an integer multiple of the period (D bits) using the FIFO type shift register 18, thereby detecting bit errors.

That is, even if there is a time interval $T_A$ required to establish the synchronization, bit error detection can be reliably performed in the time interval between the start bit of the reception code a and the last bit, i.e., the Nth bit of the reception code a.

The code error detection apparatus described above is especially effective for the burst frame transmission scheme having the N-bit burst time interval $T_B$ and the idle time interval $T_C$ shown in FIG. 3. If the repetition period of burst frames is represented by $T_F$(R bits), bit error measurement with respect to the reception code a repeatedly input at the period of $T_F$ can be continuously performed as long as a time interval [(N+D) bits] obtained by adding the delay time interval (D bits) of the FIFO type shift register 18 to the burst time interval $T_B$ (N bits) does not exceed the repetition period $T_F$(R bits) of a burst frame, as indicated by the following relation:

$$N+D \leq R$$

Assume that bit errors are to be detected in the reception code a incorporated in the above-mentioned burst frame (N=280) by using a reference code based on a PRBS signal output from an FSR consisting of 9 shift registers (m=9). In this case, the PRBS signal has a period of $(2^9-1)$ bits, and a delay of D bits=511 bits. Since the sum of time intervals (N+D=791) is shorter than the repetition period ($T_F$=840 bits) of the burst frame, error measurement with respect to all the bits of the burst frame can be continuously performed.

The present invention is not limited to the abovedescribed embodiment. In the apparatus of the above embodiment, the synchronization detection comparator 10 and the bit error detection comparator 19 are separately arranged. However, as shown in FIG. 4, a single comparator 10A having both the functions may be arranged in place of the two comparators.

In this case, a switching operation may be performed by a switch 10b controlled by a control signal f from a control section 15 in such a manner that a reception code a is supplied to the other input terminal of an EXOR gate 10a when synchronization is to be detected, and an output from an FIFO type shift register 18 is supplied to the other input of the EXOR gate 10a when bit error detection is to be performed.

In addition, as shown in FIG. 4, a clock extracting circuit 12 may be incorporated in the control section 15.

Figure 6:
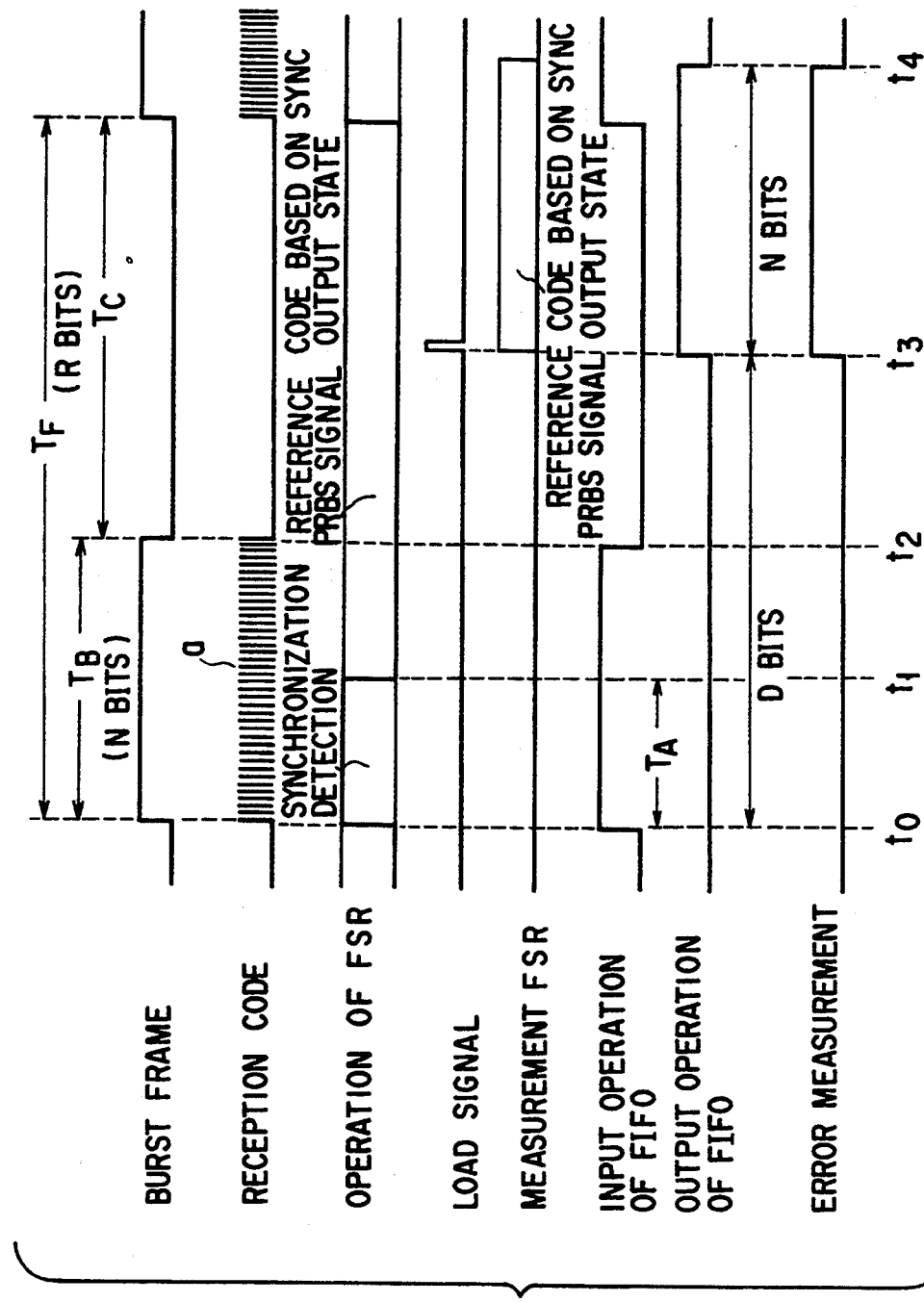
FIG. 6 is a timing chart showing an operation of the modification shown in FIG. 5.

FIG. 5 is a block diagram showing a modification of the code error detection apparatus of the first embodiment. FIG. 6 is a timing chart for explaining an operation of the modification. The same reference numerals in FIGS. 5 and 6 denote the same parts as in the first embodiment described above, and a detailed description thereof will be omitted.

This modification is designed to be free from the application limitation, i.e., $N+D \leq R$ of the first embodiment. That is, the modification can be applied to even a case of $N+D > R$.

For this purpose, the modification shown in FIG. 5 includes a measurement FSR 9A' for receiving each bit data from the above-mentioned FSR 9A. The measurement FSR 9A' has the same arrangement as that of the FSR 9A. The measurement FSR 9A' starts to output a measurement reference code based on a sync PRBS signal in response to a load signal output from a control section 15 at time $t_3$ in FIG. 6, and keeps supplying it to one input terminal of the comparator 19 until time $t_4$ instead of the reference code based on a sync PRBS signal and output from the FSR 9A. Meanwhile, a reception code a delayed by D bits is supplied from an FIFO type shift register 18 to the other input terminal of the comparator 19. If, therefore, a bit error is present, the comparator 19 detects it. As described above, the modified code error detection apparatus shown in FIG. 5 may be applied to the case of $N+D > R$.

Note that the reference code based on the sync PRBS signal and output from the FSR 9A may be supplied to the measurement FSR 9A' instead of each bit data from the FSR 9A. That is, the measurement FSR 9A' may fetch each bit data or reference data based on a sync PRBS signal, output from the FSR 9A, into the m registers to be set in a self-running state so as to output a measurement reference code based on the sync PRBS signal at a predetermined timing.

FIG. 1A shows a main part of the first embodiment described above, as shown in FIG. 1B. Referring to FIG. 1A, the code error detection apparatus includes an FSR 9, a switching unit 8, a synchronization detection comparator 10, a controller 15 including first and second control sections, a storage unit 18, and a code error detection comparator 19. The FSR 9 has input and output terminals 9a and 9b. The FSR 9 is switched between two states, i.e., a state in which the m consecutive bit data of an M-sequence reception code input from a measurement terminal 7 and having a period $(2^m-1)$ are set in m registers through the input terminal 9a, and a self-running state in which bit data output from the output terminal 9b are set in the m registers through the input terminal 9a. The switching unit 8 is arranged between the FSR 9 and the measurement terminal 7 to connect the input terminal 9a of the FSR 9 to the measurement terminal 7 or to the output terminal 9b of the FSR 9. The synchronization detection comparator 10 sequentially compares the bit data output from the output terminal 9b of the FSR 9 with the bit data of the reception code. The controller 15 controls the switching unit 10 in the following manner by the first and second control sections thereof. After the input terminal 9a of the FSR 9 is connected to the measurement terminal 7 to set the m consecutive bit data of the reception code in the FSR, a switching operation is performed to connect the input terminal 9a to the output terminal 9b of the FSR 9 to set the FSR 9 in a self-running state. In addition, in the self-running state of the FSR 9, if it is detected on the basis of a comparison result output from the synchronization detection comparator 10 that the m consecutive bit data from the output terminal 9b of the FSR 9 coincide with those of the reception code, the bit data output from the output terminal 9b of the FSR 9 set in the self-running state are determined to be a reference code. If it is detected that they do not coincide, the controller 15 controls the switching unit 8 to connect the input terminal 9a of the FSR 9 to the measurement terminal 7 to allow the FSR 9 to fetch the reception code. The storage unit 18 keeps storing consecutive bit data of the reception code in the time interval from the instant at which the m consecutive bit data of the reception code are set in the FSR 9 to at least the instant at which the bit data output from the output terminal 9b of the FSR 9 are determined to be the reference code by the controller 15, and outputs the bit data upon delaying them by a predetermined period of time. The bit error detection comparator 19 compares the delayed reception code output from the storage unit with the reference code.

Furthermore, in the above-described first embodiment, the reception code a is incorporated in the burst frame, as shown in FIG. 3. However, it is apparent that the present invention can be applied to a continuous reception code which is not incorporated in a burst frame.

As described above, according to the code error detection apparatus according to the first embodiment of the present invention, the bit data of a reception code are delayed by a storage unit such as an FIFO type shift register, and bit error detection with respect to the respective bits of the delayed reception code is performed upon establishment of synchronization. Therefore, bit error detection can be reliably performed with respect to each bit of the reception code input before the establishment of synchronization, and hence the bit error detection precision can be improved even with respect to a reception code having a short duration as in the burst frame transmission scheme.

An outline of a code error detection apparatus according to the second embodiment of the present invention will be described below.

It is a subject of the code error detection apparatus of this embodiment to reliably perform bit error detection even with respect to a start portion of a reception code input before a reference code based on a PRBS signal output from an FSR incorporated in the detection apparatus is synchronized with a reception code incorporated in a burst frame. For this object, the code error detection apparatus includes a measurement reference code generator comprising by a signal selection circuit, a gate circuit including an exclusive OR circuit, and a reverse FSR and designed to generate a reference code based on a delayed PRBS signal obtained by retroacting a reference code, based on a PRBS signal output from a forward FSR at the time of establishment of synchronization, from the time of input of a reception code on the basis of unit PRBS signals output from the respective registers of the forward FSR. In addition, the bit data of the reception code which are input before the reference code based on the PRBS signal is synchronized with the reception code are delayed by a variable-length FIFO type shift register, and bit error detection with respect to each bit data of the reception code is performed by using the reference code based on the delayed PRBS signal corresponding to the reception code at the time of input and output from the gate circuit upon establishment of the synchronization.

In order to achieve the above subject, according to the second embodiment of the present invention, the code error detection apparatus is designed as follows. After m consecutive bit data of an M-sequence reception code having a period ($2^m - 1$) and incorporated in a burst frame are respectively set in the m registers of the forward FSR through a switching circuit, the switching circuit is operated to connect the input and output terminals of the forward FSR to each other to set the forward FSR in a self-running state. Thereafter, each bit data of a reference code based on a PRBS signal output from the forward FSR is compared with corresponding bit data of the reception code. If the m consecutive bits of the reference code coincide with those of the reception code, it is determined that the synchronization between the reference code based on the PRBS signal and the reception code is established. Subsequently, bit errors in the reception code are detected. In addition, the code error detection apparatus includes a variable-length FIFO type shift register, a signal selection circuit, an exclusive OR circuit, a reverse FSR, and a comparator. The variable-length FIFO type shift register sequentially stores the bit data of a reception code, and sequentially outputs the stored bit data upon establishment of synchronization. The signal selection circuit is inserted in the output path of unit PRBS signals respectively output from the m registers of the forward FSR. The exclusive OR circuit calculates the exclusive OR of the unit PRBS signals selected by the signal selection circuit to output the reference code based on a delayed PRBS signal obtained by delaying the reference code, based on the PRBS signal output from the forward FSR, by the number of bits corresponding to the time interval between the instant at which the reception code is input and the instant at which the synchronization is established. The reverse FSR consists of m stage of shift registers. The initial values determined by the number of registers comprising the reverse FSR are respectively set in the m stage of shift registers. The reverse FSR is operated only in the time interval from the start of input of the reception code to the establishment of synchronization, and outputs the value of each register in an idle state, as a selection signal with respect to each unit PRBS signal, to the signal selection circuit. The comparator compares each bit data of the reference code based on the delayed PRBS signal and output from the exclusive OR circuit upon establishment of the synchronization with corresponding bit data of the reception code delayed by the FIFO type shift register. If an incoincidence is detected between the bit data, the comparator outputs an incoincidence detection signal. The signal selection circuit and the exclusive OR circuit constitute a gate circuit. This gate circuit and the reverse FSR constitute a measurement reference code generating means.

A modification of the code error detection apparatus according to the second embodiment of the present invention includes two pairs of FIFO type shift registers and comparators, each pair identical to those in the code error detection apparatus of the second embodiment, a pair of auxiliary FSRs for alternately fetching and outputting the respective bit data of a reference code, based on a delayed PRBS signal and output from an exclusive OR circuit upon establishment of synchronization, in units of burst frames, and a pair of comparators. In addition, the modification is designed such that these components are alternately switched to be used in units of burst frames.

In another modification of the code error detection apparatus according to the second embodiment of the present invention, a fixed-length shift register delays bit data by one frame in place of the variable-length FIFO type shift register in the code error detection apparatus of the second embodiment. In addition, the modification includes a pair of shift registers and one auxiliary FSR. The shift registers alternately fetch the m bit data of the reference code based on a delayed PRBS signal output from an exclusive OR circuit upon establishment of synchronization in units of burst frames, respectively, and are stopped. The auxiliary FSR alternately fetches the bit data of the respective shift registers into its own registers in units of burst frames delayed by one period, and outputs the reference code based on the delayed PRBS signal. According to the modification, the above-mentioned comparator is used to compare each bit data of the reference code based on the delayed PRBS signal and output from the auxiliary FSR with corresponding bit data of the reception code delayed by the FIFO type shift register. When they do not coincide with each other, the comparator outputs an incoincidence detection signal.

Figure 51:
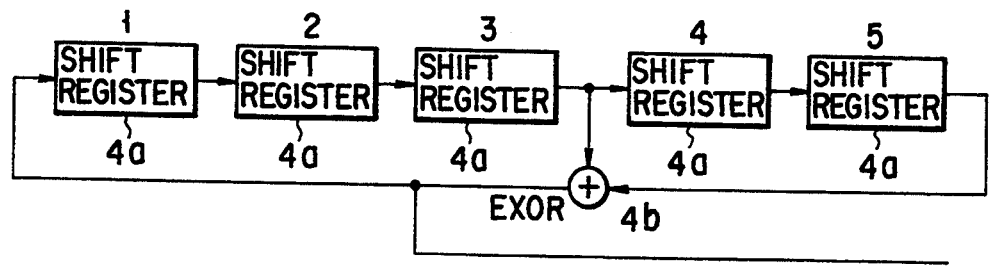
FIG. 51 is a block diagram showing an FSR consisting of five shift registers.

The relationship between the forward FSR and the reverse FSR will be described first. The forward FSR serves to output a PRBS signal having the same sequence and period $(2^m - 1)$ as those of a PRBS signal of an input reception code incorporated in a burst frame, i.e., a forward PRBS signal. In contrast to this, the reverse FSR serves to output a PRBS signal having the same period $(2^m - 1)$ as that of a forward PRBS signal but is of a reverse sequence, i.e., a reverse PRBS signal. More specifically, if the FSR shown in FIG. 13A equivalent to that of FIG. 51 is a forward FSR, the FSR shown in FIG. 13B is a reverse FSR. In a set of forward and reverse FSRs, the connecting positions of EXOR gates are symmetrical.

It will be described below why a reference code based on has a PRBS signal a required number of bits, corresponding to the time interval from the input of a reception code and the establishment of synchronization, before the PRBS signal output from the forward FSR, i.e., a delayed PRBS signal retroactive from the time of input of the reception code, can be generated by using the signal selection circuit, the exclusive OR circuit, and the reverse FSR.

Figure 12:
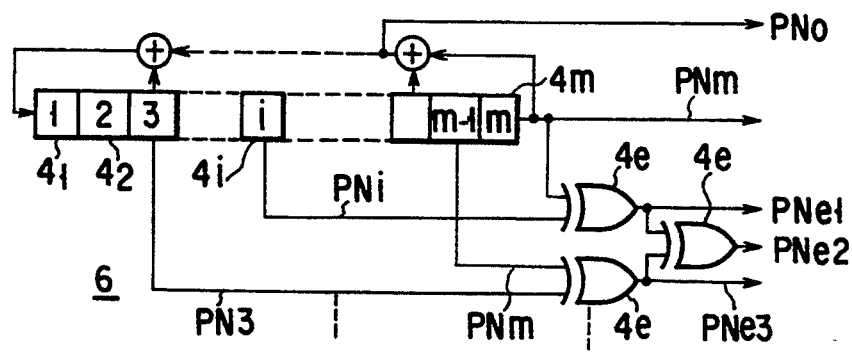
FIG. 12 is a block diagram showing the relationship between the respective unit PRBS signals output from a forward FSR and EXOR gates so as to explain the operation principle of the present invention.

In general, as shown in FIG. 12, according to an FSR 6 consisting of m registers $4_1, 4_2, 4_3, \ldots, 4_m$, an output signal from one EXOR gate is regarded as a PRBS signal PRBS0. However, signals obtained from the respective registers are also PRBS signals. If the PRBS signals obtained from the respective registers are referred to as unit PRBS signals, a unit PRBS signal PRBSi obtained from an arbitrary register $4_i$ is a unit PRBS signal one bit after a unit PRBS signal PRBSi-1 obtained from an immediately preceding register $4_{i-1}$. That is, unit PRBS signals PRBS1, PRBS2, PRBS3, . . ., PRBSm−1 respectively output from the registers $4_1, 4_2, 4_3, \ldots, 4_{m-1}$ are unit PRBS signals having the same bit period $(2^m - 1)$ and the same bit pattern but having different bit phases.

In addition, as shown in FIG. 12, PRBS signals PRBSe1, PRBSe2, PRBSe3, . . . , obtained by mixing the respective unit PRBS signals through EXOR gates 4e become PRBS signals respectively shifted in phase from the PRBS signal PRBS0 by predetermined numbers of bits. If the PRBS signals PRBS1, PRBS2, PRBS3, . . . , PRBSm respectively output from the registers $4_1, 4_2, 4_3, \ldots, 4_m$ are directly processed or processed through one or a plurality of EXOR gates 4e in this manner, PRBS signals whose bit phases are shifted by various numbers of bits can be generated. That is, $(2^m - 1)$ PRBS signals having different bit phases can be obtained.

In contrast to this, when PRBS signals whose bit phases are different from each other by an arbitrary number of bits, i.e., a required bit count n corresponding to the time interval between the instant at which input of a reception code is started and the instant at which the synchronization with respect to the reception code is established, are to be obtained, specific unit PRBS signals from specific registers to be used and a specific number of EXOR gate 4e to be used are uniquely determined. Therefore, if the unit PRBS signals from required shift registers are selected by the signal selection circuit and are processed by the exclusive OR circuit, a reference code based on a PRBS signal an n-bit phase before a PRBS signal from the forward FSR, i.e., a delayed PRBS signal retroactive from the time of input of a reception code, can be obtained.

In the second embodiment, in order to obtain a PRBS signal n bits before a PRBS signal output from the forward FSR, specific unit PRBS signals of the m unit PRBS signals output from the forward FSR can be selected by using the reverse FSR. The reason for this will be described next with reference to forward and reverse FSRs, each consisting of five registers (m=5).

Figure 13A:
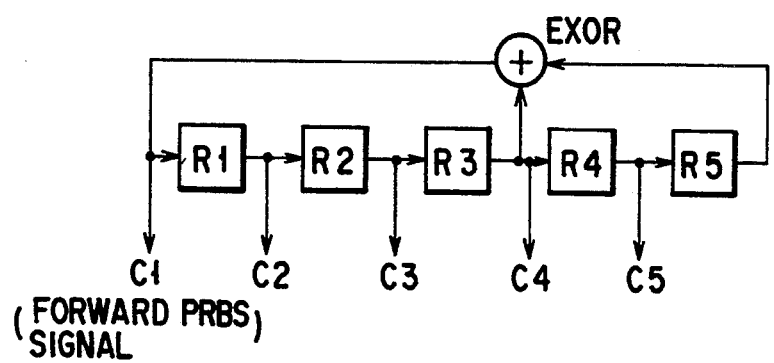
FIGS. 13A and 13B are block diagrams showing the schematic arrangement of the forward and reverse FSRs so as to explain the operation principle of the present invention.
Figures 13B, 14:
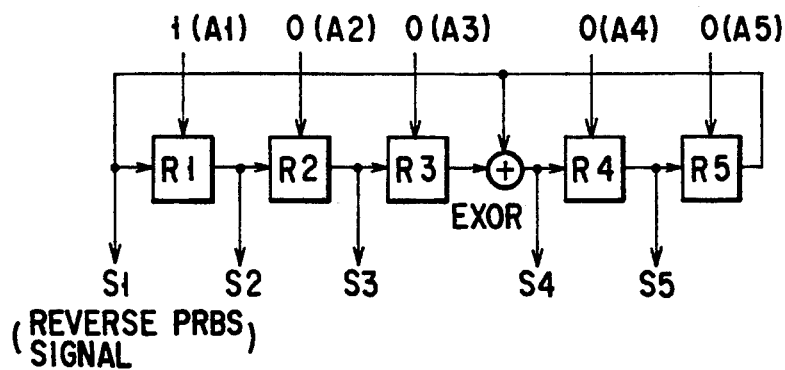
FIG. 14 is a view showing bit data values at the respective clock numbers in the forward FSR in FIG. 13A.

FIGS. 13A and 13B respectively show the forward and reverse FSRs. Assume that unit PRBS signals respectively output from registers $R_1, R_2, R_3, R_4$, and $R_5$ of the forward and reverse FSRs are denoted by reference symbols $C_1, C_2, \ldots, C_5$ and $S_1, S_2, \ldots, S_5$, respectively. Initial values $A_1, A_2, A_3, A_4$, and $A_5$ can be respectively set in the registers $R_1, R_2, R_3, R_4$, and $R_5$ of the reverse FSR. More specifically, initial values 1, 0, 0, 0, and 0 are set.

Since the PRBS signal output from the forward FSR changes at a period of $(2^5 - 1) = 31$, the values of the unit PRBS signals respectively output from the registers $R_1$ to $R_5$ at all the clock periods from number 0 to number 30 change in the manner shown in FIG. 14.

Similarly, since initial values 1, 0, 0, 0, and 0 are respectively set in the registers $R_1$ to $R_5$ of the reverse FSR, the values of the unit PRBS signals respectively output from the registers $R_1$ to $R_5$ at all the clock periods from number 0 to number 30 change in the manner shown in FIG. 15.

Consider now an output pattern "01000" consisting of arbitrary five (=m) signal values, which pattern includes no identical pattern value within one period of a PRBS signal (unit PRBS signal $C_1$) output from the forward FSR. This output pattern exists in the interval from clock number 12 to clock number 16 in FIG. 14.

In addition, consider that an output pattern 7 bits before the output pattern "01000", i.e., an output pattern "10111" existing in the interval from clock number 5 to clock number 9, is reproduced at the time corresponding to clock number 12.

A pattern "10110" of the values of the unit PRBS signals $S_1$ to $S_5$ from the respective registers of the reverse FSR is obtained at clock number 7 in FIG. 15. In the signal selection circuit, the values of the pattern "10110" serve to select the signal values of the unit PRBS signals $C_1$ to $C_5$ from the forward FSR, respectively. Therefore, the PRBS signals $C_1, C_3$, and $C_4$ in the table shown in FIG. 14 are selected.

In the table shown in FIG. 14, the output patterns of the unit PRBS signals $C_1, C_3$, and $C_4$ existing in the interval from clock number 12 to clock number 16 are:
$C_1 = 01000$
$C_3 = 01010$
$C_4 = 10101$ If the exclusive OR of the signal values at each clock number is calculated by the exclusive OR circuit, "10111" is obtained, thus obtaining the output pattern enclosed with the broken lines in FIG. 14 and located 7 bits before the output pattern "01000".

If, therefore, the operation of the reverse FSR is stopped at the seventh bit from the start of the operation, an output pattern 7 bits before the PRBS signal output from the forward FSR can be continuously output, as a delayed PRBS signal, from the exclusive OR circuit.

Consequently, if the reverse FSR is started in synchronism with the input of a reception code and is stopped at the time when the reference code based on the PRBS signal output from the forward FSR is synchronized with the reception code, a reference code based on a PRBS signal delayed by the number of bits required to establish the synchronization, i.e., a delayed PRBS signal corresponding to the time of input of the reception code, can be obtained.

Although the initial values for the reverse FSR consisting of five registers are those of a pattern "10000", initial values satisfying the above-described condition are uniquely determined by the number of resisters constituting a reverse FSR. Therefore, initial values "$A_1, \ldots, A_m$" for a reverse FSR consisting of m registers are uniquely determined.

In the code error detection apparatus having the signal selection circuit, the exclusive OR circuit, and the reverse FSR, which have the above-described functions, the bit data of an input reception code are sequentially stored in the registers of the forward FSR through the switching circuit and in the registers of the variable-length FIFO (First-In First-Out) type shift register. The reference code based on the PRBS signal output from the forward FSR is synchronized with the reception code at the time corresponding to the nth bit from the start of the input of the reception code. When the synchronization is established, outputting of the bit data of the reception code respectively stored in the registers of the variable-length FIFO type shift register is started. That is, the reception code is delayed by n bits.

In addition, when the synchronization is established, the exclusive OR circuit outputs the reference code based on the delayed PRBS signal n bits before the PRBS signal from the forward FSR, the value of n being set in advance by the signal selection circuit and the reverse FSR. As a result, the reference code based on the delayed PRBS signal and output from the exclusive OR circuit upon establishment of the synchronization is synchronized with the reception code output from the FIFO type shift register.

By, therefore, comparison between each bit data of the delayed reception code and corresponding bit data of the reference code based on the delayed PRBS signal and generated by the signal selection circuit, the reverse FSR, and the exclusive OR circuit upon establishment of the synchronization is started from the time when the start bit data of the reception code is output from the FIFO type shift register, bit error detection with respect to the reception code input before the establishment of synchronization is performed.

In one modification of the code error detection apparatus according to the second embodiment of the present invention, the bit data of a reference code based on a delayed PRBS signal and output from the exclusive OR circuit are alternately input to auxiliary FSRs, each consisting of m registers and having the same arrangement as the of the above-described synchronization detection forward FSR, in units of burst frames. Delayed PRBS signals are respectively output from the auxiliary FSRs to be compared with reception codes respectively output from FIFO type shift registers for alternately delaying the reception codes by n bits in units of burst frames, thereby detecting bit errors.

The respective FSRs alternately fetch data from the exclusive OR circuit in units of burst frames so as to be set in a self-running state. Therefore, even if the idle time interval $T_C$ is shorter than the burst time interval $T_B$, bit error detection can always be performed with respect to one-burst-frame bit data of a reception code.

In another modification of the code error detection apparatus according to the second embodiment of the present invention, the data of a reference code based on a delayed PRBS signal and output from the exclusive OR circuit are alternately stored in shift registers in units of burst frames and are alternately set in auxiliary FSRs in units of burst frames delayed by one period, thereby outputting a reference code based on the delayed PRBS signal. In addition, the reference code based on the delayed PRBS signal delayed by one burst frame is compared with the reception code delayed by one burst frame by a fixed-length FIFO type shift register.

The second embodiment of the present invention will be described below with reference to the accompanying drawings.

FIG. 7 is a block diagram showing the schematic arrangement of the code error detection apparatus according to the second embodiment of the present invention. The same reference numerals in FIG. 7 denote the same parts as in the conventional code error detection apparatus as shown in FIG. 52.

A reception code a output from a target system 1 (see FIG. 49) shown in FIG. 7 to a measurement terminal 7 is incorporated in a burst frame having a time interval $T_F$ in a burst frame transmission scheme having an N-bit burst time interval $T_B$ and an idle time interval $T_C$, as shown in FIG. 17. The reception code a is an M-sequence PRBS signal having a bit period ($2^m - 1$).

The reception code a input through the measurement terminal 7 is supplied to the data terminal of a start register 4a in a forward FSR 9 consisting of series-connected m stage of shift registers, as shown in FIG. 50 and exclusive OR circuits through one input terminal of a switching circuit 8 comprising by two AND gates 8a and 8b, an OR gate 8c, and an inverter 8d. A reference code b based on the PRBS signal output from the output terminal of the forward FSR 9A is input to one input terminal of an EXOR gate 10a constituting a synchronization detection comparator 10. In addition, the reference code b based on the PRBS signal output from the forward FSR 9A is input to the other input terminal of the switching circuit 8. The switching circuit 8 is controlled by a switching signal c from a control section 15 including a central processing unit (CPU) and the like.

Meanwhile, the reception signal a input to the measurement terminal 7 is input to the switching circuit 8 and to the other input terminal of the EXOR gate 10a of the comparator 10. The comparator 10 compares each bit data of the reference code b based on the PRBS signal output from the forward FSR 9A with corresponding bit data of the reception code a. If they do not coincide with each other, the comparator 10 outputs an incoincidence detection signal d to the control section 15. In addition, a burst gate signal $c_1$ indicating the start and end positions of the reception code a incorporated in the burst frame and input from the measurement terminal 7 is externally input to the control section 15 and a variable-length FIFO type shift register 18A.

The clock terminal of the forward FSR 9A receives a clock signal h corresponding to the bit rate of the reception code a, which is reproduced from the reception code a by a clock extracting circuit 12. The reproduced clock signal h is supplied to counters 16a and 16b in the control section 15. Consequently, the counters 16a and 16b count the bits of the reception code a. In addition, the reproduced clock signal h is input to a reverse FSR 9B through the variable-length FIFO type shift register 18A and an AND gate 27.

Figure 11:
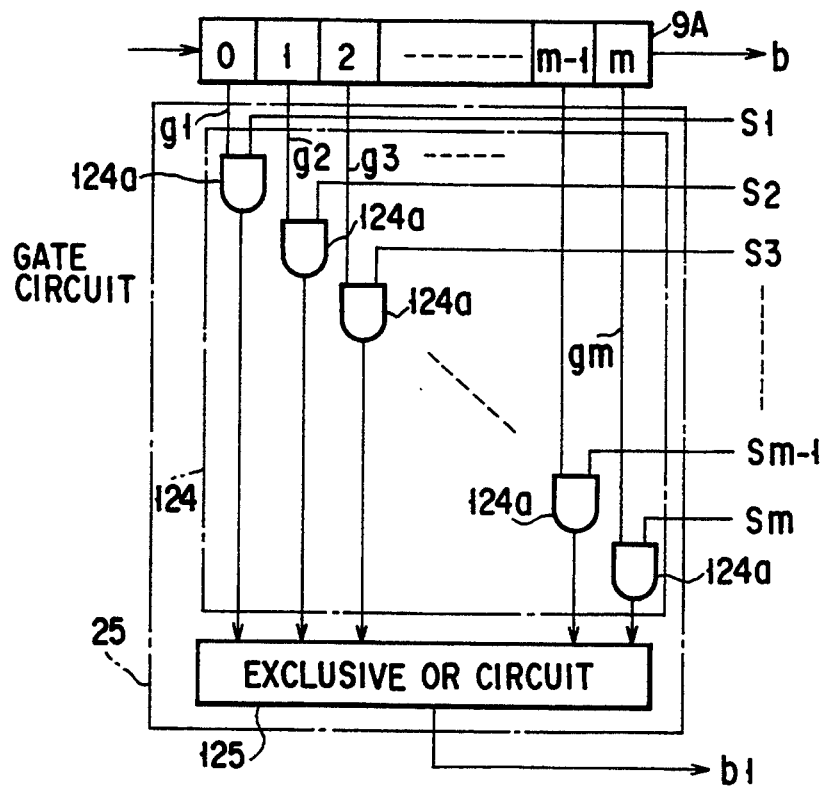
FIG. 11 is a block diagram showing the detailed arrangement of a gate circuit in the apparatus of the second embodiment.

Unit PRBS signals $g_1, g_2, \ldots, g_m$ respectively output from the m registers of the forward FSR 9A are input to a gate circuit 25. As shown in FIG. 11, the gate circuit 25 is comprises by a signal selection circuit 124 and an exclusive OR circuit 125. Each of the unit PRBS signals $g_1, g_2, \ldots, g_m$ output from the respective registers is input to the exclusive OR circuit 125 through one input terminal of a corresponding one of AND gates 124a in the signal selection circuit 124.

Figure 8:
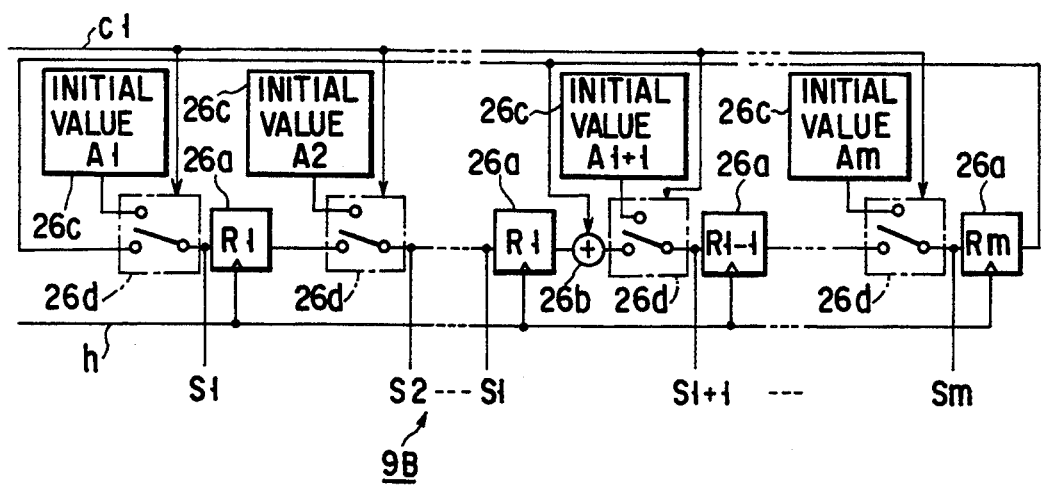
FIG. 8 is a block diagram showing the arrangement of a reverse FSR in the apparatus of the second embodiment.

Each of selection signals $S_1, S_2, S_3, \ldots, S_{m-1}$, and $S_m$ from the reverse FSR 9B consisting of m registers is input to the other input terminal of a corresponding one of the AND gates 124a. As shown in FIG. 8, the reverse FSR 9B is comprises by m shift registers 26a, one or more EXOR gates 26b inserted between the respective registers, m initial value memories 26c for respectively storing initial values $A_1, A_2, \ldots, A_m$ to be supplied to the registers 26a, and m switches 26d for respectively setting the initial values stored in the initial value memories 26c in the registers 26a in response to the burst gate signal $c_1$.

As described above, the initial values $A_1$ to $A_m$ are predetermined values uniquely determined by the value m.

The reverse FSR 9B is operated in response to the reproduced clock signal h. When the burst gate signal $c_1$ is input to the reverse FSR 9B, the initial values are respectively set in the registers 26a. When an H-level synchronization establishment signal f is output from the control section 15, the clock signal h is cut off by an AND gate 27 to stop the operation of the reverse FSR 9B. The data stored in the registers 26a in an idle state are the above-mentioned selection signals $S_1, S_2, S_3, \ldots, S_{m-1}$, and $S_m$, respectively.

The exclusive OR circuit 125 incorporates a large number of EXOR gates for generating a reference code $b_1$ based on one delayed signal by calculating the exclusive OR of selected unit PRBS signals.

The gate circuit 25, therefore, outputs the reference code $b_1$ based on the delayed PRBS signal which is delayed from the reference code b based on the PRBS signal output from the forward FSR 9A by the bit count n required in the time interval between the input of the burst gate signal $c_1$ and the input of the synchronization establishment signal f, i.e., between the instant at which the reception code a is input and the instant at which the synchronization is established.

Figure 9:
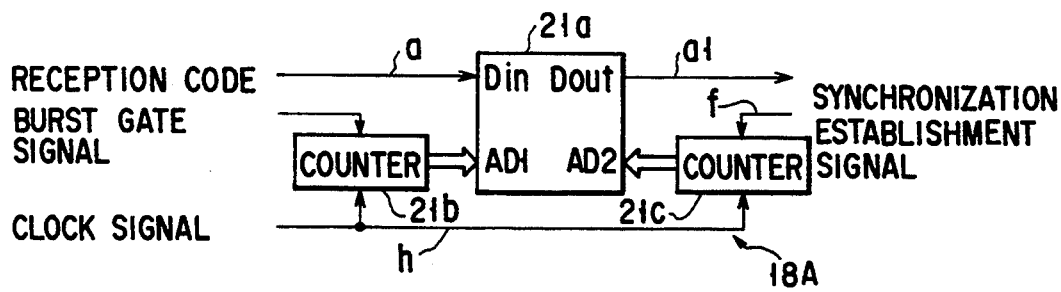
FIG. 9 is a block diagram showing the arrangement of an FIFO type shift register in the apparatus of the second embodiment.

The reception code a input through the input terminal 7 is input to the variable-length FIFO type shift register 18A. For example, as shown in FIG. 9, the variable-length FIFO type shift register 18A is comprises a dual port random access memory (RAM) 21a, a counter 21b for designating a write address $AD_1$ of the RAM 21a, and a counter 21c for designating a read address $AD_2$ of the RAM 21a.

Figure 10:
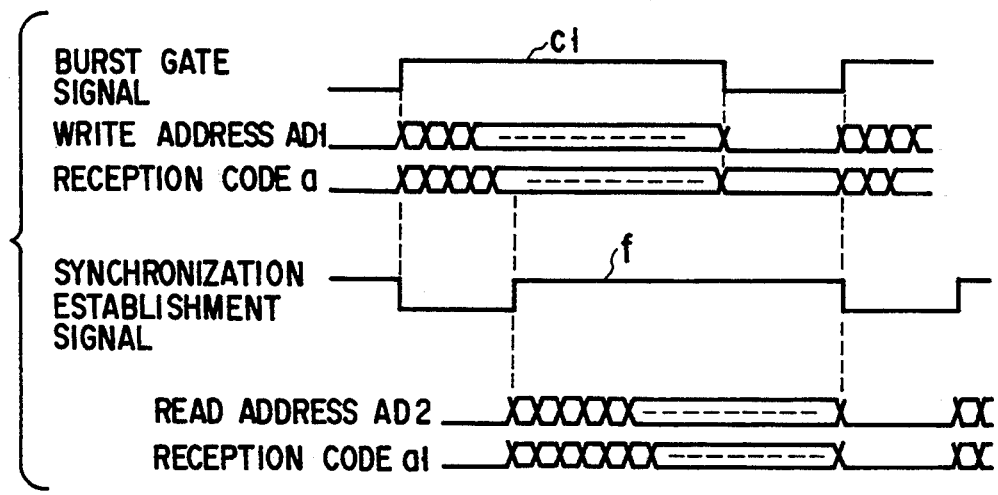
FIG. 10 is a timing chart showing an operation of the FIFO type shift register.

As shown in FIG. 10, when the burst gate signal $c_1$ rises, the counter 21b counts the clocks of the clock signal h to increment the write address $AD_1$ so that the respective bit data of the reception code a are sequentially stored at designated addresses through an input terminal Din of the RAM 21a. When the synchronization establishment signal f rises, the counter 21c increments the read address $AD_2$ so that the previously stored bit data are output, as a reception code $a_1$ delayed from the reception code a by n bits, from an output terminal Dout of the RAM 21a. That is, each bit data of the reception code a input to the FIFO type shift register 18A is delayed by n bits.

The reception code $a_1$ delayed by the FIFO type shift register 18A by n bits is input to one input terminal of an EXOR gate 19a of a bit error detection comparator 19. The other input terminal of the EXOR gate 19a receives the reference code $b_1$ based on the delayed PRBS signal output from the gate circuit 25. The comparator 19 compares each bit data of the reference code $b_1$ based on the delayed PRBS signal with corresponding bit data of the reception code $a_1$ delayed by n bits. If they do not coincide with each other, the comparator 19 outputs an incoincidence detection signal e to an error measurement section 20. The error measurement section 20 counts incoincidence detection signals input thereto to calculate, e.g., a code error rate.

Figure 16:
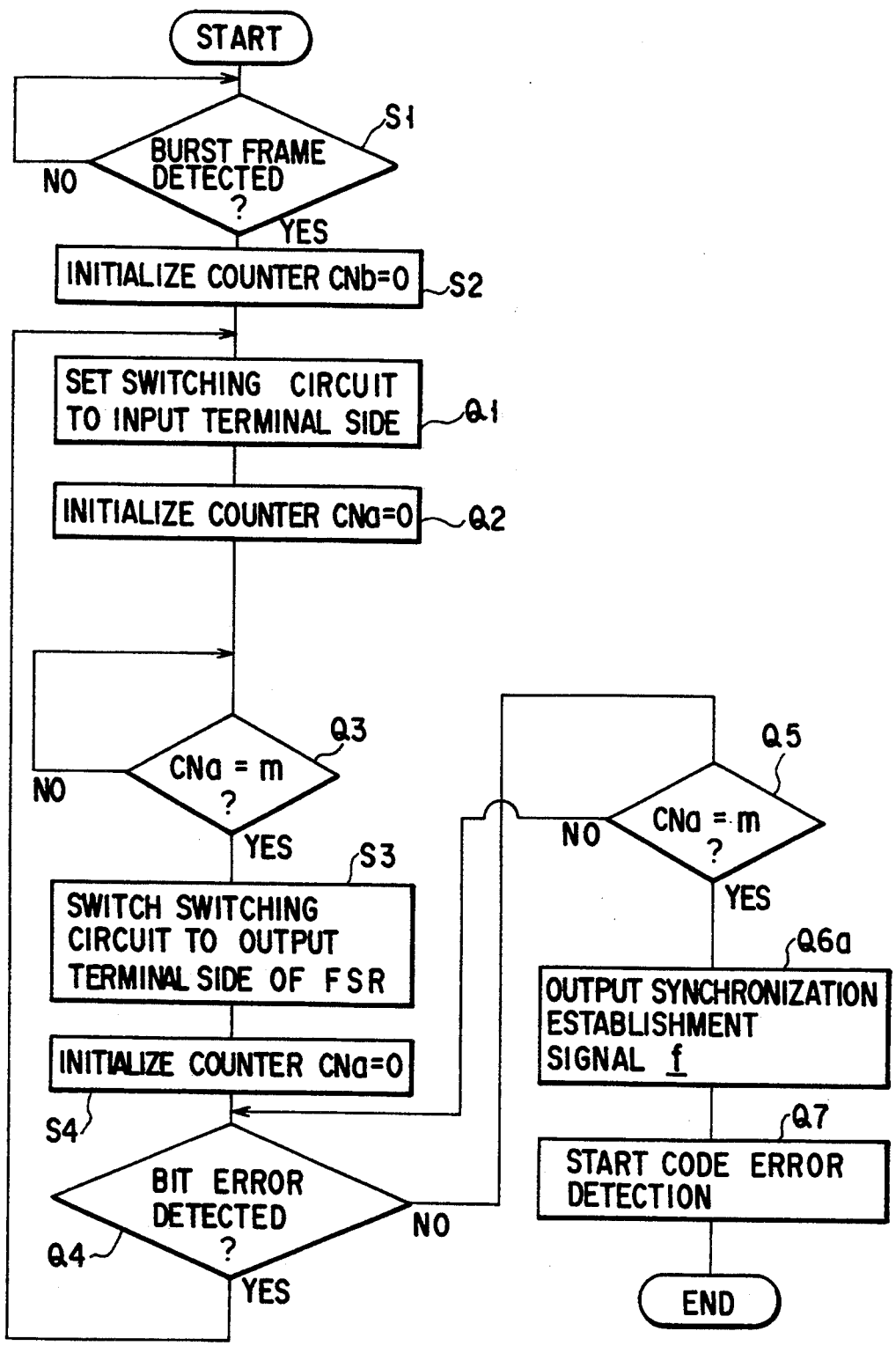
FIG. 16 is a flow chart showing an operation of the apparatus of the second embodiment.

An operation of the control section 15 in the code error detection apparatus having such an arrangement will be described below with reference to the flow chart shown in FIG. 16.

When the flow starts and the burst gate signal $c_1$ is input, the control section 15 determines that a burst frame has started, and resets a count value CNb of the counter 16b to "0" (steps S1 and S2). The control section 15 then sets the switching signal c at high (H) level to set the switching circuit 8 to the input terminal 7 side (step Q1). After the control section 15 initializes a count value CNa of the counter 16a to "0" (step Q2), the count value CNa is incremented by the clock signal h, and the control section 15 waits until the count value CNa becomes the value m (step Q3).

When the count value CNa becomes the value m, the control section 15 determines that the m consecutive bit data of the reception code a are respectively set in the series-connected m shift registers comprising the forward FSR 9A through the switching circuit 8. Thereafter, the control section 15 changes the switching signal c to low (L) level to switch the switching circuit 8 to the output terminal side of the forward FSR 9A (step S3). At the same time, the control section 15 initializes the count value CNa of the counter 16a to "0" (step S4). Consequently, the reference code b based on the PRBS signal output from the forward FSR 9A is input to the input terminal of the forward FSR 9A. The forward FSR 9A is then set in a self-running state in which the reference code b based on the PRBS signal is continuously output.

If the incoincidence detection signal d indicating the detection of a bit error is input from the comparator 10 in step Q4, the flow returns to step Q1, so that the control section 15 switches the switching circuit 8 to the input terminal side again to set the m bit data of the reception code a in the forward FSR 9A.

If it is determined in step Q4 that no incoincidence detection signal d is input, the control section 15 determines in step Q5 that the count value CNa does not reach the value m, and the flow subsequently returns to step Q4 to check again whether the incoincidence detection signal d is input.

If it is determined in step Q5 that the count value CNa has reached the value m, since no incoincidence detection signal d is input throughout the m consecutive bits, the control section 15 determines that the synchronization between the reference code b based on the PRBS signal output from the forward FSR 9A and the reception code a is established. In step Q6, the control section 15 sends the H-level synchronization establishment signal f to the AND gate 27 and the FIFO type shift register 18A.

When the synchronization is established, the forward FSR 9A is set in a self-running state. In addition, sine the operation of the reverse FSR 9B is stopped in synchronism with the output of the synchronization establishment signal f, the reference code $b_1$ based on the delayed PRBS signal subsequently output from the gate circuit 25 is always delayed from the reference code b based on the PRBS signal output from the forward FSR 9A by the bit count n required until the synchronization between the reception code a and the reference code is established.

In addition, when the synchronization establishment signal f is output, the reception code $a_1$ delayed by n bits is output from the output terminal Dout of the FIFO type shift register 18A. Therefore, the reception code $a_1$ output from the FIFO type shift register 18A is synchronized with the reference code $b_1$ based on the delayed PRBS signal output from the gate circuit 25. In step Q7, the control section 15 outputs an error measurement command to the error measurement section 20 to perform code error detection with respect to the reception code $a_1$. The error measurement section 20 counts incoincidence detection signals output from the comparator 19 for a predetermined period of time to calculate a code error rate.

An overall operation of the code error detection apparatus of the embodiment will be described below with reference to the timing chart shown in FIG. 17. When a burst frame starts at time $t_0$, the bit data of the reception code a are sequentially input to the forward FSR 9A and the FIFO type shift register 18A. When the synchronization between the reference code b based on the PRBS signal and the reception code a is established at time $t_1$ by which an n-bit time interval has elapsed since the input of the reception code a was started, the forward FSR 9A is set in a self-running state while the synchronization is established. At the same time, the operation of the reverse FSR 9B is stopped.

Consequently, the gate circuit 25 is also set in a self-running state in response to the reference code $b_1$ based on the delayed PRBS signal located n bits before the reference code b. When the synchronization is established at time $t_1$, the FIFO type shift register 18A starts to output the reception code $a_1$ delayed by n bits. This delayed reception code $a_1$ is synchronized with the reference code $b_1$ based on the delayed PRBS signal output from the gate circuit 25. The comparator 19 sequentially compares the delayed reception code $a_1$ with the reference code $b_1$ based on the delayed PRBS signal in units of bit data.

If incoincident bits are present, the incoincidence detection signal e is input to the error measurement section 20. The error measurement section 20 starts to count incoincidence detection signals. When the counting of incoincidence detection signals with respect to the N-bit bit data contained in the delayed reception code $a_1$ is completed at time $t_3$, the error measurement section 20 totals the incoincidence detection signals to calculate a code error rate.

In the code error detection apparatus having the above-described arrangement, the comparator 19 compares the reference code $b_1$ based on the delayed PRBS signal output from the gate circuit 25 upon establishment of synchronization with the reception code $a_1$ delayed by the FIFO type shift register 18 by n bits, thus detecting bit errors.

That is, even if a time interval $T_A$ is present before the establishment of synchronization, bit error detection can be reliably performed with respect to the bit data of the reception code a from the start bit data to the Nth bit data, i.e., the last bit data. Therefore, the overall detection precision of the code error detection apparatus can be improved. Especially, since code error detection can be started immediately after the synchronization between the reference code b based on the PRBS signal and the incoincidence a is established, as shown in FIG. 17, even if the idle time interval $T_C$ of a burst frame is relatively short, the probability that end time $t_3$ of the code error detection processing enters the next burst frame can be reduced.

In addition, since the reference code $b_1$ based on the delayed PRBS signal, located n bits before the reference code b, is generated by using the signal selection circuit 124, the exclusive OR circuit 125, and the reverse FSR 9B, the required electronic circuit components can be reduced in size, and no large-capacity storage unit is required. Therefore, the manufacturing cost of the apparatus is not greatly increased as compared with the conventional apparatus.

Figure 18:
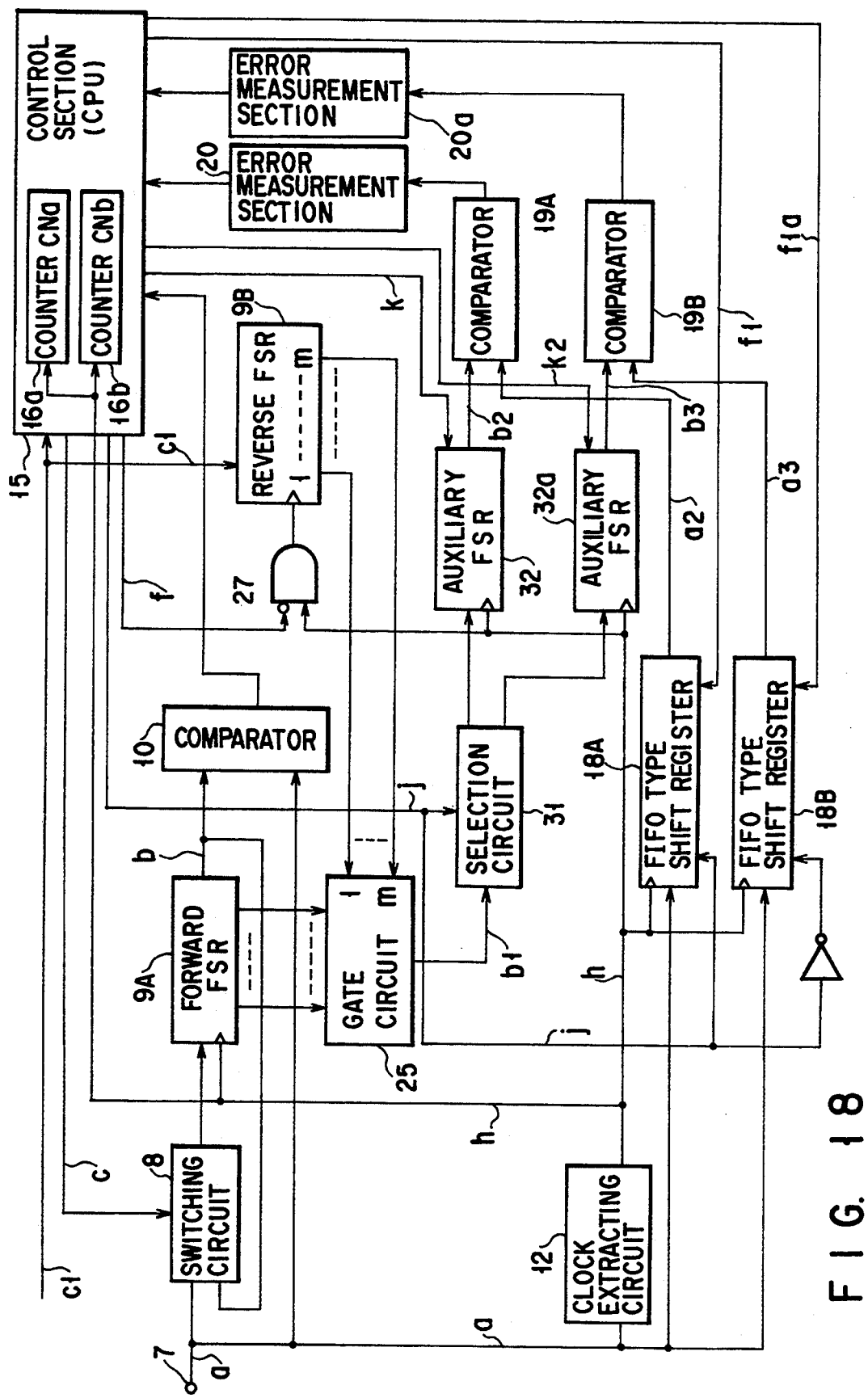
FIG. 18 is a block diagram showing the schematic arrangement of a modification of the code error detection apparatus according to the second embodiment of the present invention.

FIG. 18 is a block diagram showing the schematic arrangement of a modification of the code error detection apparatus according to the second embodiment of the present invention. The same reference numerals in FIG. 18 denote the same parts as in FIG. 7, and a detailed description thereof will be omitted.

Figure 19:
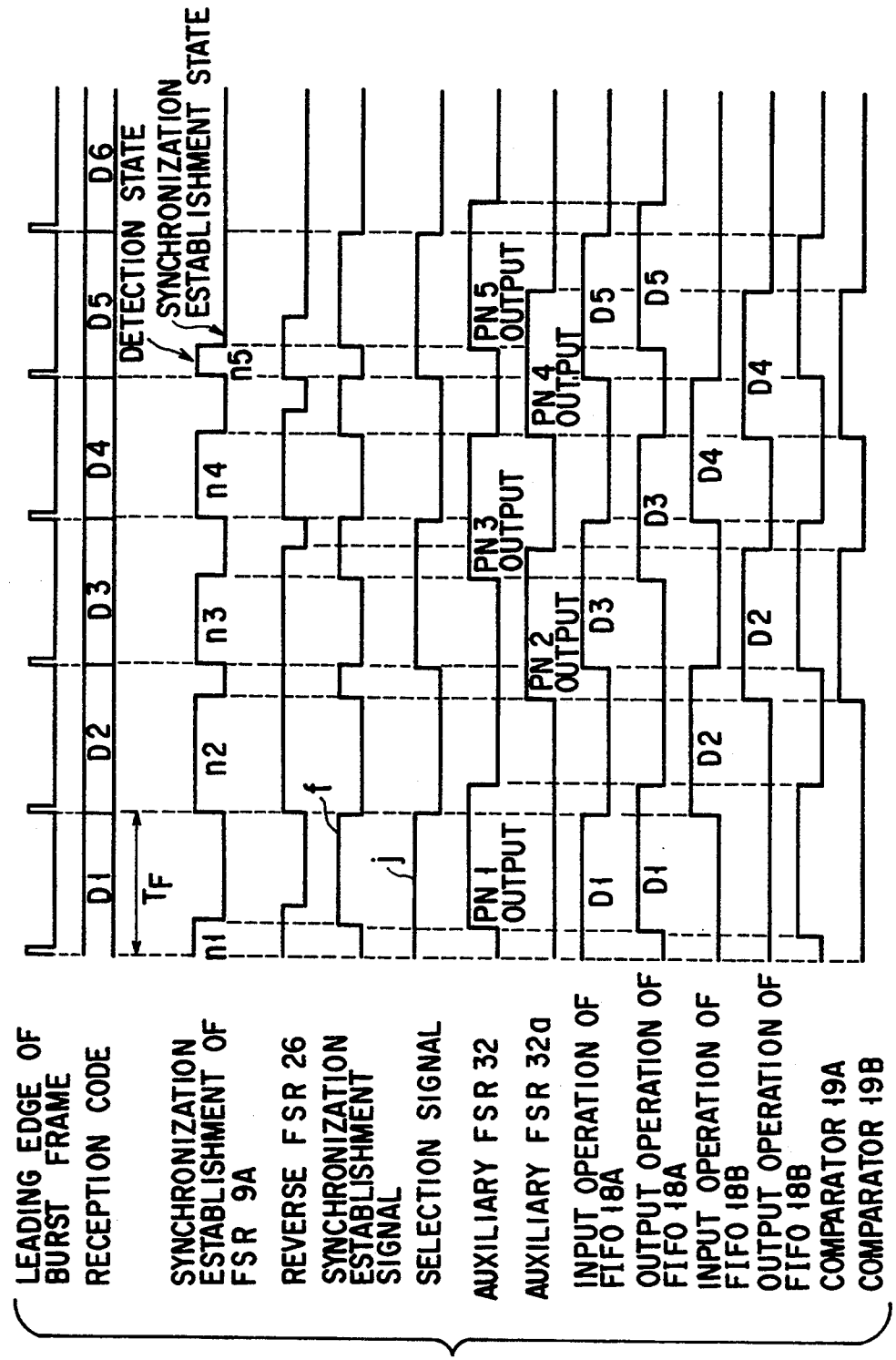
FIG. 19 is a timing chart showing an operation of the modification.

In this modification, a reference code $b_1$ based on the delayed PRBS signal output from a gate circuit 25, which is delayed from a reference code b based on the PRBS signal output from a forward FSR 9A by n bits, is input to a pair of auxiliary FSRs 32 and 32a through a selection circuit 31. As shown in FIG. 19, a selection signal j whose signal level is inverted in units of burst frames is input from a control section 15 to the selection circuit 31. The selection circuit 31 alternately supplies the input reference code $b_1$ based on the delayed PRBS signal to the auxiliary FSRs 32 and 32a in units of burst frames.

The auxiliary FSRs 32 and 32a, each having the same arrangement as that of the forward FSR 9A, respectively operate incorporated switching circuits in response to switching signals $k_1$ and $k_2$ from the control section 15, when they read m-bit data from the gate circuit 25, so as to stop data input from the gate circuit 25 and supply their own output signals to the input terminals of their start registers. As a result, the auxiliary FSRs 32 and 32a can be shifted to a self-running state. That is, reference codes $b_2$ and $b_3$ based on the PRBS signals synchronized with the respective reception codes a contained in the respective burst frames are respectively supplied to comparators 19A and 19B.

Meanwhile, the reception codes a input to an input terminal 7 are input to variable-length FIFO type shift registers 18A and 18B. The FIFO type shift registers 18A and 18B alternately fetch the respective reception codes a in units of burst frames in response to the switching signal j output from the control section 15, similar to the selection circuit 31. In addition, the FIFO type shift registers 18A and 18B respectively output reception codes $a_2$ and $a_3$ respectively delayed from the reception code a by n and $n_a$ bits in response to synchronization establishment signals $f_1$ and $f_{1a}$ output from the control section 15 in units of burst frames.

The comparators 19A and 19B respectively compare the reception codes $a_2$ and $a_3$ with the reference codes $b_2$ and $b_3$ based on the delayed PRBS signals output from the auxiliary FSRs 32 and 32a. If incoincidences are present, the comparators 19A and 19B supply incoincidence detection signals to error measurement sections 20 and 20a.

FIG. 19 is a timing chart showing an operation of the code error detection apparatus shown in FIG. 18. With regard to this modification, a case will be described below, in which the bits of the reception code a continue throughout a period $T_F$ of one burst frame, and almost no idle time interval $T_C$ as shown in FIG. 17 exists. Assume that the data values of the reception codes a in the respective burst frames are represented by D1, D2, D3, D4, D5, . . . .

In each odd burst frame time interval, the selection signal j is set at H level. In each even burst frame time interval, the selection signal j is set at L level. Consequently, the reception codes a having the data values D1, D3, D5, . . . corresponding to odd burst frames are respectively delayed by the FIFO type shift register 18A by $n_1$, $n_3$, $n_5$ bits , . . . required until the establishment of synchronization. At the same time, the reception codes a are respectively synchronized with the reference codes $b_2$ based on the delayed PRBS signals, which are delayed by $n_1$, $n_3$, $n_5$ bits and output from the auxiliary FSR 32. Therefore, bit errors in the reception codes $a_2$ having the data values D1, D3, D5, . . . corresponding to odd burst frames are detected by the comparator 19A.

Similarly, errors in the reception codes $a_3$ having the data values D2, D4, D6, . . . corresponding to even burst frames are detected by the other comparator 19B.

In this manner, error detection can be performed by alternately fetching the reception codes $a_2$ and $a_3$, incorporated in the respective burst frames, in the comparators 19A and 19B. Even in the case wherein almost no idle time interval $T_C$ exists in each burst frame, bit error detection can be reliably performed throughout all the bit data of each reception code a from the start bit data to the last bit data.

FIG. 20 is a block diagram showing the schematic arrangement of another modification of the code error detection apparatus according to the second embodiment of the present invention. The same reference numerals in FIG. 20 denote the same parts as in FIG. 7, and a detailed description thereof will be omitted.

In this modification, the reference code $b_1$ based on the delayed PRBS signal output from the gate circuit 25, which is delayed from the reference code b based on the PRBS signal output from the forward FSR 9A, is input to shift registers 33 and 33a, each consisting of m registers. More specifically, the shift registers 33 and 33a respectively fetch m bit data and stop their operations in response to synchronization establishment signals $f_1$ and $f_{1a}$ supplied from a control section 15 in units of burst frames. The shift registers 33 and 33a then supply the bit data stored in their own registers to a selection circuit 34. The selection circuit 34 alternately selects the data from the shift registers 33 and 33a in synchronism with changes in signal level of a selection signal j from the control section 15.

Every time the signal level of the selection signal j from the control section 15 changes, the bit data stored in each of the m registers of each of the shift registers 33 and 33a is set in a corresponding one of the registers of an auxiliary FSR 35 through the selection circuit 34, and the auxiliary FSR 35 is set in a self-running state. A reference code $b_4$ based on the delayed PRBS signal output from the auxiliary FSR 35 is input to one input terminal of a comparator 19. That is, the reference code $b_4$ based on the delayed PRBS signal is synchronized with the reception code $a_4$ delayed by one burst frame.

A reception code a input through an input terminal 7 is delayed by an FIFO type shift register 36 by R bits (fixed length) corresponding to a burst frame period $T_F$. A reception code $a_4$ output from the FIFO type shift register 36 is input to the comparator 19. Consequently, the reference code $b_4$ based on the delayed PRBS signal is compared with the reception code $a_4$ by the comparator 19. If they do not coincide with each other, an incoincidence signal is supplied to an error measurement section 20.

Figure 21:
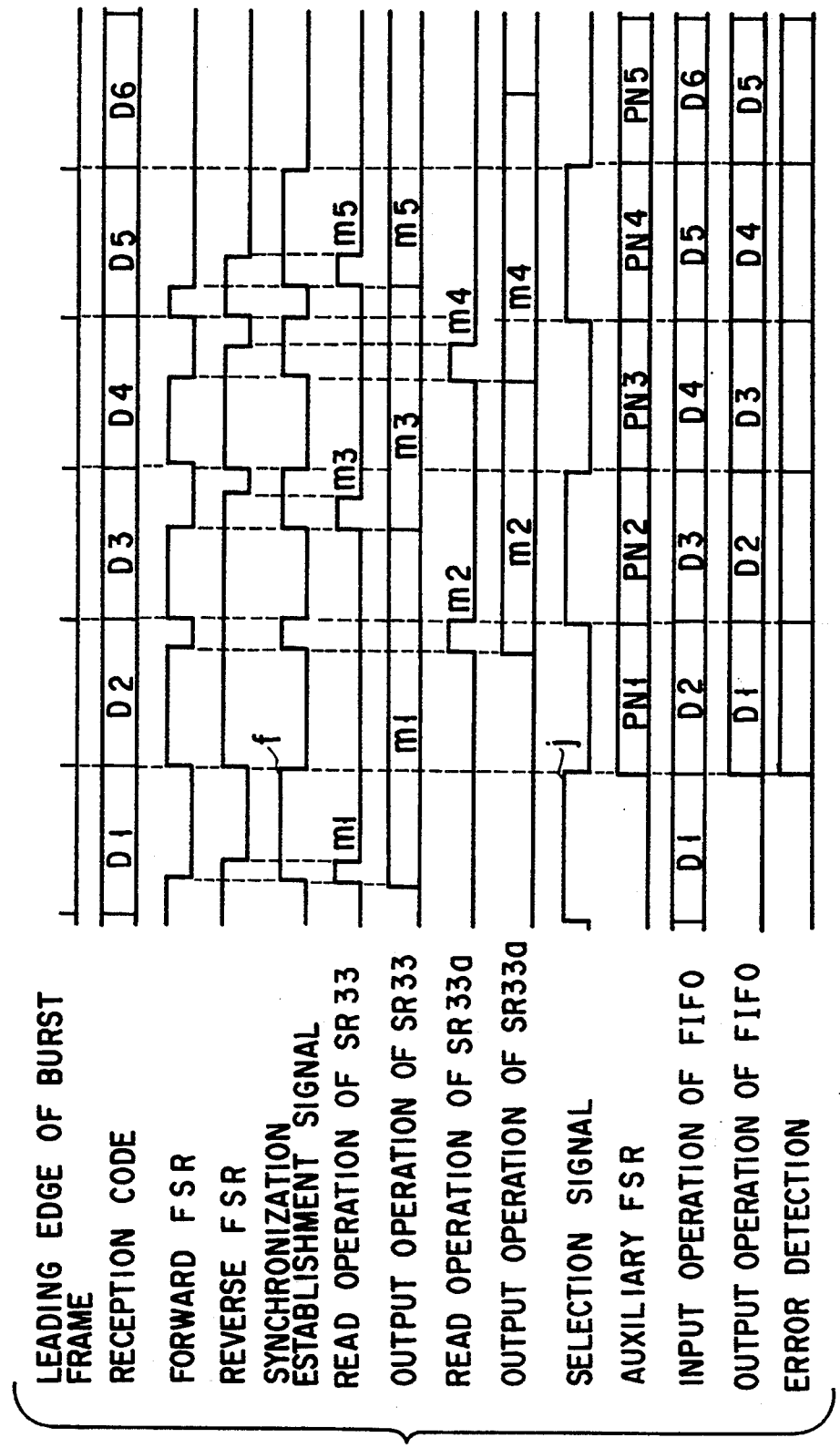
FIG. 21 is a timing chart showing an operation of the modification.

FIG. 21 is a timing chart showing an operation of the code error detection apparatus shown in FIG. 20. When the synchronization between the reference code b based on the PRBS signal and the reception code a is established in each burst frame, m bit data of the reference codes $b_1$ based on the delayed PRBS signals are alternately set in the shift registers 33 and 33a in units of burst frames. The m bit data are respectively latched by the shift registers 33 and 33a until the next odd or even burst frame is started. Consequently, the auxiliary FSR 35 outputs reference codes PRBS1 to PRBS5 as the reference codes $b_4$ based on the PRBS signals corresponding to the reception codes a having bit data D1 to D5 of the immediately preceding burst frames, respectively. Therefore, as shown in FIG. 21, the comparator 19 performs bit error detection with respect to the reception codes a having the bit data D1 to D5 each at a timing delayed by one burst frame.

Even with the code error detection apparatus having such an arrangement, bit error detection can be reliably performed with respect to the bit data of a reception code in each burst frame, from the start to the end of the reception of the reception code, at a timing delayed by one burst frame period. Therefore, almost the same effects as those of the above-described embodiment can be obtained.

As described above, according to the code error detection apparatus of the present invention, even if the idle time interval $T_C$ in the repetition period $T_F$ of burst frames is shorter than the burst time interval $T_B$ of the reception code a, or the idle time interval $T_C$ is almost zero, bit errors in the reception code a incorporated in each burst frame can be reliably detected. That is, the apparatus of the present invention can accurately measure code errors in the reception codes a arriving at arbitrary intervals.

Therefore, by reestablishing pattern synchronization in units of burst frames, the apparatus of the present invention can detect only bit errors, even in a transmission scheme in which cancellation/rearrangement of burst frames may occur as in ATM (Asynchronous Transmission Mode) and a transmission scheme in which burst frames are re-transmitted, without being influenced by cancellation/rearrangement of burst frames, re-transmission of burst frames, and the like.

In a digital radio communication system using the TDM (Time-Division Multiplex) transmission scheme, one frequency band is used by a plurality of mobile stations in a time-divisional manner. If the above-described apparatus of the present invention is applied to such a system, bit errors can be easily detected regardless of the execution of multiplexing.

Figure 22:
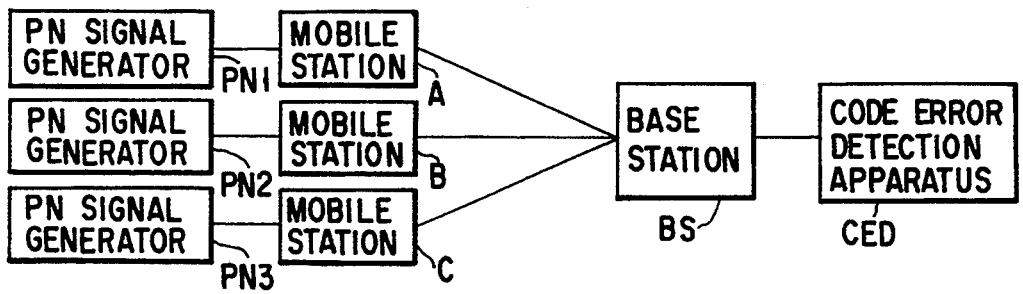
FIG. 22 is a block diagram showing the arrangement of a system in which the apparatus of the second embodiment is used to perform code error detection between a plurality of mobile stations and a base station.

A system for detecting bit errors in a system for transmitting signals from, e.g., three mobile stations to a base station, together with its operation, will be described below with reference to FIGS. 22 and 23A to 23D. Referring to FIG. 22, mobile stations A, B, and C are respectively equipped with PRBS signal generators PRBS1 to PRBS3 for independently and asynchronously outputting PRBS signals, and one code error detection apparatus CED of the present invention as described above is connected to a base station BS.

In this case, as described above, at the mobile stations A, B, and C, a previously transmitted burst frame and a succeeding burst frame need not be continuous as a bit pattern of a PRBS signal, and the PRBS signal generators PRBS1 to PRBS3 can be independently operated in a time-divisional manner, as shown in FIGS. 23A to 23C. Therefore, patterns can be easily generated. At the base station BS, burst frames are received along the time axis, as shown in FIG. 23D, but there is no need to identify the mobile stations from which the respective burst frames are transmitted. Therefore, the code error detection apparatus CED can easily perform bit error detection with respect to transmitted codes.

As described above, in the code error detection apparatus according to the second embodiment of the present invention, the signal selection circuit, the gate circuit comprising the exclusive OR circuit, and the reverse FSR are arranged to generate the reference code based on the delayed PRBS signal obtained by retroacting the reference code, based on the PRBS signal output from the forward FSR at the time of establishment of synchronization, from the time of input of a reception code on the basis of a unit PRBS signal output from each register of the forward FSR. In the apparatus of this embodiment, the variable-length FIFO type shift register is used to delay the bit data of a reception code which is input before the synchronization between the reference code based on a PRBS signal and the reception code is established, and bit error detection with respect to each bit data of the reception code is performed by using the reference code based on the delayed PRBS signal corresponding to the time of input of reception code and output from the gate circuit upon establishment of the synchronization. Therefore, the apparatus of this embodiment can reliably perform bit error detection even with respect to each bit data of a reception code input before the establishment of synchronization, and can improve the bit error detection precision with respect to a reception code whose duration is short.

In addition, the apparatus of this embodiment can reliably perform bit error detection even with respect to a reception code contained in a burst frame having almost no idle time interval, from the start to the end of the reception of the reception code.

An outline of a code error detection apparatus according to the third embodiment of the present invention will be described below.

The code error detection apparatus of this embodiment has as its subject to reliably perform bit error detection even with respect to the bit data of a start portion of a reception code which is input before a reference code based on a PRBS signal output from an incorporated FSR is synchronized with the reception code when bit error detection is performed to evaluate a digital system (to be tested) by using M-sequence PRBS signals as test signals. For this object, the code error detection apparatus includes a forward/reverse FSR capable of switching the operation mode between a forward PRBS signal mode and a reverse PRBS signal mode, and an LIFO type shift register so that a reception code which is input before the establishment of synchronization is temporarily stored in the LIFO type shift register, and bit errors are detected by using the reference code based on the reverse PRBS signal output from the forward/reverse FSR set in the reverse PRBS signal mode in the process of outputting the reception code in the reverse direction.

In order to achieve the above subject, the code error detection apparatus according to the third embodiment of the present invention includes a forward/reverse FSR, an LIFO type shift register, a synchronization establishing means, an operation mode switching means, and a comparator. The forward/reverse FSR consists of m stage of shift registers and can switch the operation mode between a forward PRBS signal mode and a reverse PRBS signal. The LIFO type shift register has registers equal to or larger than, in number, a burst bit count indicating the burst frame length of an M-sequence reception code having a period $(2^m - 1)$ which is input while it is incorporated in a burst frame. The LIFO type shift register sequentially stores the bit data of the reception code in the respective registers. When bit data corresponding to the burst bit count are stored, the LIFO type shift register outputs the bit data in the order reverse to the order of storing the bit data. The synchronization establishing means sets m consecutive bit data of the reception code in the respective registers of the forward/reverse FSR, set in the forward PRBS signal mode, through a switching circuit, and subsequently operates the switching circuit to connect the input and output terminals of the forward/reverse FSR to each other so as to set the forward/reverse FSR in a self-running state. Thereafter, the synchronization establishing means sequentially compares each bit data of the reference code based on the forward PRBS signal sequentially output from the forward/reverse FSR with corresponding bit data of the reception code. If m pairs of bits consecutively coincide with each other, the synchronization establishing means determines that the synchronization between the reference code based on the forward PRBS signal and the reception code is established. The operation mode switching means switches the operation mode of the forward/reverse FSR to the reverse PRBS signal mode when the bit data corresponding to the burst bit count are stored in the LIFO type shift register after the synchronization between the reference code based on the forward PRBS signal and the reception code is established. The comparator compares each bit data of the reference code based on the reverse PRBS signal output from the forward/reverse FSR switched to the reverse PRBS signal mode by the operation mode switching means with corresponding bit data of the reception code output from the LIFO type shift register. If they do not coincide with each other, the comparator outputs an incoincidence detection signal.

Figure 25:
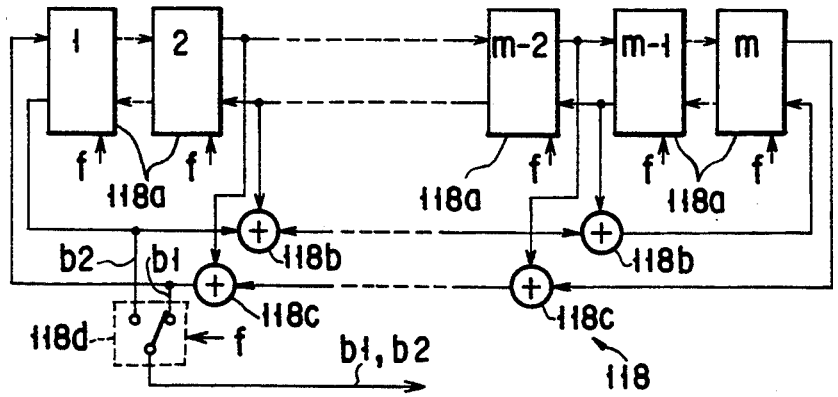
FIG. 25 is a block diagram showing the schematic arrangement of a forward/reverse FSR in the apparatus of the third embodiment.

The relationship between a forward PRBS signal and a reverse PRBS signal will be described first. A forward PRBS signal is a PRBS signal having the same sequence and period ($2^m-1$) as those of a reception code which is input while it is incorporated in a burst frame. In contrast to this, a reverse PRBS signal is a PRBS signal having the same period as that of the forward PRBS signal but is of a reverse sequence. If an FSR for outputting a forward PRBS signal is referred to as a forward FSR, and an FSR for outputting a reverse PRBS signal is referred to as a reverse FSR, a forward/reverse FSR is an FSR capable of selecting a forward PRBS signal mode having a function of a forward FSR and a reverse PRBS signal mode having a function of a reverse FSR in accordance with a selection signal, as shown in FIG. 25.

With this arrangement, the bit data of an input reception code are sequentially stored in the respective registers of the forward/reverse FSR, set in the forward PRBS signal mode, through the switching circuit, and also sequentially stored in the respective registers of the LIFO (Last-In First-Out) type shift register. The reference code based on the forward PRBS signal output from the forward/reverse FSR is synchronized with the reception code. When the synchronization is established, the forward/reverse FSR is set in a self-running state.

When all the bit data of the reception code incorporated in the burst frame are set in the LIFO type shift register, the operation mode of the forward/reverse FSR in the self-running state is switched from the forward PRBS signal mode to the reverse PRBS signal mode. As a result, the forward/reverse FSR starts to output a reverse PRBS signal having a bit pattern in reverse order to that of the forward PRBS signal.

At the same time when the forward/reverse FSR starts to output the reference code based on the reverse PRBS signal, the LIFO type shift register sequentially outputs the respective bit data of the reception code in the reverse order, starting from the last bit data. Consequently, the reference code based on the reverse PRBS signal is synchronized with the reception code output in the reverse order. Bit errors in the reception code which is input before the synchronization is established are detected by comparing each bit data of the reverse reception code with corresponding bit data of the reference code based on the reverse PRBS signal from the time at which the last bit data of the reception code is output from the LIFO type shift register.

The third embodiment of the present invention will be described below with reference to the accompanying drawings.

Figure 24:
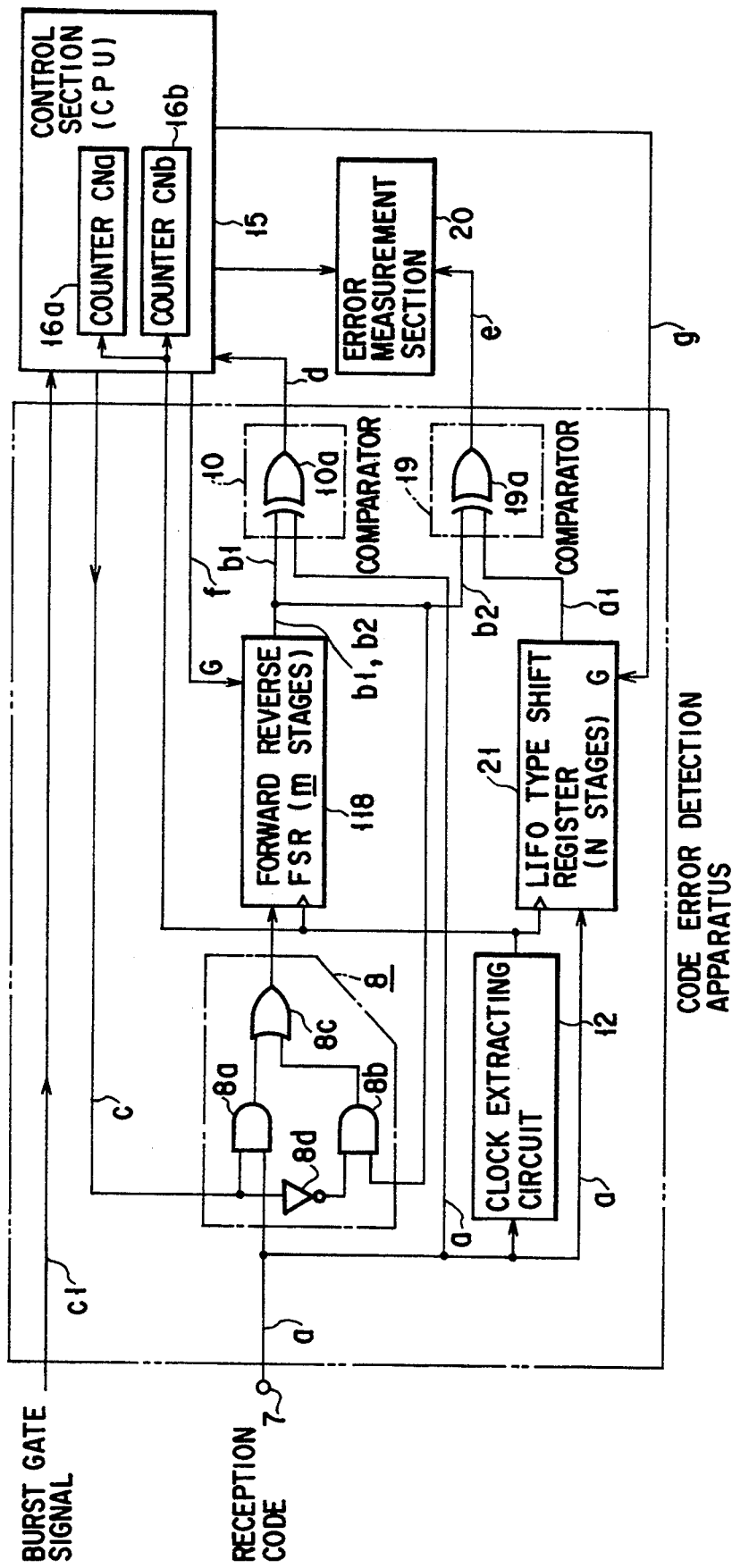
FIG. 24 is a block diagram showing the schematic arrangement of a code error detection apparatus according to the third embodiment of the present invention.

FIG. 24 is a block diagram showing the schematic arrangement of the code error detection apparatus of this embodiment. The same reference numerals in FIG. 24 denote the same parts as in the conventional code error detection apparatus shown in FIG. 52.

Figure 28:
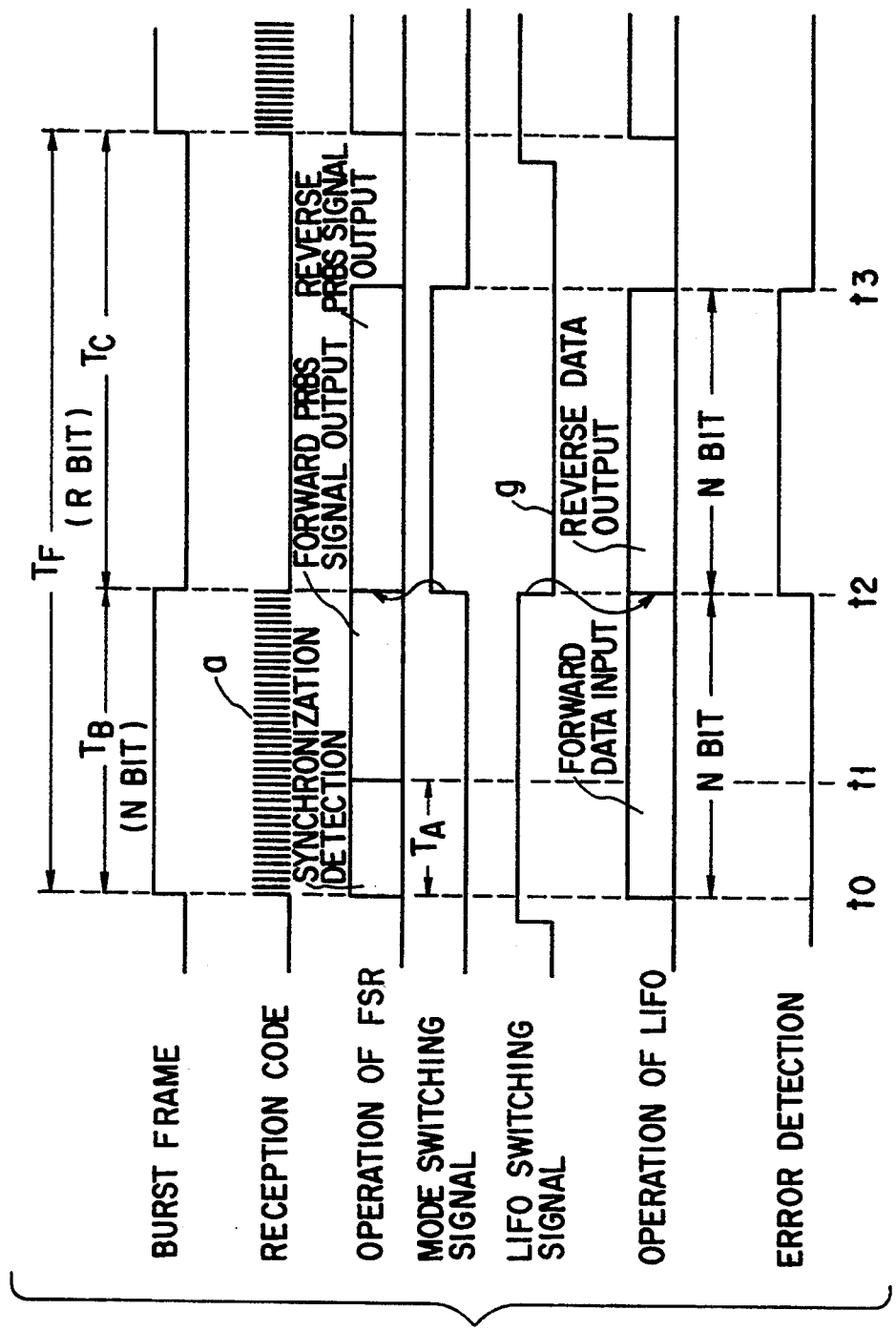
FIG. 28 is a timing chart showing an operation of the apparatus of the third embodiment.
Figure 49:
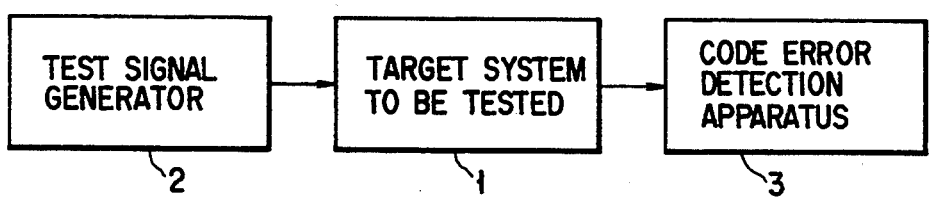
FIG. 49 is a block diagram showing a general code error detection system.

A reception code a output from the target system 1 shown in FIG. 49 and input to a measurement terminal 7 is incorporated in a burst frame having a time interval $T_B$ in a burst frame transmission scheme with an N-bit burst time interval $T_B$ and an idle time interval $T_C$, as shown in, e.g., FIG. 28. Therefore, the reception code a has a total of N bit data in one frame. This reception code a is an M-sequence PRBS signal having a bit period ($2^m-1$).

The reception code a input to the measurement terminal 7 is supplied to the data terminal of the start register in a forward/reverse FSR 118 consisting of m registers through one input terminal of a switching circuit 8 comprising two AND gates 8a and 8b, an OR gate 8c, and an inverter 8d.

As shown in FIG. 25, the forward/reverse FSR 118 comprises a bidirectional shift register consisting of series-connected m registers 118a, a plurality of EXOR gates 118b and 118c for calculating the exclusive ORs of outputs from the registers 118a, and one switching unit 118d. Each register 118a has a pair of input and output terminals, as shown in FIG. 25. The shift direction of data input to each register 118a is changed in accordance with an externally supplied operation mode switching signal f. In this embodiment, as the forward/reverse FSR 118, IC[SN74ALS299] available from Texas Instruments is employed.

When, for example, the operation mode switching signal f is set at high (H) level, the forward/reverse FSR 118 sequentially shifts data from the first register to the mth register and outputs a reference code $b_1$ based on a forward PRBS signal through the switching unit 118d connected to the normally closed contact. In contrast to this, if the operation mode switching signal f is set at low (L) level, the forward/reverse FSR 118 shifts the data in the reverse direction from the mth register to the first register and outputs a reference code $b_2$ based on a reverse PRBS signal through the switching unit 118d connected to the normally open contact.

The reference code $b_1$ based on the forward PRBS signal output from the forward/reverse FSR 118 set in the forward PRBS signal mode is input to one input terminal of an EXOR gate 10a comprising a synchronization detection comparator 10. At the same time, the output reference code $b_1$ based on the forward PRBS signal is input to the other input terminal of the switching circuit 8. The switching circuit 8 is controlled by a switching signal c from a control section 15 including a central processing unit (CPU) and the like.

Meanwhile, the reception code a input to the measurement terminal 7 is input to the switching circuit 8 and to the other input terminal of the EXOR gate 10a of the comparator 10. The comparator 10 compares each bit data of the reference code $b_1$ based on the forward PRBS signal output from the forward/reverse FSR 118 with corresponding bit data of the reception code a. If they do not coincide with each other, the comparator 10 outputs an incoincidence detection signal d to the control section 15. In addition, a burst gate signal $c_1$ indicating the start and end positions of the reception code a, incorporated in the burst frame and input through the measurement terminal 7, is supplied to the control section 15.

The clock terminal of the forward/reverse FSR 118 receives a clock signal corresponding to the bit rate of the reception code a, which is reproduced from the reception code a by a clock extracting circuit 12. The reproduced clock signal is further supplied to counters 16a and 16b in the control section 15. Consequently, the counters 16a and 16b count the bits of the reception code a.

In addition, the reference code $b_2$ based on the reverse PRBS signal output from the forward/reverse FSR 118 set in the reverse PRBS signal mode is fed back to the input terminal of the forward/reverse FSR 118 through the switching circuit 8, and is also input to one input terminal of an EXOR gate 19a of a code error detection comparator 19.

Figure 26:
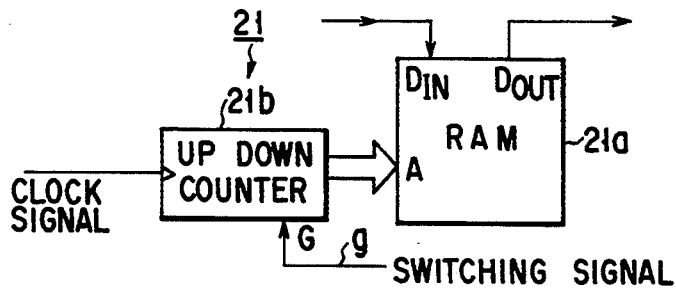
FIG. 26 is a block diagram showing the schematic arrangement of an LIFO type shift register in the apparatus of the third embodiment.

The reception code a input through the measurement terminal 7 is input to an LIFO (last-in first-out) type shift register 21. The LIFO type shift register 21 incorporates D registers. More specifically, as shown in FIG. 26, the LIFO type shift register 21 is comprising a random access memory (RAM) 21a incorporating D registers, and an up/down counter 21b.

If an input mode is set when a switching signal g from the control section 15 is set at high (H) level, the RAM 21a whose address is incremented in synchronism with a clock signal from the clock extracting circuit 12 sequentially stores the respective bit data of the reception code a at designated addresses. If an output mode is set when the switching signal g from the control section 15 is set at low (L) level, the RAM 21a whose address is decremented in synchronism with a clock signal sequentially outputs the respective bit data of the reception code a stored at the respective registers at designated addresses in the reverse order from the last bit data to the first bit data. A reception code $a_1$ output from the LIFO type shift register 21 in the reverse order in this manner is input to the other input terminal of the EXOR gate 19a of the comparator 19.

The comparator 19 compares each bit data of the reference code $b_2$ based on the reverse PRBS signal output from the forward/reverse FSR 118 set in the reverse PRBS signal mode with corresponding bit data of the reception code $a_1$ output from the LIFO type shift register 21. If they do not coincide with each other, the comparator 19 outputs an incoincidence detection signal e to an error measurement section 20. The error measurement section 20 counts input incoincidence detection signals to calculate a code error rate.

An operation of the code error detection apparatus having such an arrangement will be described below with reference to the flow chart shown in FIG. 27.

First, the control section 15 sets the operation mode switching signal f at high (H) level to set the forward/reverse FSR 118 in the forward PRBS signal mode (step S0). The control section 15 then waits until the burst gate signal $c_1$ is externally input (step S1). When the burst gate signal $c_1$ is input, the control section 15 determines that a burst frame has started, and resets a count value CNb of the counter 16b to "0". In addition, the control section 15 sets the switching signal c at high (H) level to set the switching circuit 8 to the measurement terminal 7 side (step Q1). After the control section 15 initializes a count value CNa of the counter 16a to "0" (step Q2), the count value CNa is incremented in response to a clock signal. The control section 15 waits until the count value CNa becomes a value m (step Q3).

When the count value CNa becomes the value m, the control section 15 determines that m consecutive bit data of the reception code a are set in the m shift registers constituting the forward/reverse FSR 118 through the switching circuit 8. The control section 15 changes the switching signal c to low (L) level to switch the switching circuit 8 to the output terminal side of the forward/reverse FSR 118 (step S3). At the same time, the control section 15 initializes the count value CNa of the counter 16a to "0" (step S4). The reference code $b_1$ based on the forward PRBS signal output from the forward/reverse FSR 118 is input to the input terminal of the forward/reverse FSR 118. The forward/reverse FSR 118 is then set in a self-running state in which the reference code $b_1$ based on the forward PRBS signal is continuously output.

If the control section 15 determines that the incoincidence detection signal d is input from the comparator 10, the flow returns to step Q1 to set the switching circuit 8 to the input terminal side again, thus setting m bit data of the reception code a in the forward/reverse FSR 118.

If it is determined in step Q4 that the incoincidence detection signal d is not input, the control section 15 checks in step Q5 whether the count value CNa has reached the value m. If NO in step Q5, the flow returns to step Q4 to check again whether the incoincidence detection signal d is input.

If YES in step Q5, since it means that the incoincidence detection signal d is not detected in m consecutive bits, the control section 15 determines that the synchronization between the reference code $b_1$ based on the forward PRBS signal output from the forward/reverse FSR 118 and the reception code a is established.

When the synchronization is established, the control section 15 keeps the forward/reverse FSR 118 in the self-running state and waits in step Q6 until the count value CNb of the counter 16b reaches a value N as a bit count corresponding to one frame in the reception code a. If the count value CNb reaches the value N (CNb=N) in step Q6, the control section 15 determines that all the bit data of one frame of the reception code a are stored in the respective registers of the LIFO type shift register 21. In step Q7, the control section 15 switches the forward/reverse FSR 118 to the reverse PRBS signal mode by using the operation mode switching signal f. As a result, the forward/reverse FSR 118 outputs the reference code $b_2$ based on the reverse PRBS signal in synchronism with a clock signal. At the same time, the control section 15 changes the switching signal g to low (L) level to switch the operation mode of the LIFO type shift register 21 to the output mode. With this operation, the LIFO type shift register 21 starts to output the reverse reception code $a_1$.

Since the complete synchronization is established between the reference code $b_2$ based on the reverse PRBS signal output at this timing and the reverse reception code $a_1$, the control section 15 outputs a detection command to the error measurement section 20 in step Q8 to perform bit error detection with respect to the reception code $a_1$. The error measurement section 20 counts incoincidence detection signals subsequently output from the comparator 19.

An overall operation of the code error detection apparatus according to the third embodiment will be described below with reference to the timing chart shown in FIG. 28.

When a burst frame starts at time $t_0$, the respective bit data of the reception code a are sequentially stored in the forward/reverse FSR 118 set in the forward PRBS signal mode and in the LIFO type shift register 21. When the synchronization between the reference code $b_1$ based on the forward PRBS signal and the reception code a is established at time $t_1$ after a lapse of the time interval $T_A$, the forward/reverse FSR 118 is set in a self-running state while the synchronization is established.

When the burst frame ends and all the N bit data contained in the reception code a are completely stored in the LIFO type shift register 21 at time $t_2$, the LIFO type shift register 21 starts to output the reverse reception code al, and at the same time the forward/reverse FSR 118 starts to output the reference code $b_2$ based on the reverse PRBS signal. The reception code $a_1$ is synchronized with the reference code $b_2$ based on the reverse PRBS signal output from the forward/reverse FSR 118. Subsequently, the comparator 19 sequentially compares two codes $a_1$ and $b_2$ in units of bit data.

If incoincident bits are present, the incoincidence detection signals e are input to the error measurement section 20. The error measurement section 20 starts to count incoincidence detection signals. When all the incoincidence detection signals with respect to the N-bit data contained in the reception code $a_1$ are counted at time $t_3$, the error measurement section 20 totals the incoincidence detection signals to calculate a code error rate.

With the code error detection apparatus having such an arrangement, the comparator 19 compares the reference code $b_2$ based on the reverse PRBS signal output from the forward/reverse FSR 118 set in the reverse PRBS signal mode after the establishment of synchronization with the reception code $a_1$ obtained by reversing the order of occurrence of the bit data of the bit pattern of the reception code a using the LIFO type shift register 21, thereby detecting bit errors.

Even if a time interval $T_A$ is required to establish the synchronization, bit error detection can be reliably performed with respect to all the bit data from the start bit data to the last bit data, i.e., the Nth bit data of the reception code a. Therefore, the overall detection precision of the code error detection apparatus can be improved.

In the third embodiment, a register count D of the LIFO type shift register 21 may be set to be equal to or larger than the burst bit count N indicating the burst frame length. In other words, if the register count D of the LIFO type shift register 21 is set to be slightly large within the range of a repetition period $T_F$ (R bits) of burst frames, bit errors can be properly measured in a target system 1 having a different burst frame time interval $T_B$.

Figure 29:
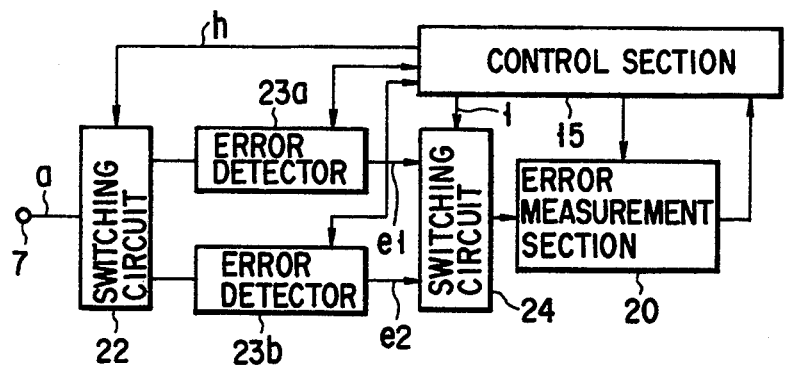
FIG. 29 is a block diagram showing the schematic arrangement of a modification of the code error detection apparatus according to the third embodiment of the present invention.

FIG. 29 is a block diagram showing the schematic arrangement of a modification of the code error detection apparatus according to the third embodiment of the present invention.

The apparatus of this modification uses two error detectors, each identical to the portion enclosed with the alternate long and two short dashed line in FIG. 24, from which the control section 15 and the error measurement section 20 are excluded.

A reception code a input through a measurement terminal 7 is input to error detectors 23a and 23b through a switching circuit 22 which is controlled by a switching signal h from a control section 15. Error bit signals $e_1$ and $e_2$ respectively output from the error detectors 23a and 23b are input to an error measurement section 20 through a switching circuit 24 which is controlled by a switching signal i from the control section 15. The control section 15 switches the switching signals h and i every repetition period $T_F$ of burst frames.

Figure 30:
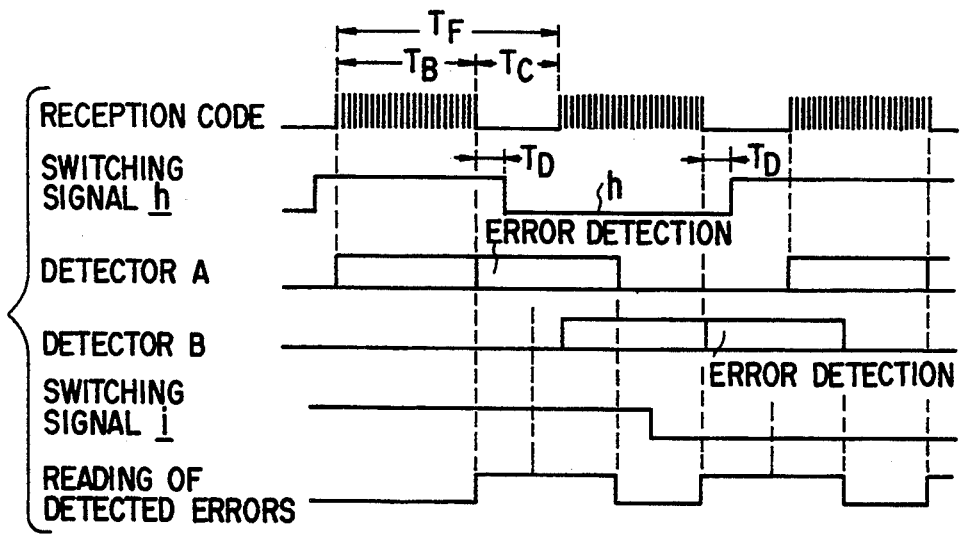
FIG. 30 is a timing chart showing an operation of the modification.

FIG. 30 is a timing chart showing an operation of the code error detection apparatus shown in FIG. 29. As described above, the control section 15 transmits the switching signal h every repetition period $T_F$ of burst frames to cause the error detectors 23a and 23b to alternately perform bit error detection with respect to the N bit data of the reception code a of each burst frame every repetition period $T_F$ of burst frames. The incoincidence detection signals $e_1$ and $e_2$ respectively obtained by the error detectors 23a and 23b are also input to the error measurement section 20 through the switching circuit 24 every repetition period $T_F$ of burst frames.

With this operation, N bit data of the reception codes a of the respective burst frames are alternately stored in LIFO type shift registers 21 of the error detectors 23a and 23b. Therefore, while a reverse reception code $a_1$ is output from the LIFO type shift register 21 of one error detector 23a, the respective bit data of the forward reception code a input through the measurement terminal 7 can be sequentially set in the LIFO type shift register 21 of the other error detector 23b.

Consequently, as shown in FIG. 30, even if an idle time interval $T_C$ is shorter than a burst time interval $T_B$ in the repetition period $T_F$ of burst frames, bit errors in the reception code a incorporated in each burst frame can be reliably detected. That is, the apparatus of this modification can accurately detect bit errors in the reception codes a arriving at arbitrary intervals.

Therefore, by reestablishing pattern synchronization in units of burst frames, the apparatus of this modification can detect only bit errors, even in a transmission scheme in which cancellation/rearrangement of burst frames may occur as in ATM (asynchronous transmission mode) and a transmission scheme in which burst frames are re-transmitted, without being influenced by cancellation/rearrangement of burst frames, re-transmission of burst frames, and the like.

In addition, the apparatus of this embodiment can be applied to a digital radio communication system using the TDM (time-division multiplex) transmission scheme, similar to the second embodiment described above, and can easily detect bit errors in transmitted codes.

Figure 31:
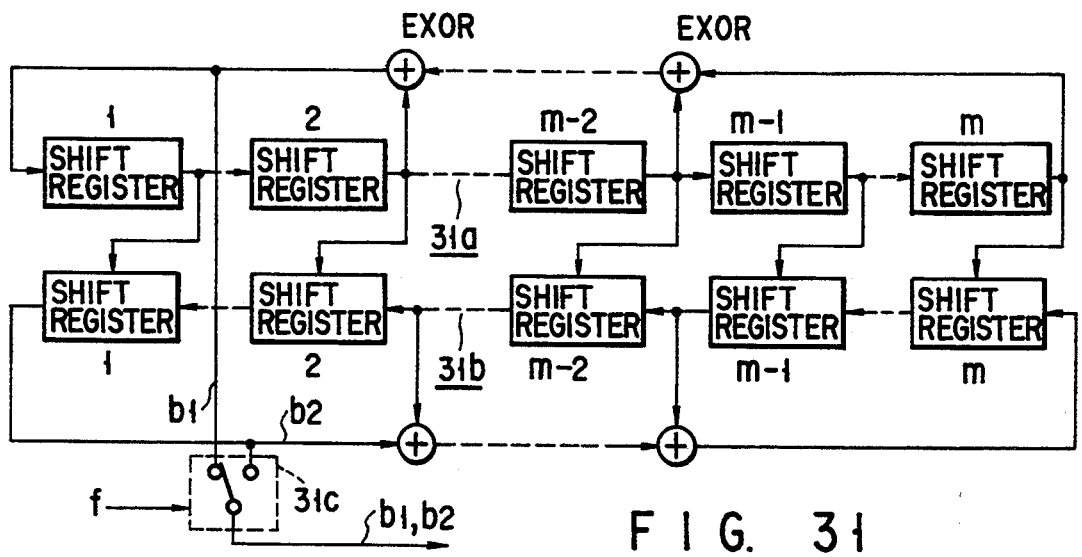
FIG. 31 is a block diagram showing the schematic arrangement of a forward/reverse FSR in another modification of the code error detection apparatus according to the third embodiment of the present invention.

The present invention is not limited to the above-described embodiment. In the third embodiment, the forward/reverse FSR is comprises the bidirectional shift register consisting of the series-connected m registers, as shown in FIG. 25. However, for example, as shown in FIG. 31, the apparatus may include a forward FSR 31a for outputting a reference code $b_1$ based on normal PRBS signal, and a reverse FSR 31b for outputting a reference code $b_2$ based on a reverse PRBS signal having a bit pattern in reverse order to that of the reference code $b_1$ based on the forward PRBS signal. In this case, the reference codes $b_1$ and $b_2$ as output signals from the FSRs 31a and 31b are switched by a switching unit 31c.

As described above, in the code error detection apparatus according to the third embodiment of the present invention, the forward/reverse FSR capable of switching the operation mode between the forward PRBS signal mode and the reverse PRBS signal mode, and the LIFO type shift register are used in such a manner that a reception code which is input before the establishment of synchronization is temporarily stored in the LIFO type shift register, and bit errors are detected by using the reference code based on the reverse PRBS signal output from the forward/reverse FSR set in the reverse PRBS signal mode in the process of outputting the reception code in the reverse direction. Therefore, the apparatus of this embodiment can reliably perform bit error detection with respect to all the bit data contained in each reception code. In addition, the apparatus of the third embodiment can improve the bit error detection precision even with respect to a reception code incorporated in a burst frame having a short burst frame time interval.

Furthermore, the apparatus of this embodiment can detect bit errors even in reception codes having various burst frame lengths without changing the respective set values.

An outline of the fourth embodiment of the present invention will be described next.

A code error detection apparatus according to the fourth embodiment of the present invention is designed as follows. m consecutive bit data of an M-sequence reception code having a period ($2^m-1$), which is input through an input terminal while it is incorporated in a burst frame, are respectively set in the registers of a forward FSR consisting of m stage of shift registers through a switching circuit. Thereafter, the switching circuit is operated to connect the input and output terminals of the forward FSR to each other so as to set the forward FSR in a self-running state. Each bit data of a reference code based on a forward PRBS signal output from the forward FSR is then compared with corresponding bit data of the reception code. If m pairs of bits consecutively coincide with each other, it is determined that the synchronization between the reference code based on the forward PRBS signal and the reception code is established. Subsequently, bit errors in the reception code are detected. The apparatus includes an LIFO (Last-In First-Out) type shift register, a reverse FSR, and a comparator. The LIFO type shift register has registers equal to or larger than, in number, a burst bit count indicating a burst frame length. The LIFO type shift register sequentially stores the bit data of a reception code in the respective registers. When the bit data corresponding to the burst bit count are stored, the LIFO type shift register outputs the bit data in the order reverse to the order of storing the bit data. The bit data of the m registers of the forward FSR are loaded in the m registers of the reverse FSR. The comparator compares each bit data of the reference code based on the reverse PRBS signal output from the reverse FSR with corresponding bit data of the reception code sequentially output from the LIFO type shift register. If they do not coincide with each other, the comparator outputs an incoincidence detection signal.

The relationship between the forward and reverse FSRs is the same as that in the third embodiment described above.

With this arrangement, a reception code input through the input terminal is supplied to the data terminal of the forward FSR through the switching circuit, and the bit data of the reception code are sequentially stored in the LIFO type shift register. Thereafter, the synchronization between the forward PRBS signal output from the forward FSR and the reception code is established. When the synchronization is established, the forward FSR is set in a self-running state. Since the outputs from the registers of the forward FSR are respectively loaded in the registers of the reverse FSR, the reverse FSR outputs a reverse PRBS signal which is reverse to the forward PRBS signal output from the forward FSR.

When all the bit data of the reception code incorporated in a burst frame are set in the LIFO type shift register, the respective bit data of the reception code are sequentially output from the LIFO type shift register in the reverse order, starting from the last bit data. Consequently, the reverse PRBS signal is synchronized with the reception code output in the reverse order. Comparison between bit data of the reception code reversed in order and corresponding bit data of the reference code based on the reverse PRBS signal is started when the last bit data of the reception code is output from the LIFO type shift register. With this operation, bit error detection with respect to a reception code input before the establishment of synchronization is performed.

The fourth embodiment of the present invention will be described below with reference to the accompanying drawings.

FIG. 32 is a block diagram showing the schematic arrangement of a code error detection apparatus according to the fourth embodiment. The same reference numerals in FIG. 32 denote the same parts as in the code error detection apparatus of each embodiment described above, and a detailed description thereof will be omitted.

Figure 33:
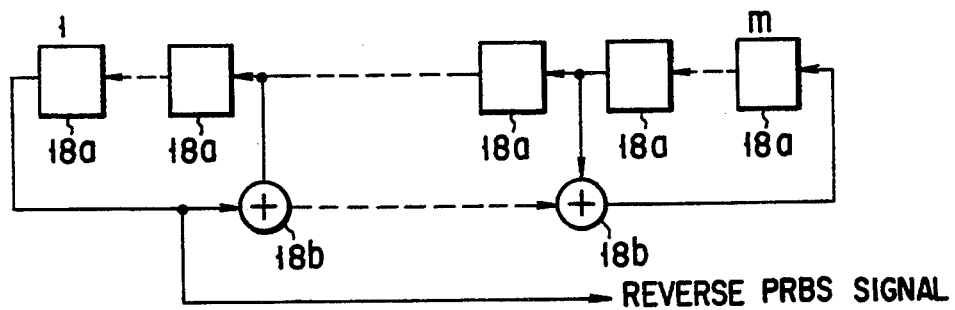
FIG. 33 is a block diagram showing the schematic arrangement of a reverse FSR in the apparatus of the fourth embodiment.

Output signals from m registers of a forward FSR 9A are respectively loaded in m registers of a reverse FSR 9B. The reverse FSR 9B comprises m registers 18$a$ and a plurality of EXOR gates 18$b$, similar to the forward FSR 9A shown in FIG. 59, as shown in FIG. 33. In the reverse FSR 9B, data are shifted in the reverse direction to that in the forward FSR 9A shown in FIG. 50.

Consequently, the reverse FSR 9B outputs a reference code $b_2$ based on a reverse PRBS signal having a bit pattern reverse to that of a reference code $b_1$ based on the forward PRBS signal output from the forward FSR 9A, in response to a clock signal from a clock extracting circuit 12. The output reference code $b_2$ based on the reverse PRBS signal is input to one input terminal of an EXOR gate 19$a$ of the comparator 19.

The comparator 19 compares each bit data of the reference code $b_2$ based on the reverse PRBS signal output from the reverse FSR 9B with corresponding bit data of a reverse reception code $a_1$ output from an LIFO type shift register 21. If they do not coincide with each other, the comparator 19 outputs an incoincidence detection signal e to an error measurement section 20. The error measurement section 20 counts input incoincidence detection signals to calculate, e.g., a code error rate.

An operation of a control section 15 in the code error detection apparatus having such an arrangement will be described below with reference to the flow chart shown in FIG. 34. Note that the same reference numerals in FIG. 34 denote the same parts as in FIG. 27, and a description thereof will be omitted.

In step Q7, the control section outputs a load signal f to load the bit data stored in the respective registers of the forward FSR 9A in the respective registers of the reverse FSR 9B. The reverse FSR 9B outputs the reference code $b_2$ based on the reverse PRBS signal in synchronism with a clock signal.

Since the reference code $b_2$ based on the reverse PRBS signal output at this timing is completely synchronized with the reverse reception code $a_1$, the control section 15 outputs a detection command to the error measurement section 20 in step Q8 to perform code error detection with respect to the reception code $a_1$. The error measurement section 20 counts incoincidence detection signals subsequently output from the comparator 19.

Figure 35:
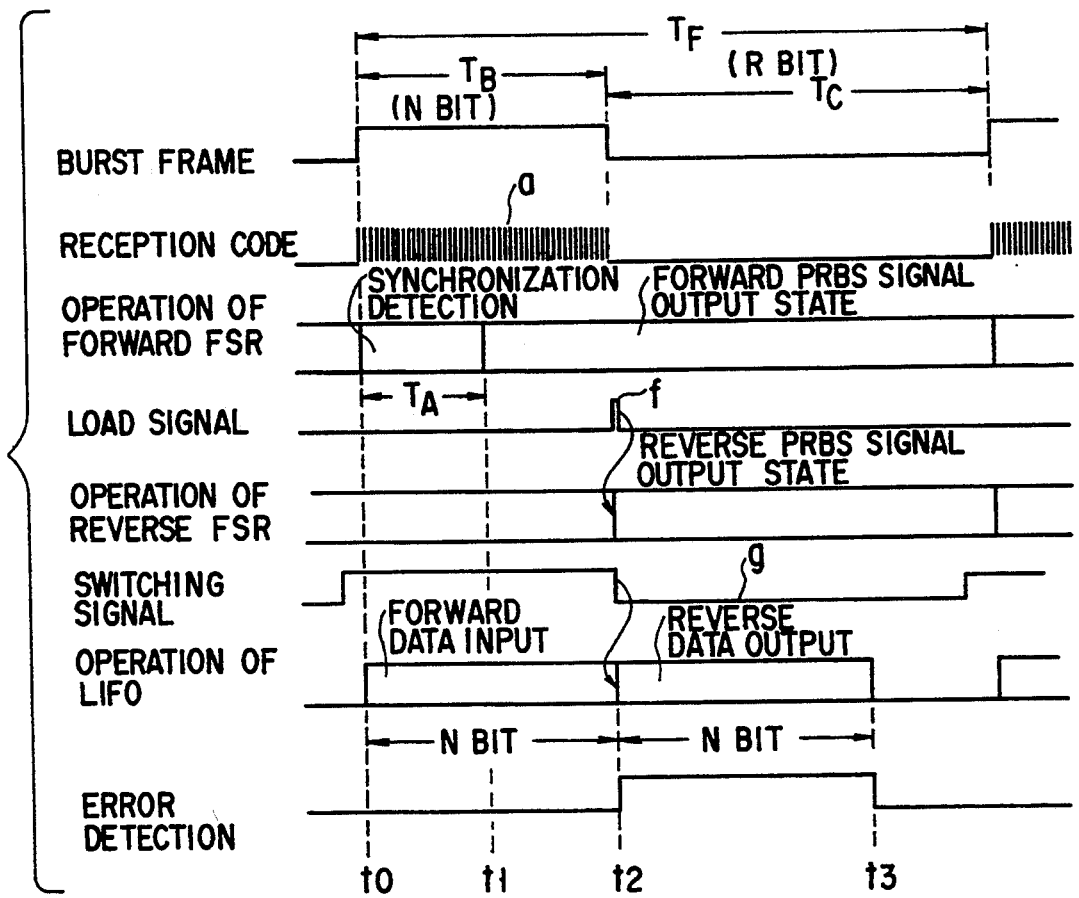
FIG. 35 is a timing chart showing an operation of the apparatus of the fourth embodiment.

An overall operation of the code error detection apparatus of the fourth embodiment will be described below with reference to the timing chart shown in FIG. 35.

When a burst frame starts at time $t_0$, the respective bit data of the reception code a are sequentially input to the forward FSR 9A and the LIFO type shift register 21. When the synchronization between the reference code $b_1$ based on the forward PRBS signal and the reception code a is established at time $t_1$, the forward FSR 9A is set in a self-running state while the synchronization is established.

When the burst frame ends and all the N bit data of the reception code a contained in one burst frame are completely stored in the LIFO type shift register 21 at time $t_2$, the LIFO type shift register 21 starts to output the reverse reception code $a_1$. At the same time, the reverse FSR 9B starts to output the reference code $b_2$ based on the reverse PRBS signal. The reception code $a_1$ is synchronized with the reference code $b_2$ based on the reverse PRBS signal output from the reverse FSR 9B. The comparator 19 sequentially compares the two codes $a_1$ and $b_2$ in units of bit data.

If incoincident bits are present, the incoincidence detection signal e from the comparator 19 is input to the error measurement section 20. The error measurement section 20 starts to count incoincidence detection signals. When counting of code errors in N-bit bit data contained in the reception code $a_1$ is completed at time $t_3$, the error measurement section 20 totals the incoincidence detection signals to calculate a code error rate.

With the code error detection apparatus having such an arrangement, the comparator 19 compares the reference code $b_2$ based on the reverse PRBS signal output from the reverse FSR 9B after the establishment of synchronization with the reception code $a_1$ obtained by reversing the order of occurrence of the bit data of the bit pattern of the reception code a using the LIFO type shift register 21, thereby detecting bit errors.

Even if a time interval $T_A$ is required to establish the synchronization, bit error detection can be reliably performed with respect to all the bit data from the start bit data to the last bit data, i.e., the Nth bit data of the reception code a. Therefore, the overall detection precision of the code error detection apparatus can be improved.

In this embodiment, a register count D of the LIFO type shift register 21 may be set to be equal to or larger than the burst bit count N indicating the burst frame length. In other words, if the register count D of the LIFO type shift register 21 is set to be slightly large within the range of a repetition period $T_F$ (R bits) of burst frames, bit errors can be properly measured in a target system 1 having a different burst frame time interval $T_B$.

As described above, in the code error detection apparatus according to the fourth embodiment of the present invention, in addition to the conventional forward FSR for outputting a code having the same bit pattern as that of a reception code, a reverse FSR for outputting a code having a reverse bit pattern is used together with an LIFO type shift register in such a manner that a reception code which is input before the establishment of synchronization is temporarily stored in the LIFO type shift register, and bit errors are measured by using the reference code based on the reverse PRBS signal in the process of outputting the reception code in the reverse direction. Therefore, the code error detection apparatus of this embodiment can reliably perform bit error detection with respect to all the bit data contained in the reception code. Consequently, the code error detection apparatus of this embodiment can improve the bit error detection precision with respect to a reception code contained in a burst frame having a short burst frame time interval. The apparatus of this embodiment can detect bit errors even in reception codes having various burst frame lengths without changing the respective set values.

An outline of the fifth embodiment of the present invention will be described next.

A code error detection apparatus according to the fifth embodiment of the present invention is designed as follows. m consecutive bit data of an M-sequence reception code having a period ($2^m-1$), which is input through an input terminal while it is incorporated in a burst frame, are set in the respective registers of an FSR consisting of m stage of shift registers through a switching circuit. Thereafter, the switching circuit is operated to connect the input and output terminals of the FSR to each other to set the FSR in a self-running state. Each bit data of a reference code based on a PRBS signal output from the FSR is then compared with corresponding bit data of the reception code. If m pairs of bits consecutively coincide with each other, it is determined that the synchronization between the reference code based on the PRBS signal and the reception code is established. Subsequently, bit errors in the reception code are detected. The apparatus includes an FIFO type shift register, a PRBS pattern memory, and a comparator. The FIFO type shift register delays a reception code by a predetermined number of bits. The PRBS pattern memory receives the bit data stored in each register of the FSR as a read address and stores the operating state of the FSR a predetermined number of bits, uniquely determined by the bit data corresponding to each address, before the current operating state. The comparator compares each bit data of the reference code based on the PRBS signal determined by the operating state of the FSR a predetermined number of bits before the current operating state, which is output from the PRBS pattern memory upon establishment of the synchronization, with corresponding bit data of the reception code delayed by the FIFO type shift register. If they do not coincide with each other, the comparator outputs an incoincidence detection signal.

According to a modification of the fifth embodiment of the present invention, in addition to the respective means in the fifth embodiment, the apparatus includes an auxiliary FSR consisting of m registers for fetching data output from the PRBS pattern memory upon establishment of the synchronization, and outputting the reference code based on the PRBS signal determined by the operating state of the FSR a predetermined number of bits before the current operating state. In this arrangement, the comparator compares each bit data of the reference code based on the PRBS signal output from the auxiliary FSR with corresponding bit data of the reception code delayed by the FIFO type shift register, thereby checking whether they coincide with each other.

The PRBS pattern memory used in the fifth embodiment will be described first.

In general, with regard to a PRBS signal having a bit period ($2^m-1$), if m consecutive bit data of ($2^m-1$) bit data are determined, the position (phase position) of the bit sequence consisting of the m bits in the bit period ($2^m-1$) is uniquely determined. Therefore, the value of bit data succeeding this bit sequence and the value of bit data one bit ahead thereof are also uniquely determined.

If, therefore, the bit data in the m registers of the FSR, in which the data are sequentially shifted in response to clock signals, are determined, the operation state of the FSR a predetermined number of bits before the current operation state, at each clock position, i.e., the bit data values of the reference code based on the PRBS signal output from the FSR a predetermined number of bits before the current operating state, and the values of the bit data in the m registers of the FSR a predetermined number of bits before the current operation state can be determined.

In the PRBS pattern memory, therefore, the operating state of the FSR a predetermined number of bits before the current operating state is stored in correspondence with bit sequences consisting of m bits and covering all possible $2^n$ bit combinations in the registers of the FSR. Consequently, if the bit data in each register of the FSR is supplied, as an address, to the address terminal of the PRBS pattern memory, the memory outputs an operation state a predetermined number of bits before the current operating state.

The respective bit data of an input reception code are sequentially stored in the registers of the FSR and the FIFO (First-In First-Out) type shift register through the switching circuit. Subsequently, the synchronization between the reference code based on the PRBS signal output from the FSR and the reception code is established.

The PRBS pattern memory then outputs the reference code based on a PRBS signal a predetermined number of bits before the operating state of the FSR in the synchronous state. If the predetermined number of bits are set to be equal to the delayed bit count of the FIFO type shift register, the reference code based on the PRBS signal output from the PRBS pattern memory is synchronized with the reception code output from the FIFO type shift register.

Bit error detection, therefore, can be performed with respect to a reception code input before the establishment of synchronization by starting to compare each bit data of the delayed reception code with corresponding bit data of the reference code based on the PRBS signal generated by the PRBS pattern memory upon establishment of the synchronization from the time when the start bit data of the reception code is output from the FIFO type shift register.

The fifth embodiment of the present invention will be described below with reference to the accompanying drawings.

FIG. 36 is a block diagram showing the schematic arrangement of the code error detection apparatus according to the fifth embodiment of the present invention. The same reference numerals in FIG. 36 denote the same parts as in the code error detection apparatus of each embodiment described above, and a detailed description thereof will be omitted.

Output signals from m registers of an FSR 9A are input to the first to mth address terminals of a PRBS pattern memory 108. The PRBS pattern memory 108 comprises, e.g., a read only memory (ROM) and the like. As described above, the PRBS pattern memory 108 stores bit data, each consisting of one bit and indicating the operating state of the FSR 9A D bits, i.e., the number of registers (register count) of an FIFO type shift register 18, before each bit data sequence consisting of m bits and output from the registers of the FSR 9A. The PRBS pattern memory 108 outputs the bit data to an output terminal Q.

Since the address value of the PRBS pattern memory 108 is changed in accordance with the value of each register of the FSR 9A, the PRBS pattern memory 108 outputs a reference code $b_1$ based on a PRBS signal delayed from a PRBS signal b output from the FSR 9A by D bits.

In practice, the PRBS pattern memory 108 stores output values corresponding to a plurality of delayed bit counts D. A specific value output from the PRBS pattern memory 108 is set in advance by a control section 15 to coincide with the delayed bit count D of the FIFO type shift register 18 to be used.

Therefore, $2^{(m+D)}$ data are stored in the PRBS pattern memory 108. If, for example, the register count m of the FSR 9A is 15, and the setting number of delayed bit counts D is 1,000, a memory capacity of $2^{(15+10)}$ bits (about 34 Mbits = about 4 Mbytes) is required.

A reception code $a_1$ delayed by the FIFO type shift register 18 by D bits is input to one input terminal of an EXOR gate 19a of a bit error detection comparator 19. A reference code $b_1$ based on the PRBS signal output from the PRBS pattern memory 108 is input to the other input terminal of the EXOR gate 19a. The comparator 19 compares each bit data of the reference code $b_1$ based on the PRBS signal output from the PRBS pattern memory 108 with corresponding bit data of the reception code $a_1$ delayed by D bits. If they do not coincide with each other, the comparator 19 outputs an incoincidence detection signal e to an error measurement section 20. The error measurement section 20 counts input incoincidence detection signals to calculate a code error rate.

An operation of the control section 15 in the code error detection apparatus having such an arrangement is the same as that in the first embodiment described with reference to the flow chart shown in FIG. 2.

At the time of establishment of synchronization in step Q5, however, since a bit data sequence from the m registers of the FSR 9A is supplied to the respective address terminals of the PRBS pattern memory 108, the reference code $b_1$ based on the PRBS signal output from the PRBS pattern memory 108 is always delayed from the reference code b based on the PRBS signal output from the FSR 9A by D bits.

Once the synchronization is established, the control section 15 keeps the FSR 9A in a self-running state and waits until a count value CNb of a counter 16b reaches the value D (step Q6). When the count value CNb reaches the value D (CNb=D), the control section 15 determines that the start bit data of a reception code a is delayed by D bits and output from the output terminal of the FIFO type shift register 18. Therefore, a reception code $a_1$ output from the FIFO type shift register 18 is synchronized with the reference code $b_1$ based on the PRBS signal output from the PRBS pattern memory 108. In step Q7, bit error detection with respect to the reception code $a_1$ is performed. That is, the control section 15 outputs an error measurement command to the error measurement section 20 to cause the section 20 to calculate a code error rate by counting incoincidence detection signals output from the comparator 19 for a predetermined period of time.

An overall operation of the code error detection apparatus of the fifth embodiment will be described below with reference to FIG. 39. When a burst frame starts at time $t_0$, the respective bit data of the reception code a are sequentially input to the FSR 9A and the FIFO type shift register 18. When the synchronization between the reference code b based on the PRBS signal and the reception code a is established at time $t_1$, the FSR 9A is set in a self-running state while the synchronization is established.

Consequently, the PRBS pattern memory 108 is also set in a self-running state in response to the reference code $b_1$ based on the PRBS signal D bits before the reference code b. When bit data corresponding to D bits are input at time $t_2$, the FIFO shift register 18 starts to output the reception code $a_1$ delayed by D bits. The reception code $a_1$ is synchronized with the reference code $b_1$ based on the PRBS signal output from the PRBS pattern memory 108. The comparator 19 sequentially compares the reception code $a_1$ with the reference code $b_1$ based on the PRBS signal in units of bit data.

If incoincident bits are present, the incoincidence detection signal e is input to the error measurement section 20. The error measurement section 20 starts to count incoincidence detection signals. When counting of incoincidence detection signals with respect to the N-bit data contained in the reception code $a_1$ is completed at time $t_4$, the error measurement section 20 totals the incoincidence detection signals to calculate a code error rate.

With the code error detection apparatus having the above-described arrangement, the comparator 19 compares the reference code $b_1$ based on the PRBS signal output from the PRBS pattern memory upon establishment of synchronization with the reception code $a_1$ delayed by the FIFO shift register 18 by D bits, thereby detecting bit errors.

Figure 37:
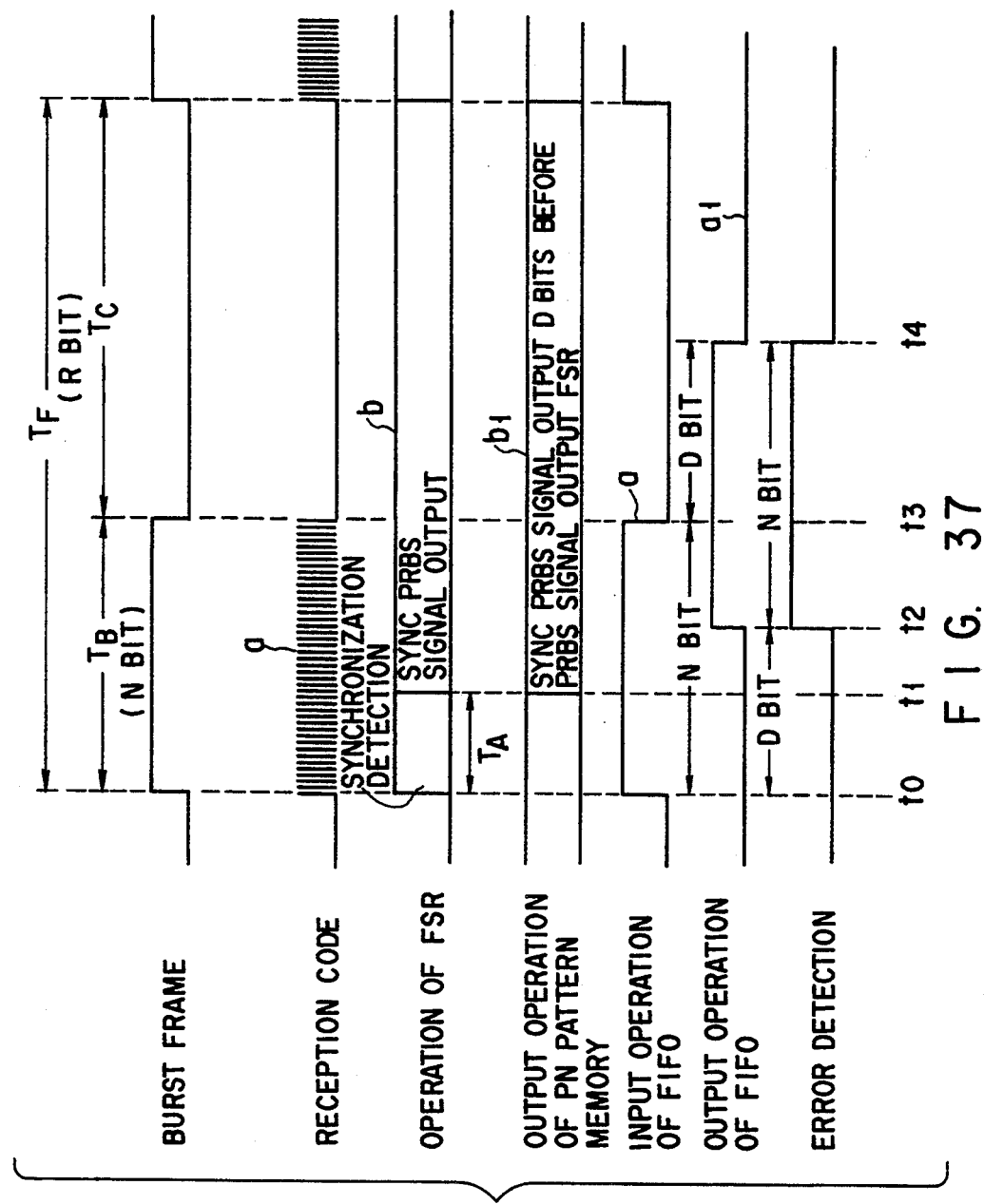
FIG. 37 is a timing chart showing an operation of the apparatus of the fifth embodiment.

Even if a time interval $T_A$ is required to establish the synchronization, bit error detection can be reliably performed with respect to all the bit data from the start bit data to the last bit data, i.e., the Nth bit data of the reception code a. Therefore, the overall detection precision of the code error detection apparatus can be improved. Especially, the apparatus of this embodiment can be effectively applied to the burst frame transmission scheme with the N-bit burst time interval $T_B$ and the idle time interval $T_C$, as shown in FIG. 37.

FIG. 38 is a block diagram showing the schematic arrangement of a modification of the code error detection apparatus according to the fifth embodiment of the present invention. The same reference numerals denote the same parts as in the fifth embodiment shown in FIG. 38, and a detailed description thereof will be omitted.

In this modification, a (delayed) reference code $b_1$ based on a PRBS signal output from the PRBS pattern memory 108, which is located D bits before a reference code b based on the PRBS signal output from the FSR 9A, is input to the input terminal of an auxiliary FSR 22 having the same arrangement as that of the synchronization establishment FSR 9A. A reference code $b_2$ based on the PRBS signal output from the auxiliary FSR 22 is input to one input terminal of the comparator 19. A reception code a input to a measurement terminal 7 is input to an FIFO shift register 18 consisting of (D+m) registers. A reception code $a_2$ obtained by delaying the reception code a by (D+m) bits through the FIFO shift register 18 is input to the comparator 19.

Figure 39:
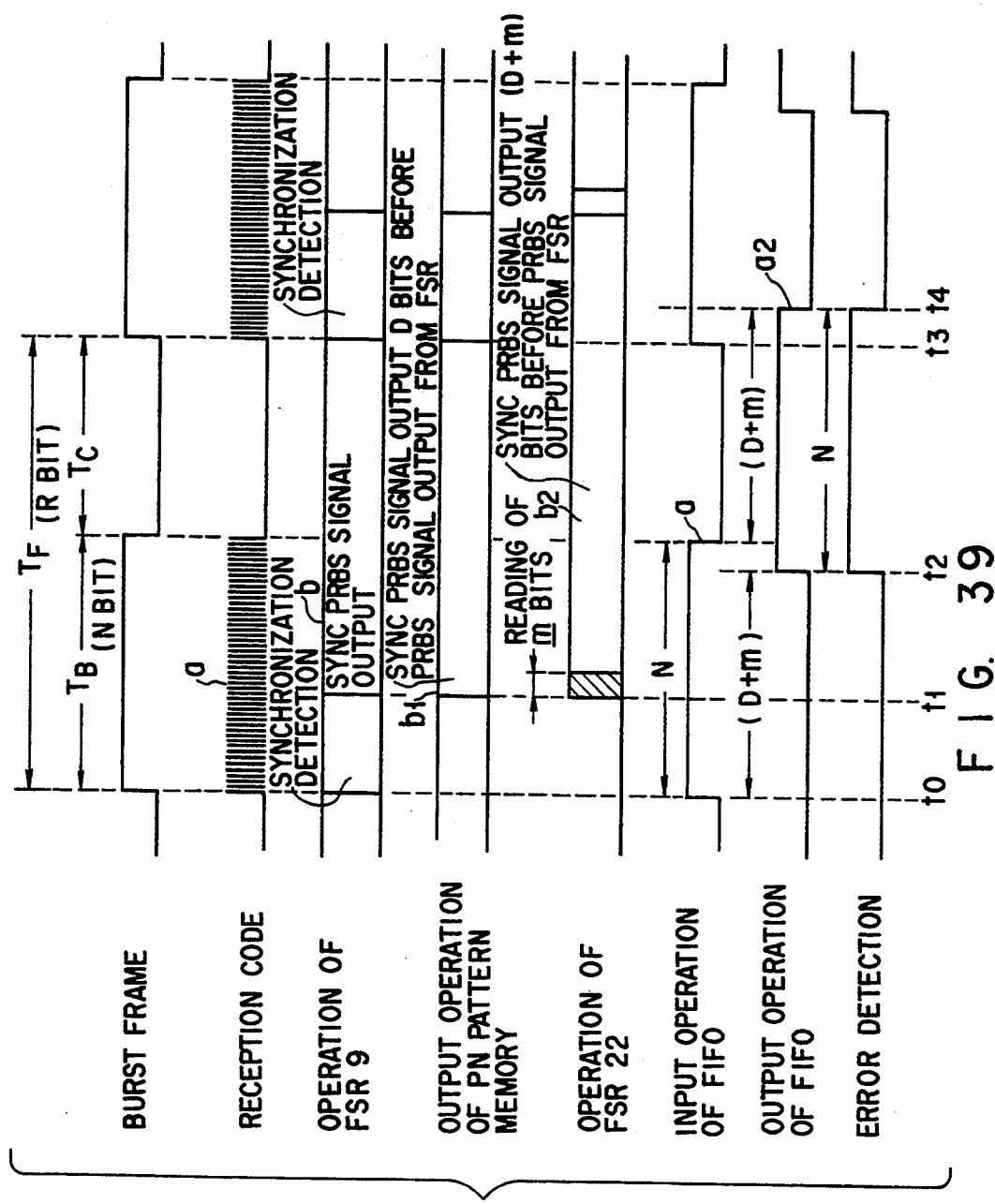
FIG. 39 is a timing chart showing an operation of the modification.

FIG. 39 is a timing chart showing an operation of the code error detection apparatus shown in FIG. 38. Similar to the fifth embodiment shown in FIG. 36, when the synchronization is established at time $t_1$, the auxiliary FSR 22 starts to receive the (delayed) reference code $b_1$ based on the PRBS signal, located D bits before the reference code b based on the PRBS signal obtained upon establishment of the synchronization. Since the auxiliary FSR 22 consists of m registers, the auxiliary FSR 22 starts to output the reference code $b_2$ based on the PRBS signal, which is delayed from the reference code b based on the PRBS signal output from the FSR 9A by (D+m) bits, after a lapse of an m-bit interval from input start time $t_1$. Consequently, the reference code $b_2$ based on the PRBS signal is synchronized with the reception code $a_2$ output from the FIFO shift register 18. As a result, actual bit error detection is started from time $t_2$ at which the FIFO shift register 18 starts to output the reception code $a_2$ delayed by (D+m) bits.

With the code error detection apparatus having the above-described arrangement, when the auxiliary FSR 22 reads m-bit data from the PRBS pattern memory 108, the auxiliary FSR 22 operates the incorporated switching circuit by using an input switching signal $f_2$ from the control section 15 to stop data input from the PRBS pattern memory 108 and supply its own output signal to the data input terminal of its start register. With this operation, the auxiliary FSR 22 can shift to a self-running state.

The apparatus of this embodiment, therefore, can reliably perform bit error detection with respect to the reception code a incorporated in each burst frame even if the idle time interval $T_C$ is shorter than the burst time interval $T_B$ in the repetition period $T_F$ of burst frames. That is, the apparatus can perform bit error detection with respect to the reception codes a arriving at arbitrary intervals of m bits or more.

As described above, the code error detection apparatus according to the fifth embodiment of the present invention includes the PRBS pattern memory for storing a PRBS signal located a predetermined number of bits before a PRBS signal output from the FSR at the time of establishment of synchronization, and the FIFO shift register for delaying the bit data of a reception code. With this arrangement, the bit data of a reception code which is input before the establishment of synchronization are delayed by the FIFO shift register, and error detection with respect to each bit data of the reception code is performed by using the reference code based on the PRBS signal which is determined by the operating state of the FSR a predetermined number of bits before the establishment of synchronization, and which is output from the PRBS pattern memory. Therefore, the apparatus can reliably perform error detection even with respect to each bit data of a reception code input before the establishment of synchronization. Even if the duration of a reception code in the burst frame transmission scheme is short, the bit error detection precision with respect to this reception code can be improved.

An outline of the sixth embodiment of the present invention will be described below.

A code error detection apparatus according to the sixth embodiment of the present invention is designed as follows. m consecutive bit data of an M-sequence reception code having a period ($2^m - 1$), which is input through an input terminal while it is incorporated in a burst frame, are set in the respective registers of an FSR consisting of m stage of shift registers through a switching circuit. Thereafter, the switching circuit is operated to connect the input and output terminals of the FSR to each other to set the FSR in a self-running state. Each bit data of a reference code based on a PRBS signal output from the FSR is compared with corresponding bit data of the reception code. If m pairs of bits consecutively coincide with each other, it is determined that the synchronization between the reference code based on the PRBS signal and the reception code is established. Subsequently, bit error detection with respect to the reception code is performed. The apparatus includes an FIFO type shift register, a signal selection circuit, an exclusive OR circuit, a signal selection control means, and a comparator. The FIFO type shift register delays a reception code by a predetermined number of bits. The signal selection circuit is inserted in the output path for unit PRBS signals respectively output from the m registers of the FSR. The exclusive OR circuit calculates the exclusive OR of the unit PRBS signals selected by the signal selection circuit and outputs the resultant data as a reference code based on a delayed PRBS signal obtained by delaying the reference code, based on the PRBS signal output from the forward FSR, by a predetermined number of bits. The signal selection control means outputs selection signals corresponding to respective unit PRBS signals uniquely determined by a delayed bit count to the signal selection circuit. The comparator compares each bit data of the reference code based on the delayed PRBS signal output from the exclusive OR circuit upon establishment of the synchronization with corresponding bit data of the reception code delayed by the FIFO type shift register. If they do not coincide with each other, the comparator outputs an incoincidence detection signal. Note that the signal selection circuit and the exclusive OR circuit constitute a gate circuit.

It will be described first why the reference code based on the PRBS signal located a predetermined number of bits before the reference code based on the PRBS signal output from the FSR, i.e., the reference code based on the delayed PRBS signal, can be generated by using the signal selection circuit, the exclusive OR circuit, and the signal selection control means. However, since the premises are the same as those in the second embodiment described above with reference to FIG. 12, a description thereof will be omitted.

FIG. 42 shows a content of a selection table memory 126 indicating unit PRBS signals to be selected and EXOR gate counts. The selection table memory 126 is used to generate delayed PRBS signals having bit phase delays 0 to 30, corresponding to a bit period of 31, with respect to PRBS signals (PRBS0) output from the FSR consisting of five shift registers (R1 to R5) (m=5) $4_1$ to $4_5$ shown in FIG. 41. Note that if only one unit PRBS signal is selected, the EXOR gate count is 0. If this selection table memory 126 is incorporated in the control section 15, a delayed PRBS signal located a required number of bits before the PRBS signal output from the FSR can be quickly obtained.

In the code error detection apparatus including the signal selection circuit, the exclusive OR circuit, and the signal selection control means, each of which has the above-described function, the respective bit data of an input reception code are sequentially stored in the registers of the FSR through the switching circuit and to the registers of the FIFO (first-in first-out) type shift register. Thereafter, the synchronization between the reference code based on the PRBS signal output from the FSR and the reception code is established.

The exclusive OR circuit outputs a delayed PRBS signal located a predetermined number of bits, set in advance by the signal selection control means, before the PRBS signal output from the FSR. If this predetermined number of bits is set to coincide with the delayed bit count in the FIFO type shift register, the reference code based on the delayed PRBS signal output from the exclusive OR circuit upon establishment of the synchronization is synchronized with the reception code output from the FIFO type shift register.

If, therefore, comparison between each bit data of the delayed reception code and corresponding bit data of the reference code based on the delayed PRBS signal generated by the signal selection circuit and the exclusive OR circuit upon establishment of the synchronization is started when the start bit data of the reception code is output from the FIFO type shift register, bit error detection with respect to a reception code input before the establishment of synchronization can be performed.

According to the modification of the sixth embodiment of the present invention, the data of the delayed PRBS signal output from the exclusive OR circuit are input to the auxiliary FSR consisting of m registers and having the same arrangement as that of the synchronization detection FSR. The reference code based on the delayed PRBS signal is output from the auxiliary FSR to be compared with the reception code which has been output from the FIFO type shift register, thereby performing bit error detection.

The auxiliary FSR fetches data from the exclusive OR circuit and can be shifted to a self-running state. In these apparatuses, therefore, even if the next burst frame starts before a reception code is completely output from the FIFO type shift register, and the transmission of data from the gate circuit is stopped halfway, bit error detection with respect to the reception code can be performed up to the last bit.

That is, even if an idle time interval $T_C$ is shorter than a burst time interval $T_B$, code error detection can be reliably performed with respect to one-burst-frame bit data of a reception code.

The sixth embodiment of the present invention will be described below with reference to the accompanying drawings.

FIG. 40 is a block diagram showing the schematic arrangement of the code error detection apparatus of the sixth embodiment. The same reference numerals in FIG. 40 denote the same parts as in the second embodiment, and a detailed description thereof will be omitted.

A selection table memory 126 is incorporated in a control section 15. The selection table memory 126 is used to generate delayed PRBS signals $b_1$ having $(2^m-1)$ types of delayed bit counts in correspondence with the FSR 9A consisting of m stage of shift registers. An exclusive OR circuit 125 includes a large number of EXOR gates for calculating the exclusive OR of signals designated by the selection table memory 126. With this arrangement, the control section 15 can arbitrarily set a delayed bit count for the reference code based on the delayed PRBS signal $b_1$ output from the exclusive OR circuit 125 with respect to the PRBS signal output from the FSR 9A.

A gate circuit 25, therefore, outputs the reference code $b_1$ based on the PRBS signal delayed, from a reference code b based on the PRBS signal output from the FSR 9A, by D bits designated in advance by the control section. Note that this delayed bit count D is set to coincide with a delayed bit count D in an FIFO type shift register 18 to be used.

A reception code a input through an input terminal 7 is input to the FIFO (first-in first-out) type shift register 18 consisting of D stage of shift registers. A clock signal from a clock extracting circuit 12 is supplied to the clock terminal of the FIFO type shift register 18. Each bit data of the reception code a input to the FIFO type shift register 18 is delayed by D bits.

A reception code $a_1$ obtained by delaying the reception code a by D bits through the FIFO type shift register 18 is input to one input terminal of an EXOR gate 19a of the bit error detection comparator 19. The other input terminal of the EXOR gate 19a receives the reference code $b_1$ based on the delayed PRBS signal output from the gate circuit 25. The comparator 19 compares each bit data of the reference code $b_1$ based on the delayed PRBS signal output from the gate circuit 25 with corresponding bit data of the reception code $a_1$ delayed by D bits. If they do not coincide with each other, the comparator 19 outputs an incoincidence detection signal e to an error measurement section 20. The error measurement section 20 counts input incoincidence detection signals to calculate, e.g., a code error rate.

Figure 43A:
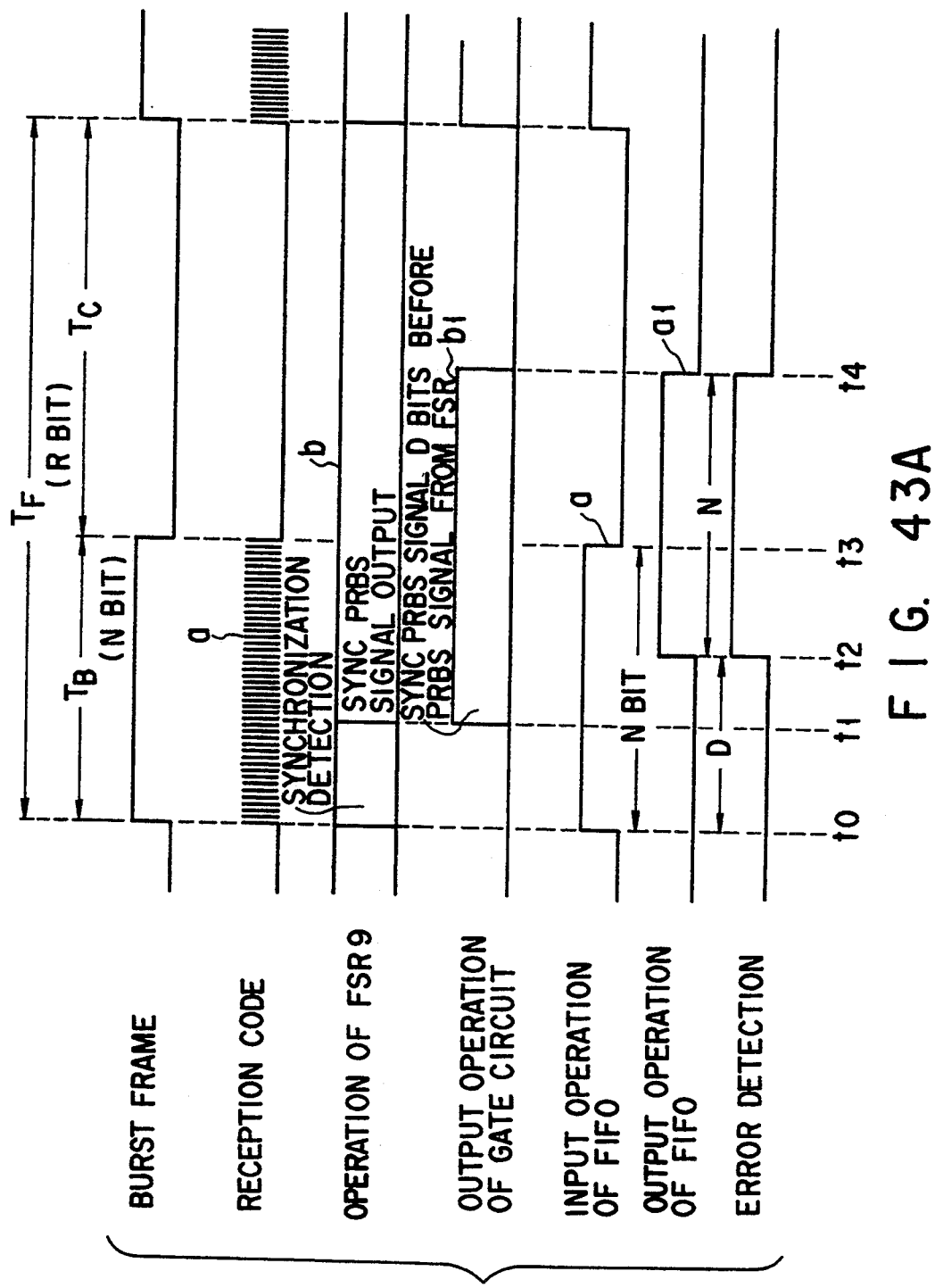
FIG. 43A is a timing chart showing an operation of the apparatus of the sixth embodiment.
Figure 43B:
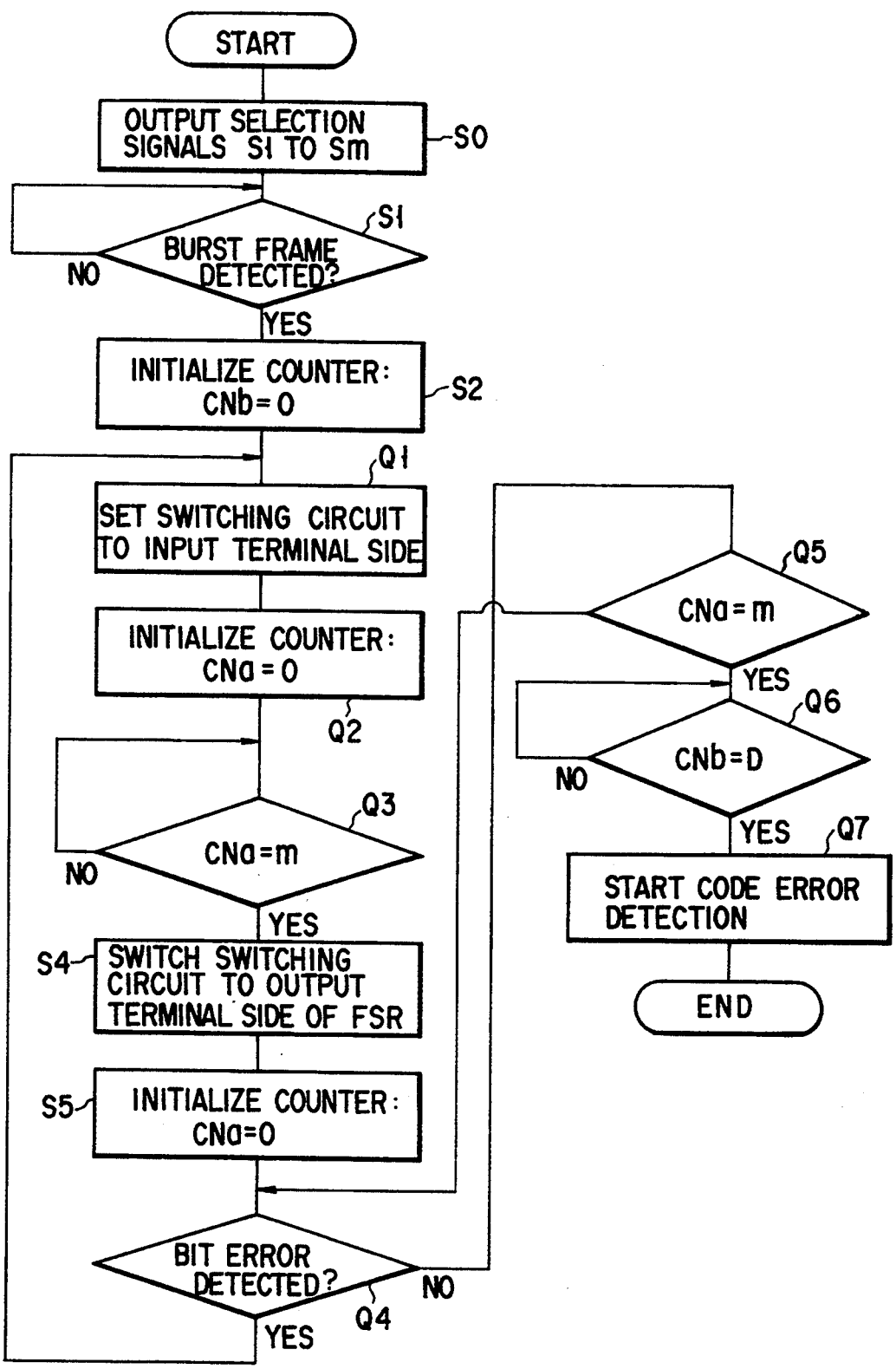
FIG. 43B is a flow chart showing an operation of the apparatus of the sixth embodiment.

An operation of the control section 15 in the code error detection apparatus having such an arrangement will be described below with reference to the flow chart shown in FIG. 43B.

By referring to the selection table memory 126, the control section 15 outputs selection signals S1 to Sm to a signal selection circuit 124 such that the number of bits by which the reference code $b_1$ based on the delayed PRBS signal output from the gate circuit 25 is delayed from the reference code b based on the internal PRBS signal coincides with the delayed bit count in the FIFO type shift register 18 (step S0). Subsequently, the control section 15 performs the same operation as shown in the flow chart in FIG. 2 according to the first embodiment.

Since unit PRBS signals $g_l$ to $g_m$ output from each stage of the m stage of shift registers of the FSR 9A are supplied to the gate circuit 25 at the time of establishment of the synchronization in step Q5, the reference code $b_1$ based on the delayed PRBS signal output from the gate circuit 25 is always delayed from the reference code b based on the PRBS signal output from the FSR 9A by D bits.

Once the synchronization is established, the control section 15 waits in step Q6 until a count value CNb of a counter 16b reaches the value D while keeping the FSR 9A in a self-running state. When the count value CNb reaches the value D (CNb=D), the control section 15 determines that the start bit data of the reception code a is delayed by D bits and output from the output terminal of the FIFO type shift register 18. Consequently, the reception code $a_1$ output from the FIFO type shift register 18 is synchronized with the reference code $b_1$ based on the delayed PRBS signal output from the gate circuit 25. In step Q7, the control section 15 outputs an error measurement command to the error measurement section 20 to perform bit error detection with respect to the reception code $a_1$. In response to this command, the error measurement section 20 counts incoincidence detection signals output from the comparator 19 for a predetermined period of time to calculate a code error rate.

An overall operation of the apparatus will be described below with reference the timing chart shown in FIG. 43A. When a burst frame starts at time $t_0$, the respective bit data of the reception code a are sequentially input to the FSR 9A and the FIFO type shift register 18. When the synchronization between the reference code b based on the PRBS signal and the reception code a is established at time $t_1$, the FSR 9A is set in a self-running state while the synchronization is established.

Consequently, the gate circuit 25 is also set in a self-running state by the reference code $b_1$ based on the delayed PRBS signal, located D bits before the reference code b. When D-bit bit data is input at time $t_2$, the FIFO type shift register 18 starts to output the reception code $a_1$ delayed by D bits. The reception code $a_1$ is synchronized with the reference code $b_1$ based on the delayed PRBS signal output from the gate circuit 25. The comparator 19 sequentially compares each bit data of the reception code $a_1$ with corresponding bit data of the reference code $b_1$ based on the delayed PRBS signal.

If incoincident bits are preset, an incoincidence detection signal e is input to the error measurement section 20. The error measurement section 20 starts to count incoincidence detection signals. When measurement of incoincidence detection signals with respect to the N-bit data contained in the reception code $a_1$ is completed, the error measurement section 20 totals incoincidence detection signals and calculates a code error rate.

According to the code error detection apparatus having the above-described arrangement, the comparator 19 compares the reference code $b_1$ based on the delayed PRBS signal output from the gate circuit 25 upon establishment of the synchronization with the reception code $a_1$ delayed by D bits through the FIFO type shift register 18, thereby detecting bit errors.

Even if a time interval $T_A$ is required to establish the synchronization, bit error detection can be reliably performed with respect to all the bit data from the start bit data to the last bit data, i.e., the Nth bit data of the reception code a. Therefore, the overall detection precision of the code error detection apparatus can be improved. Especially, the apparatus of this embodiment can be effectively applied to the burst frame transmission scheme with the N-bit burst time interval $T_B$ and the idle time interval $T_C$, as shown in FIG. 43A.

If, for example, the FSR 9A consists of 10 (m=10) registers, the storage capacity of the selection table 126 stored in the control section 15 is about $2^{10} \times 10$ (about 230 kbits). Therefore, formation of such a selection table is relatively easy.

FIG. 44 is a block diagram showing the schematic arrangement of a modification of the code error detection apparatus according to the sixth embodiment of the present invention. The same reference numerals in FIG. 44 denote the same parts as in the sixth embodiment shown in FIG. 40, and a detailed description thereof will be omitted.

In this modification, a control section 15 transmits selection signals S1 to Sm to a signal selection circuit 124 of a gate circuit 25 so that a reference code $b_2$ based on a delayed PRBS signal output from the gate circuit 25 is delayed by (D+m) bits.

The reference code $b_2$ based on the delayed PRBS signal, located (D+m) bits before a reference code b based on the PRBS signal output from a synchronization establishment FSR 9A, is input to the input terminal of an auxiliary FSR 22 having the same arrangement as that of the FSR 9A. A reference code $b_3$ based on the delayed PRBS signal output from the auxiliary FSR 22 is input to one input terminal of a comparator 19. Meanwhile, a reception code a input to an input terminal 7 is input to an FIFO type shift register 18 consisting of (D+m) registers. A reception code $a_2$ delayed by this FIFO type shift register 18 by (D +m) bits is input to the comparator 19.

Figure 45:
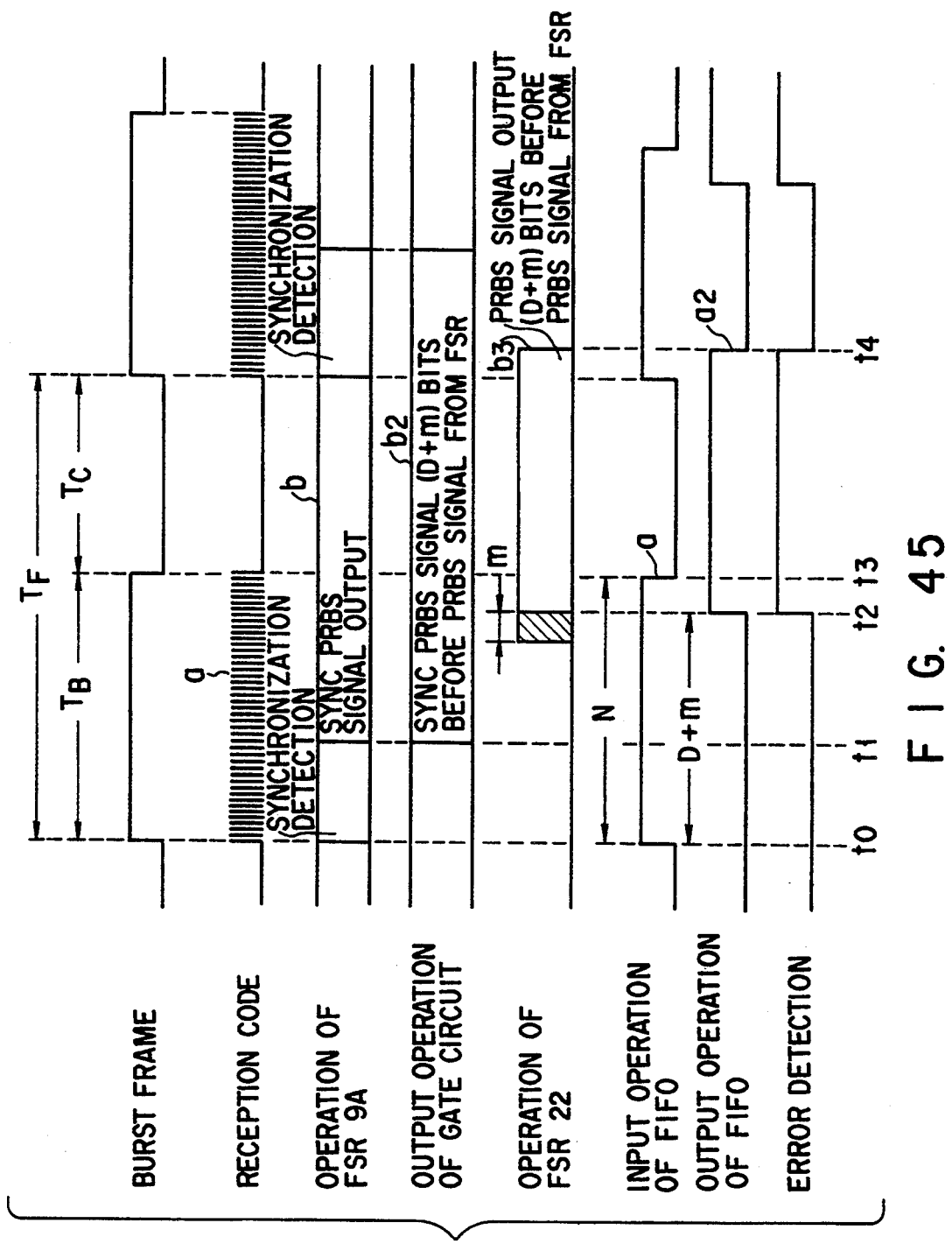
FIG. 45 is a timing chart showing an operation of the modification.

FIG. 45 is a timing chart showing an operation of the code error detection apparatus shown in FIG. 44. Similar to the sixth embodiment shown in FIG. 40, when the synchronization is established at time $t_1$, the gate circuit 25 starts to output the reference code $b_2$ based on the delayed PRBS signal, located (D+m) bits before the reference code b based on the PRBS signal output at the time of establishment of the synchronization. The auxiliary FSR 22 starts to read the reference code $b_2$ based on the delayed PRBS signal output from the gate circuit 25 at the time corresponding to the Dth bit from the start bit in the burst frame. Since the auxiliary FSR 22 consists of m registers, it starts to output the reference code $b_3$ based on the delayed PRBS signal, delayed from the reference code b based on the PRBS signal output from the FSR 9A by (D+m) bits, when an m-bit interval has elapsed since time $t_1$ at which the input operation was started. Consequently, the reference code $b_3$ based on the delayed PRBS signal is synchronized with the reception code $a_2$ output from the FIFO type shift register 18. As a result, actual bit error detection is started at time $t_2$ at which the FIFO type shift register 18 starts to output the reception code $a_2$ delayed by (D+m) bits.

With the code error detection apparatus having the above-described arrangement, when the auxiliary FSR 22 reads m-bit data from the gate circuit 25, the auxiliary FSR 22 operates the internal switching circuit by using an input switching signal $f_2$ from the control section 15 to stop data input from the PRBS gate circuit 25 and supply its own output signal to the data input terminal of its start register. With this operation, the auxiliary FSR 22 can shift to a self-running state.

The apparatus of this embodiment, therefore, can reliably perform bit error detection with respect to the reception code a incorporated in each burst frame even if the idle time interval $T_C$ is shorter than the burst time interval $T_B$ in the repetition period $T_F$ of burst frames (it is required, however, that the bit count of the idle time interval $T_C$ be equal to or larger than the register count m of the FSR), as shown in FIG. 45. That is, the apparatus can accurately detect bit errors in the reception codes a arriving at arbitrary intervals.

As described above, the code error detection apparatus according to the sixth embodiment of the present invention includes the gate circuit comprising the signal selection circuit and the exclusive OR circuit and designed to generate the reference code based on a delayed PRBS signal, located a predetermined number of bits before the reference code based on the PRBS signal output from the FSR at the time of establishment of the synchronization, on the basis of the unit PRBS signals output from the respective registers of the FSR, and the FIFO type shift register for delaying the bit data of a reception code. In these apparatuses described above, the bit data of a reception code which is input before the establishment of synchronization are delayed by the FIFO shift register, and error detection with respect to each bit data of the reception code is performed by using the reference code based on the delayed PRBS signal, located a predetermined number of bits before the reference code based on the PRBS signal, which is output from the gate circuit upon establishment of the synchronization. Therefore, these apparatuses can reliably perform error detection even with respect to each bit data of a reception code input before the establishment of synchronization. Even if the duration of a reception code in the burst frame transmission scheme is short, the bit error detection precision with respect to this reception code can be improved.

In addition, according to these apparatuses, the delayed bit count of the reference code based on a delayed PRBS signal can be arbitrarily set under the control of the control section in accordance with the delay amount of the FIFO type shift register, and hence the application range of these apparatuses can be widened.

FIG. 46 shows a main part, of a code error detection apparatus, common to the second to sixth embodiments described above. Referring to FIG. 46, the code error detection apparatus comprises an FSR 9, a switching unit 8, a synchronization detection comparator 10, a control unit 15 including first and second control sections, a storage unit 180, a measurement reference code generating unit 250, and a code error detection comparator 19. The FSR 9 has input and output terminals 9a and 9b. The FSR 9 is switched between two states, i.e., a state in which m consecutive bit data of an M-sequence reception code having a period $(2^m-1)$, which is input through a measurement terminal 7, are set in m stage of shift registers of the FSR 9 through the input terminal 9a, and a state in which bit data output from the output terminal 9b are set in the m registers of the FSR 9 so that the FSR 9 is set in a self-running state. The switching unit 8 is arranged between the FSR 9 and the measurement terminal 7 to perform a switching operation so as to connect the input terminal 9a of the FSR 9 to the measurement terminal 7 or to the output terminal 9b. The synchronization detection comparator 10 sequentially compares each bit data output from the output terminal 9b of the FSR 9 with corresponding bit data of the reception code. The control unit 15 controls the switching unit 8 such that the input terminal 9a of the FSR 9 is connected to the measurement terminal 7 to set the m consecutive bit data of the reception code in the FSR, and a switching operation is subsequently performed to connect the input terminal 9a to the output terminal 9b of the FSR 9 to set the FSR 9 in a self-running state. In addition, when the FSR 9 is set in the self-running state, and it is detected on the basis of the comparison result output from the synchronization detection comparator that m pairs of consecutive bit data coincide with each other, the control unit 15 determines that bit data output from the output terminal 9b of the FSR 9 in the self-running state constitute a reference code. If bit data do not coincide with each other, the control unit 15 controls the switching unit 8 to perform a switching operation to connect the input terminal 9a of the FSR 9 to the measurement terminal 7 so that the FSR is set in the state in which the reception code is set in the respective registers. The storage unit 180 stores consecutive bit data of the reception code in the time interval from the instant at which the m consecutive bit data of the reception code are set in the FSR 9 to at least the instant at which the bit data output from the output terminal 9b of the FSR 9 are determined as the reference code by the control unit 15, and outputs the bit data upon delaying the data by a predetermined period of time. The measurement reference code generating unit 250 receives the bit data or the reference code output from the m registers of the FSR 9 when the reference code is output from the output terminal 9b of the FSR 9, and generates a measurement reference code having a predetermined relationship in phase with consecutive bit data of the reference code. The bit error detection comparator 19 compares the delayed reception code output from the storage unit 180 with the measurement reference code output from the measurement reference code generating unit 250.

Figure 47:
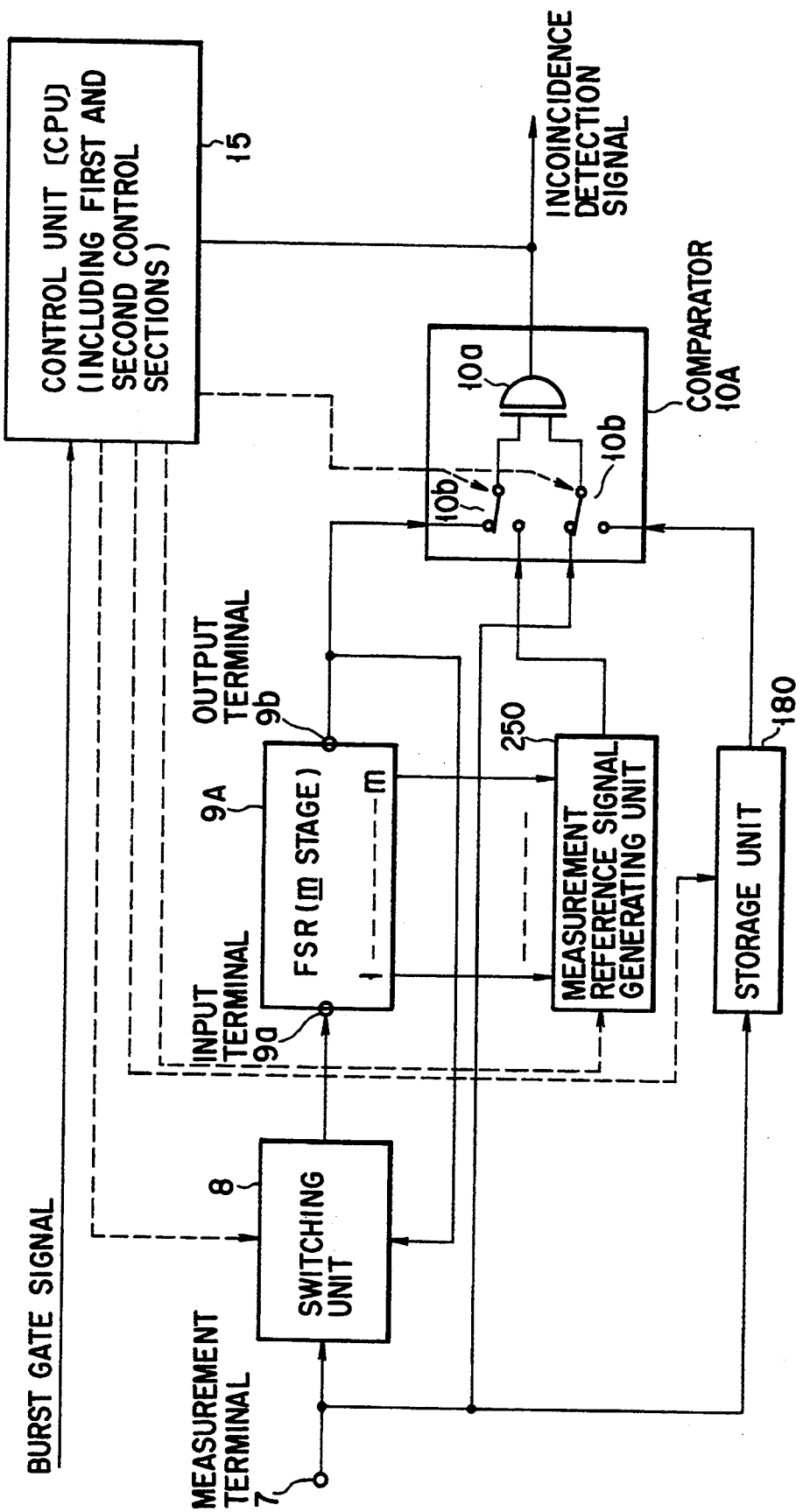
FIG. 47 is a block diagram showing a modification of the circuit shown in FIG. 46.

According to the modification shown in FIG. 47, there is provided a code error detection apparatus, in which one comparing unit 10A is arranged in place of the synchronization detection comparator and the code error detection comparing unit in the code error detection apparatus shown in FIG. 46, and synchronization detection and code error detection are selectively performed by using switches 10b switched by control signals from the control unit.

Figure 48A:
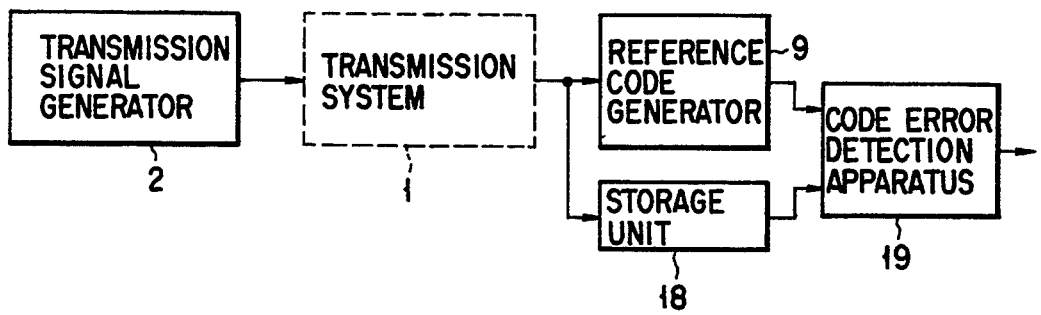
FIG. 48A is a block diagram showing the arrangement of a code error measurement system to which the code error detection apparatus of the present invention shown in FIG. 1A is applied.

FIG. 48A shows a code error measurement system to which the code error detection apparatus shown in FIG. 1B is applied. Referring to FIG. 48A, the code error measurement system is connected to a digital transmission system using burst frames and designed to perform code error measurement. The system comprises a transmission signal generating unit 2 for generating and transmitting error measurement M-sequence bit data having a period $(2^m - 1)$ to a transmission system 1 upon incorporating the bit data in the burst frames, a reference code generating unit 9 for sequentially receiving the bit data incorporated in the burst frames through the transmission system 1 as reception codes, and generating reference codes synchronized with the bit data in units of burst frames on the basis of the reception codes, a storage unit 18 for storing bit data of the reception codes in a time interval from the instant at which the burst frame starts to at least the instant at which the reference code is generated, and outputting the bit data upon delaying the bit data by a predetermined period of time, and a code error detection comparing unit 19 for comparing the delayed reception codes output from the storage unit 18 with the reference codes from the reference code generating unit 9 in units of burst frames.

Figure 48B:
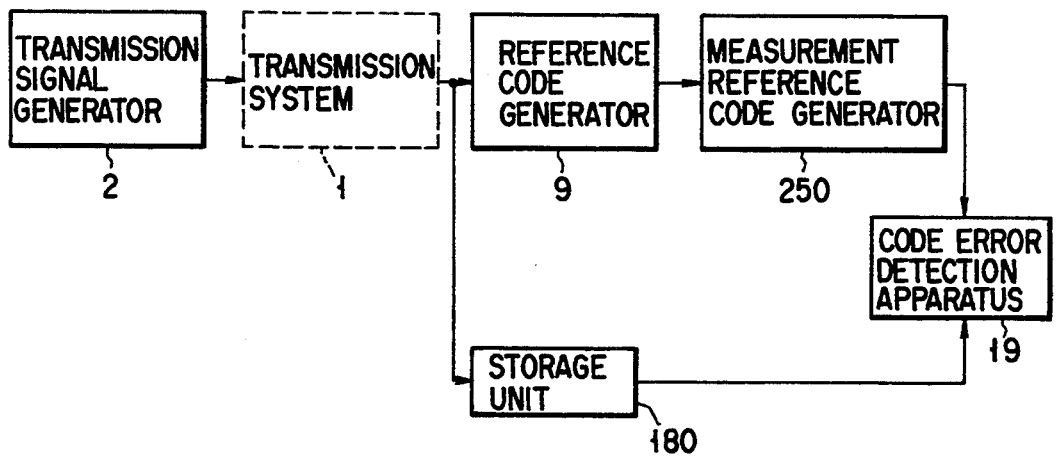
FIG. 48B is a block diagram showing the arrangement of a code error measurement system to which the code error detection apparatus of the present invention shown in FIG. 46 is applied.

FIG. 48B shows a code error measurement system to which the code error detection apparatus shown in FIG. 46 is applied. Referring to FIG. 48B, the code error measurement system is connected to a digital transmission system using burst frames and designed to perform code error measurement. The system comprises a transmission signal generating unit 2 for transmitting error measurement M-sequence bit data having a period $(2^m - 1)$ to a transmission system 1 upon incorporating the bit data in the burst frames, a reference code generating unit 9 for sequentially receiving the bit data incorporated in the burst frames through the transmission system 1 as reception codes, and generating reference codes synchronized with the bit data in units of burst frames on the basis of the reception codes, a storage unit 180 for storing bit data of the reception codes in a time interval from the instant at which the burst frame starts to at least the instant at which the reference code is generated, and outputting the bit data upon delaying the bit data by a predetermined period of time, a measurement reference code generating unit 250 for receiving the reference code from the reference code generating unit 9 every burst frame, and generating a measurement reference code having a predetermined relationship in phase with the bit data of the reference code, and a code error detection comparing unit 19 for comparing the delayed reception codes output from the storage unit 18 with the reference codes from the reference code generating unit 9 in units of burst frames.

Additional embodiments of the present invention will be apparent to those skilled in the art from consideration of the specification and practice of the present invention disclosed herein. It is intended that the specification and examples be considered as exemplary only, with the true scope of the present invention being indicated by the following claims.

What is claimed is:

1. A code error detection apparatus comprising:
a measurement terminal for receiving a reception code of an M-sequence having a period $(2^m - 1)$ (where m is an arbitrary natural number);
a feedback shift register (FSR) having input and output terminals, m stages of shift registers cascade-connected between the input and output terminals, and a predetermined number of exclusive OR circuits respectively connected between outputs of a predetermined stages of shift registers of said m stage of shift registers;
switching means, arranged between said measurement terminal and said FSR, for switching connection states between a first state in which the input terminal of said FSR is connected to said measurement terminal and a second state in which the output terminal of said FSR is connected to the input terminal of said FSR;
first control means for outputting a first control signal for setting the first state to said switching means at a first timing, and outputting a second control signal for setting the second state to said switching means at a second timing at which m consecutive bit data of the reception code input to said FSR from said measurement terminal in the first state are fetched, thereby setting said FSR in a self-running state;
synchronization detection comparing means for sequentially comparing bit data output from the output terminal of said FSR set in the self-running state in the second state with bit data of the reception code input to said measurement terminal;
second control means for, when the m consecutive bit data output from said FSR are determined to coincide with those output from said measurement terminal on the basis of a comparison result output from said synchronization detection comparing means, determining that the bit data output from the output terminal of said FSR set in the self-running state are a reference code, and causing said switching means to maintain the second state, and for, when the m consecutive bit data output from said FSR are determined not to coincide with those output from said measurement terminal, outputting a third control signal for setting the first state to said switching means so as to set a state in which said FSR fetches m consecutive bit data of the reception code input from said measurement terminal again;
storage means for storing consecutive bit data of the reception code input to said measurement terminal in a time interval from the instant at which said FSR starts to fetch the m consecutive bit data of the reception code in the first state to at least the instant at which it is determined by said second control means that the bit data are the reference code, and outputting stored bit data after delaying the bit data by a predetermined period of time; and
bit error detection comparing means for sequentially comparing the bit data of a delayed reception code output from said storage means with the bit data determined to be the reference code and output from the output terminal of said FSR.

2. An apparatus according to claim 1, wherein said storage means comprises an FIFO type shift register for outputting consecutive bit data of the reception code upon delaying the bit data by a period of time corresponding to an integer multiple of the period of the reception code.

3. An apparatus according to claim 1, wherein said synchronization detection comparing means and said bit error detection comparing means comprise single comparing means, and functions of said single comparing means are switched by control signals from said first and second control means to perform synchronization detection and code error detection.

4. An apparatus according to claim 1, wherein the reception code comprise a signal incorporated in a burst frame, and said first and second control means receive a burst gate signal indicating start and end positions of the reception code incorporated in the burst frame to perform control on the basis of the burst gate signal.

5. An apparatus according to claim 1, wherein said storage means comprises an FIFO type shift register for outputting consecutive bit data of the reception code upon delaying the bit data by a period of time corresponding to an integer multiple of the period of the reception code, said apparatus further comprises a measurement FSR having m stages of shift registers, when the reference code is output from the output terminal of said FSR, for fetching the bit data output from each stage of said m stages of shift registers of said FSR and setting the bit data or the reference code in the m stages of shift registers of said measurement FSR to perform a self-running operation, thereby generating a measurement reference code, and said bit error detection comparing means compares a measurement reference code output from said measurement FSR with a delayed reception code output from said FIFO type shift register.

6. A code error detection apparatus comprising:

a measurement terminal for receiving a reception code of an M-sequence having a period $(2^m - 1)$ (where m an arbitrary natural number);

a feedback shift register (FSR) having input and output terminals, m stages of shift registers cascade-connected between the input and output terminals, and a predetermined number of exclusive OR circuits respectively connected between outputs of a predetermined stages of shift registers of said m stage of shift registers;

switching means, arranged between said measurement terminal and said FSR, for switching connection states between a first state in which the input terminal of said FSR is connected to said measurement terminal and a second state in which the output terminal of said FSR is connected to the input terminal of said FSR;

first control means for outputting a first control signal for setting the first state to said switching means at a first timing, and outputting a second control signal for setting the second state to said switching means at a second timing at which m consecutive bit data of the reception code input to said FSR from the measurement terminal in the first state are fetched, thereby setting said FSR in a self-running state;

synchronization detection comparing means for sequentially comparing bit data output from the output terminal of said FSR set in the self-running state in the second state with bit data of the reception code input to said measurement terminal;

second control means for, when the m consecutive bit data output from said FSR are determined to coincide with those output from said measurement terminal on the basis of a comparison result output from said synchronization detection comparing means, determining that the bit data output from the output terminal of said FSR set in the self-running state are a reference code, and causing said switching means to maintain the second state, and for, when the m consecutive bit data output from said FSR are determined not to coincide with those output from said measurement terminal, outputting a third control signal for setting the first state to said switching means so as to set a state in which said FSR fetches m consecutive bit data of the reception code input from said measurement terminal again;

storage means for storing consecutive bit data of the reception code input to said measurement terminal in a time interval from the instant at which said FSR starts to fetch the m consecutive bit data of the reception code in the first state to at least the instant at which it is determined by said second control means that the bit data are the reference code, and outputting stored bit data after delaying the bit data by a predetermined period of time;

measurement reference code generating means for, when the bit data determined to be the reference code are output from the output terminal of said FSR, receiving the bit data output from each stage of the m stages of shift registers of said FSR or the bit data determined to be the reference code, and generating a measurement reference code having a predetermined phase relationship with the bit data determined to be the reference code; and code error detection comparing means for comparing a delayed reception code output from said storage means with the measurement reference code output from said measurement reference code generating means.

7. An apparatus according to claim 6, wherein said synchronization detection comparing means and said code error detection comparing means comprise one comparing means, and functions of said comparing means are switched by control signals from said first and second control means to perform synchronization detection and code error detection.

8. An apparatus according to claim 6, wherein the reception code is a signal incorporated in a burst frame, and said first and second control means receive a burst gate signal indicating start and end positions of the reception code incorporated in the burst frame to perform control on the basis of the burst gate signal.

9. An apparatus according to claim 6, wherein said storage means comprises an LIFO type shift register for storing a predetermined number of consecutive bit data of the reception code, and outputting the bit data in an order reverse to an order of storing the bit data, and said measurement reference code generating means comprises a reverse FSR for fetching the bit data output from each stages of said m stage of registers of said FSR and setting the bit data in m stages of shift registers of said reverse FSR to perform a self-running operation, and generating the measurement reference code having a phase opposite to that of the reference code output from the output terminal of said FSR.

10. An apparatus according to claim 6, wherein said storage means comprises an LIFO type shift register for storing a predetermined number of consecutive bit data of the reception code, and outputting the bit data in an order reverse to an order of storing the bit data, and said FSR and said measurement reference code generating means comprise a forward/reverse FSR capable of being switched between forward and reverse operation modes and having m stages of bidirectional shift registers, said forward/reverse FSR performing a function of said FSR upon designation of the forward operation mode by a control signal from said first and second control means, and performing a self-running operation using bit data stored in said m stages of bidirectional shift registers as initial values upon designation of the reverse operation mode by a control signal from said first and second control means, and said forward/reverse FSR generating the measurement reference code having a phase opposite to that of the reference code output from the output terminal of said FSR in the forward operation mode.

11. An apparatus according to claim 6, wherein said storage means comprises an FIFO type shift register for outputting consecutive bit data of the reception code upon delaying the bit data by a predetermined number of bits, and said measurement reference code generating means comprises a PRBS pattern memory for receiving bit data output from said m stages of shift registers of said FSR as read addresses, and generating the measurement reference code advanced in phase from the reference code output from the output terminal of said FSR by the predetermined number of bits on the basis of the read addresses and one-period data of the reference code stored in advance.

12. An apparatus according to claim 6, wherein said storage means comprises an FIFO type shift register for outputting consecutive bit data of the reception code upon delaying the bit data by a predetermined number of bits, and said measurement reference code generating means comprises a PRBS pattern memory for receiving bit data output from said m stages of shift registers of said FSR as read addresses, and generating the measurement reference code advanced in phase from the reference code output from the output terminal of said FSR by a predetermined number of bits on the basis of the read addresses and one-period data of the reference code stored in advance, and a reference FSR having m stages of shift registers and for fetching bit data output from said PRBS pattern memory and setting the bit data in the m stage of shift registers of said reference FSR to perform a self-running operation, and generating the measurement reference code advanced in phase from the reference code output from said FSR by the predetermined number of bits.

13. An apparatus according to claim 6, wherein said storage means comprises an FIFO type shift register for outputting consecutive bit data of the reception code upon delaying the bit data by a predetermined number of bits, and said measurement reference code generating means comprises a gate circuit for selecting and receiving bit data sequences, of consecutive bit data sequences output from each stages of said m stage of shift registers of said FSR, which are output from predetermined registers, and calculating an exclusive OR of the selected bit data sequences to generate the measurement reference code advanced in phase from the reference code output from the output terminal of said FSR by the predetermined number of bits.

14. An apparatus according to claim 6, wherein said storage means comprises an FIFO type shift register for outputting consecutive bit data of the reception code upon delaying the bit data by a predetermined number of bits, and said measurement reference code generating means comprises a gate circuit for selecting and receiving bit data sequences, of consecutive bit data sequences output from each stages of said m stage of shift registers of said FSR, which are output from predetermined registers, and calculating an exclusive OR of the selected bit data sequences to generate the measurement reference code advanced in phase from the reference code output from the output terminal of said FSR by a predetermined number of bits, and a reference FSR having m stages of shift registers and for fetching bit data output from said gate circuit and setting the bit data in the m stages of shift registers of said reference FSR to perform a self-running operation, and generating the measurement reference code advanced in phase from the reference code output from said FSR by the predetermined number of bits.

15. An apparatus according to claim 6, wherein said storage means comprises a variable-length FIFO type shift register for sequentially storing consecutive bit data of the reception code, and sequentially outputting the stored bit date when bit data output from the output terminal of said FSR are determined as the reference code by said second control means, and said measurement reference code generating means comprises a reference reverse FSR having m stages of shift registers and for respectively setting predetermined initial values in the m stages of shift registers thereof, starting a self-running operation when m consecutive bit data of the reception code are set in said FSR, and stopping the self-running operation when bit data output from the output terminal of said FSR are determined as the reference code by said second control means, and a gate circuit for selecting bit data sequences, of consecutive bit data sequences output from each stages of said m stage of shift registers of said FSR, which are output from predetermined registers on the basis of bit data output from each stages of said m stage of shift registers of said reference reverse FSR while the self-running operation is stopped, and calculating an exclusive OR of the selected bit data sequences to generate the reference code advanced in phase from the reference code output from said FSR by a number of bits corresponding to a time interval between the instant at which said variable-length FIFO type shift register starts to store the reception code and the instant at which said variable-length FIFO type shift register outputs the reception code.

16. An apparatus according to claim 6, wherein said storage means comprises a variable-length FIFO type shift register for sequentially storing consecutive bit data of the reception code, and sequentially outputting the stored bit date when bit data output from the output terminal of said FSR are determined as the reference code by said second control means, and said measurement reference code generating means comprises a reference reverse FSR having m stages of shift registers and for respectively setting predetermined initial values in the m stages of shift registers thereof, starting a self-running operation when m consecutive bit data of the reception code are set in said FSR, and stopping the self-running operation when bit data output from the output terminal of said FSR are determined as the reference code by said second control means, a gate circuit for selecting bit data sequences, of consecutive bit data sequences output from each stage of said m stages of shift registers of said FSR, which are output from predetermined registers on the basis of bit data output from each stages of said m stage of shift registers of said reference reverse FSR while the self-running operation is stopped, and calculating an exclusive OR of the selected bit data sequences to generate the reference code advanced in phase from the reference code output from said FSR by a predetermined number of bits, and a reference FSR having m stages of shift registers and for fetching bit data output from said gate circuit and setting the bit data in the m stages of shift registers of said reference FSR to perform a self-running operation, and generating the measurement reference code advanced in phase from the reference code output from said FSR by a number of bits corresponding to a time interval between the instant at which said variable-length FIFO type shift register starts to store the reception code and the instant at which said variable-length FIFO type shift register outputs the reception code.

17. An apparatus according to claim 6, wherein said storage means comprises an FIFO type shift register for outputting consecutive bit data of the reception code upon delaying the bit data by a predetermined number of bits, and said measurement reference code generating means comprises a reference reverse FSR having m stages of shift registers and for respectively setting predetermined initial values in the m stages of shift registers thereof, starting a self-running operation when m consecutive bit data of the reception code are set in said FSR, and stopping the self-running operation when bit data output from the output terminal of said FSR are determined as the reference code by said second control means, and a gate circuit for selecting bit data sequences, of consecutive bit data sequences output from each stage of said m stages of shift registers of said FSR, which are output from predetermined registers on the basis of bit data output from each stages of said m stage of shift registers of said reference reverse FSR while the self-running operation is stopped, and calculating an exclusive OR of the selected bit data sequences to generate the reference code advanced in phase from the reference code output from said FSR by a predetermined number of bits.

18. An apparatus according to claim 6, wherein said storage means comprises an FIFO type shift register for outputting consecutive bit data of the reception code upon delaying the bit data by a predetermined number of bits, and said measurement reference code generating means comprises a reference reverse FSR having m stages of shift registers and for respectively setting predetermined initial values in the m stages of shift registers thereof, starting a self-running operation when m consecutive bit data of the reception code are set in said FSR, and stopping the self-running operation when bit data output from the output terminal of said FSR are determined as the reference code by said second control means, a gate circuit for selecting bit data sequences, of consecutive bit data sequences output from each stage of said m stages of shift registers of said FSR, which are output from predetermined registers on the basis of bit data output from each stages of said m stage of shift registers of said reference reverse FSR while the self-running operation is stopped, and calculating an exclusive OR of the selected bit data sequences to generate the reference code advanced in phase from the reference code output from said FSR by a predetermined number of bits, and a reference FSR having m stages of shift registers and for fetching bit data output from said gate circuit and setting the bit data in the m stages of shift registers of said reference FSR to perform a self-running operation, and generating the measurement reference code advanced in phase from the reference code output from the output terminal of said FSR by the predetermined number of bits.

19. A code error measurement system connected to a digital transmission system using burst frames and designed to perform code error measurement, comprising:

a transmission signal generating unit for transmitting error measurement M-sequence bit data having a period ($2^m-1$) upon incorporating the bit data in the burst frames;

a reference code generating unit for sequentially receiving a signal corresponding to the bit data incorporated in the burst frames through said digital transmission system as reception codes, and generating reference codes synchronized with the bit data in units of burst frames on the basis of the reception codes;

a storage unit for storing bit data of the reception codes in a time interval from the instant at which the burst frame starts to at least the instant at which the reference code is generated, and outputting the bit data upon delaying the bit data by a predetermined period of time; and a code error detection comparing unit for comparing the delayed reception codes output from said storage unit with the reference codes from said reference code generating unit in units of burst frames.

20. A system according to claim 19, further comprising a measurement reference code generating unit for receiving the reference code from said reference code generating unit every burst frame, and generating a measurement reference code having a predetermined relationship in phase with the bit data of the reference code, and wherein said code error detection comparing unit compares the delayed reception codes output from said storage unit with the reference codes from said reference code generating unit in units of burst frames.

* * * * *